(12) United States Patent
Tiwari et al.

(10) Patent No.: US 11,036,897 B2
(45) Date of Patent: Jun. 15, 2021

(54) FLOOR PLAN BASED PLANNING OF BUILDING SYSTEMS

(71) Applicant: Carrier Corporation, Farmington, CT (US)

(72) Inventors: Ankit Tiwari, Burlington, MA (US); Kushal Mukherjee, Cork (IE); Berta Carballido Villaverde, Cork (IE); Rodolfo De Paz Alberola, Cork (IE); George A. Mathew, Berkeley, CA (US); Tuhin Sahai, East Hartford, CT (US); Pedro Orellana Fernandez, Vigo (ES); Philip J. Harris, Cork (IE); Vijaya Ramaraju Lakamraju, Farmington, CT (US); Brian Leland, Maple Grove, MN (US); Michael Ramoutar, Westford, MA (US)

(73) Assignee: Carrier Corporation, Palm Beach Gardens, FL (US)

( * ) Notice: Subject to any disclaimer, the term of this patent is extended or adjusted under 35 U.S.C. 154(b) by 902 days.

(21) Appl. No.: 15/560,882

(22) PCT Filed: Mar. 23, 2016

(86) PCT No.: PCT/US2016/023781
§ 371 (c)(1),
(2) Date: Sep. 22, 2017

(87) PCT Pub. No.: WO2016/154312
PCT Pub. Date: Sep. 29, 2016

(65) Prior Publication Data
US 2018/0121571 A1 May 3, 2018

Related U.S. Application Data

(60) Provisional application No. 62/137,531, filed on Mar. 24, 2015.

(51) Int. Cl.
*G06F 30/13* (2020.01)
*G06Q 10/10* (2012.01)
(Continued)

(52) U.S. Cl.
CPC ............. *G06F 30/13* (2020.01); *G06Q 10/10* (2013.01); *G08B 19/00* (2013.01); *G08B 21/02* (2013.01);
(Continued)

(58) Field of Classification Search
CPC ........ G06F 30/13; G06Q 10/10; G08B 19/00; G08B 21/02; G08B 25/14; G08B 27/005; G08B 29/18
See application file for complete search history.

(56) References Cited

U.S. PATENT DOCUMENTS 5,668,562 A 9/1997 Cutrer et al.
5,831,610 A 11/1998 Tonelli et al.
(Continued)

FOREIGN PATENT DOCUMENTS

CN 101763656 A 6/2010
CN 102096738 A 6/2011
(Continued)

OTHER PUBLICATIONS

Ertan Onur et al., "Surveillance wireless sensor networks: deployment quality analysis," 2007, IEEE Network, Nov. 2007, pp. 48-53 (Year: 2007).*

(Continued)

*Primary Examiner* — Kamini S Shah
*Assistant Examiner* — Russ Guill
(74) *Attorney, Agent, or Firm* — Locke Ford LLP; Scott D. Wofsy; Judy R. Naamat

(57) ABSTRACT

A method for planning a building system includes incorporating user requirements into a floor plan accessed through
(Continued)

a mobile device. An installation map is generated of locations for components corresponding to the user requirements. The placement of components is displayed on the floor plan based on specifications of the components and the user requirements.

35 Claims, 39 Drawing Sheets

(51) Int. Cl.
G08B 25/14 (2006.01)
G08B 29/18 (2006.01)
G08B 19/00 (2006.01)
G08B 21/02 (2006.01)
G08B 27/00 (2006.01)

(52) U.S. Cl.
CPC ............ *G08B 25/14* (2013.01); *G08B 27/005* (2013.01); *G08B 29/18* (2013.01)

(56) References Cited

U.S. PATENT DOCUMENTS

| | | | |
|---|---|---|---|
| 5,832,365 A | 11/1998 | Chen et al. | |
| 6,006,021 A | 12/1999 | Tognazzini | |
| 6,037,945 A | 3/2000 | Loveland | |
| 6,317,599 B1 | 11/2001 | Rappaport et al. | |
| 6,366,242 B1 | 4/2002 | Boyd et al. | |
| 6,414,661 B1 | 7/2002 | Shen et al. | |
| 6,446,030 B1 | 9/2002 | Hoffman et al. | |
| 6,499,006 B1 | 12/2002 | Rappaport et al. | |
| 6,571,284 B1 | 5/2003 | Suonvieri | |
| 6,665,004 B1 | 12/2003 | Paff | |
| 6,801,878 B1 | 10/2004 | Hintz et al. | |
| 6,954,859 B1 | 10/2005 | Simerly et al. | |
| 6,971,063 B1 | 11/2005 | Rappaport et al. | |
| 6,973,622 B1 | 12/2005 | Rappaport et al. | |
| 7,012,524 B2 | 3/2006 | Hisano et al. | |
| 7,055,107 B1 | 5/2006 | Rappaport et al. | |
| 7,126,471 B2 | 10/2006 | Ahmed et al. | |
| 7,127,378 B2 | 10/2006 | Hoffman et al. | |
| 7,130,779 B2 | 10/2006 | Beverina et al. | |
| 7,167,810 B2 | 1/2007 | Kronhamn et al. | |
| 7,181,371 B2 | 2/2007 | Lindenbaum | |
| 7,259,778 B2 | 8/2007 | Arpa et al. | |
| 7,295,119 B2 | 11/2007 | Rappaport et al. | |
| 7,299,168 B2 | 11/2007 | Rappaport et al. | |
| 7,308,394 B2 | 12/2007 | Johnson | |
| 7,378,942 B2 | 5/2008 | Seeley et al. | |
| 7,378,980 B2 | 5/2008 | McFarland | |
| 7,379,829 B2 | 5/2008 | Dundar et al. | |
| 7,400,594 B2 | 7/2008 | Pereira et al. | |
| 7,415,385 B2 | 8/2008 | Azarbayejani et al. | |
| 7,487,494 B2 | 2/2009 | Chan et al. | |
| 7,512,450 B2 | 3/2009 | Ahmed | |
| 7,546,094 B2 | 6/2009 | Couper | |
| 7,561,050 B2 | 7/2009 | Bhogal et al. | |
| 7,567,844 B2 | 7/2009 | Thomas et al. | |
| 7,705,863 B2 | 4/2010 | Rye et al. | |
| 7,728,833 B2 | 6/2010 | Verma et al. | |
| 7,746,222 B2 | 6/2010 | Kogan et al. | |
| 7,761,050 B2 | 7/2010 | Fitton et al. | |
| 7,773,995 B2 | 8/2010 | Rappaport et al. | |
| 7,796,023 B2 | 9/2010 | Rezvani et al. | |
| 7,825,792 B2 | 11/2010 | Buehler | |
| 7,847,681 B2 | 12/2010 | Singhal et al. | |
| 7,902,977 B2 | 3/2011 | Howe | |
| 7,983,941 B2 | 7/2011 | Munro et al. | |
| 8,019,352 B2 | 9/2011 | Rappaport et al. | |
| 8,050,521 B2 | 11/2011 | Judelson | |
| 8,207,886 B2 | 6/2012 | Chambers et al. | |
| 8,290,499 B2 | 10/2012 | Rappaport et al. | |
| 8,315,839 B2 | 11/2012 | Rosca et al. | |
| 8,395,968 B2 | 3/2013 | Vartanian et al. | |
| 8,405,786 B2 | 3/2013 | Mellor | |
| 8,428,391 B2 | 4/2013 | Park | |
| 8,437,276 B2 | 5/2013 | Dinur | |
| 8,466,917 B2 | 6/2013 | Benitez et al. | |
| 8,478,447 B2 | 7/2013 | Fadell et al. | |
| 8,482,558 B2 | 7/2013 | Morello et al. | |
| 8,503,336 B2 | 8/2013 | Rappaport et al. | |
| 8,514,283 B2 | 8/2013 | Nam et al. | |
| 8,532,835 B2 | 9/2013 | McLean | |
| 8,538,167 B2 | 9/2013 | Otts | |
| 8,558,658 B2 | 10/2013 | Kumar et al. | |
| 8,560,850 B2 | 10/2013 | Li | |
| 8,565,902 B2 | 10/2013 | Jones et al. | |
| 8,615,254 B2 | 12/2013 | Jamtoaard et al. | |
| 8,638,211 B2 | 1/2014 | Cohn et al. | |
| 8,694,292 B2 | 4/2014 | Peterman et al. | |
| 8,705,423 B2 | 4/2014 | Salsbury et al. | |
| 8,706,310 B2 | 4/2014 | Barrilleaux | |
| 8,718,837 B2 | 5/2014 | Wang et al. | |
| 8,744,504 B2 | 6/2014 | Faccin et al. | |
| 8,793,790 B2 | 7/2014 | Khurana et al. | |
| 8,818,924 B2 | 8/2014 | Wayne et al. | |
| 8,868,375 B1 | 10/2014 | Christian | |
| 2002/0006799 A1* | 1/2002 | Rappaport ............ H04W 16/20 | |
| | | | 455/446 |
| 2003/0009315 A1 | 1/2003 | Thomas et al. | |
| 2003/0023411 A1 | 1/2003 | Witmer et al. | |
| 2004/0038683 A1 | 2/2004 | Rappaport et al. | |
| 2004/0122628 A1 | 6/2004 | Laurie | |
| 2004/0162887 A1 | 8/2004 | Dillon et al. | |
| 2004/0225480 A1 | 11/2004 | Dunham | |
| 2005/0004863 A1 | 1/2005 | Havrilak | |
| 2005/0089213 A1 | 4/2005 | Geng | |
| 2006/0232673 A1 | 10/2006 | Lipton et al. | |
| 2008/0062167 A1 | 3/2008 | Boggs et al. | |
| 2008/0120068 A1 | 5/2008 | Martin et al. | |
| 2008/0249756 A1 | 10/2008 | Chaisuparasmikul | |
| 2008/0303903 A1* | 12/2008 | Bentley ............ G08B 13/19656 | |
| | | | 348/143 |
| 2009/0045939 A1 | 2/2009 | Holland et al. | |
| 2009/0144028 A1 | 6/2009 | Corral et al. | |
| 2009/0150004 A1 | 6/2009 | Wang et al. | |
| 2009/0292509 A1 | 11/2009 | Thompson et al. | |
| 2009/0307255 A1* | 12/2009 | Park ...................... G06Q 10/10 | |
| 2010/0134285 A1 | 6/2010 | Holmquist | |
| 2010/0187832 A1 | 7/2010 | Holland et al. | |
| 2010/0204969 A1 | 8/2010 | Hariharan et al. | |
| 2010/0277302 A1 | 11/2010 | Cohn et al. | |
| 2011/0001828 A1 | 1/2011 | Bigoloni | |
| 2011/0035199 A1 | 2/2011 | Kristofik et al. | |
| 2011/0057940 A1 | 3/2011 | Mantor et al. | |
| 2011/0112690 A1 | 5/2011 | Caron et al. | |
| 2011/0196755 A1 | 8/2011 | Landa | |
| 2011/0209081 A1 | 8/2011 | Chen et al. | |
| 2011/0213480 A1 | 9/2011 | Zila et al. | |
| 2011/0213593 A1 | 9/2011 | Wilson | |
| 2011/0263277 A1 | 10/2011 | Zuniga Gallegos | |
| 2011/0285851 A1 | 11/2011 | Plocher et al. | |
| 2011/0291831 A1 | 12/2011 | Subbian et al. | |
| 2012/0066608 A1 | 3/2012 | Sundermeyer et al. | |
| 2012/0133482 A1 | 5/2012 | Bhandari et al. | |
| 2012/0184219 A1 | 7/2012 | Richardson et al. | |
| 2012/0253725 A1 | 10/2012 | Malka et al. | |
| 2012/0259594 A1 | 10/2012 | Khan et al. | |
| 2012/0259595 A1 | 10/2012 | Narita | |
| 2012/0283997 A1 | 11/2012 | Flous et al. | |
| 2012/0296609 A1 | 11/2012 | Khan et al. | |
| 2012/0296610 A1 | 11/2012 | Hailemariam et al. | |
| 2012/0320058 A1 | 12/2012 | Stephen | |
| 2012/0323534 A1 | 12/2012 | Kahle et al. | |
| 2013/0103362 A1 | 4/2013 | Mather et al. | |
| 2013/0147961 A1 | 6/2013 | Gao et al. | |
| 2013/0182103 A1 | 7/2013 | Lee et al. | |
| 2013/0183961 A1 | 7/2013 | Bassiri et al. | |
| 2013/0185024 A1 | 7/2013 | Mahasenan et al. | |
| 2013/0201339 A1 | 8/2013 | Venkatesh | |
| 2013/0202125 A1 | 8/2013 | De Sena et al. | |
| 2013/0225197 A1 | 8/2013 | McGregor et al. | |
| 2014/0032472 A1 | 1/2014 | Kaledhonkar et al. | |

(56) References Cited

U.S. PATENT DOCUMENTS

| | | | |
|---|---|---|---|
| 2014/0032555 A1 | 1/2014 | Kiff et al. | |
| 2014/0039685 A1 | 2/2014 | Blount et al. | |
| 2014/0043436 A1 | 2/2014 | Bell et al. | |
| 2014/0055621 A1 | 2/2014 | Shirani et al. | |
| 2014/0088772 A1 | 3/2014 | Lelkens | |
| 2014/0129197 A1 | 5/2014 | Sons et al. | |
| 2014/0141803 A1 | 5/2014 | Marti et al. | |
| 2014/0143695 A1* | 5/2014 | Sundermeyer | G08B 25/003 715/765 |
| 2014/0149038 A1 | 5/2014 | Cronin et al. | |
| 2014/0149498 A1 | 5/2014 | Nandlall et al. | |
| 2014/0152651 A1 | 6/2014 | Chen et al. | |
| 2014/0168212 A1 | 6/2014 | Jones | |
| 2014/0172392 A1 | 6/2014 | Eldershaw et al. | |
| 2014/0192159 A1 | 7/2014 | Chen et al. | |
| 2014/0193039 A1 | 7/2014 | Wexler | |
| 2014/0198618 A1 | 7/2014 | Cary et al. | |
| 2014/0214215 A1 | 7/2014 | Han et al. | |
| 2014/0266679 A1* | 9/2014 | Shapiro | G08B 29/12 340/516 |
| 2014/0266687 A1 | 9/2014 | Britton | |
| 2014/0267717 A1 | 9/2014 | Pitzer et al. | |
| 2014/0278107 A1 | 9/2014 | Kerrigan et al. | |
| 2014/0278280 A1 | 9/2014 | Pardo-Fernandez | |
| 2014/0278281 A1* | 9/2014 | Vaynriber | G06F 30/18 703/1 |
| 2015/0106941 A1* | 4/2015 | Muller | H04L 63/1433 726/25 |
| 2017/0220714 A1* | 8/2017 | Ohori | G06F 30/20 |

FOREIGN PATENT DOCUMENTS

| | | |
|---|---|---|
| CN | 103328899 A | 9/2013 |
| CN | 103323926 A | 9/2013 |
| CN | 103440526 A | 12/2013 |
| CN | 103906210 A | 7/2014 |
| EP | 1669912 A1 | 6/2006 |
| EP | 2840533 A1 | 2/2015 |
| GB | 2443856 A | 5/2008 |
| GB | 2475959 A | 6/2011 |
| TW | 200611157 | 7/2013 |
| WO | WO-07130034 A1 | 11/2007 |
| WO | WO-2009/128576 A1 | 10/2009 |
| WO | WO-09144729 A1 | 12/2009 |
| WO | WO-2009149084 A2 | 12/2009 |
| WO | WO-11134064 A1 | 11/2011 |
| WO | WO-2011163351 A2 | 12/2011 |
| WO | WO-13056395 A1 | 4/2013 |
| WO | WO-2014026218 A1 | 2/2014 |
| WO | WO-2014/113882 A1 | 7/2014 |
| WO | WO-2014/121136 A1 | 8/2014 |
| WO | WO-2014/144760 A1 | 9/2014 |
| WO | WO-14144628 A2 | 9/2014 |

OTHER PUBLICATIONS

Siva Ram et al., "A design methodology for selection and placement of sensors in multimedia surveillance systems," 2006, 4th ACM International Workshop on Video Surveillance and Sensor Networks, pp. 121-130 (Year: 2006).*

Len Calderone, "Is a wireless home security system right for you," Jun. 1, 2014, https://hometoys.com/is-a-wireless-home-security-system-right-for-you/, 9 pages (Year: 2014).*

Abhijit Bhattacharya et al., "SmartConnect: A system for the design and deployment of wireless sensor networks," 2013, Fifth International Conference on Communication Systems and Networks (COMSNETS), Bangalore, pp. 1-10 (Year: 2013).*

Yi Zou et al., "Sensor deployment and target localization based on virtual forces," 2003, IEEE Infocom 2003 Twenty-second Annual Joint Conference of the IEEE Computerand Communications Societies, 11 pages (Year: 2003).*

"FlexGuard 5853 Wireless Glass Break Detector Installation Instructions," 2002, Honeywell International, 2 pages (Year: 2002).*

J.R. Rodriguez et al., "Interior intrusion detection systems," 1991, Sandia National Laboratories, 104 pages (Year: 1991).*

"CCTV Technology Handbook," 2013, Department of Homeland Security, 66 pages (Year: 2013).*

T.M.A. Marechal et al., "Optimizing a physical security configuration using a highly detailed simulation model," 2009, Handbook of Military Industrial Engineering, pp. 2-1 through 2-17 (Year: 2009).*

J.S. Smith, et al., "Distributed real-time simulation for intruder detection system analysis," 1999, Proceedings of the 1999 Winter Simulation Conference, pp. 1168-1173 (Year: 1999).*

Jeffrey S. Smith et al., "Prototype software model for designing intruder detection systems with simulation," 1998, Proc. SPIE 3369, Enabling Technology for Simulation Science II, pp. 101-108 (Year: 1998).*

Mary Lynn Garcia, "Design and evaluation of physical protection systems," chapter 14 EASI Computer Model for Analysis, 2008, Butterworth-Heinemann, pp. 273-290 (Year: 2008).*

Volkan Ustun, "Human behavior representation in physical security systems simulation," 2009, Auburn University, 236 pages (Year: 2009).*

Maulin Patel et al., "Energy efficient sensor, relay and base station placements for coverage, connectivity and routing," 2005, 24th IEEE International Performance, Computing, and Communications Conference, pp. 581-586 (Year: 2005).*

"3rd Generation Partnership Project: Technical Specification Group Core Network and Terminals; Proximity-services (ProSe) User Equipment (UE) to Proximity-services (ProSe) Function Protocol aspects: Stage 3 (Release 12)" 3GPP Standard: 3GPP TS 24.334, 3rd Generation Partnership Project (3GPP), Mobile Competence Center; 650, Route Des Lucioles; F-06921 Sophia-Antipolis Cedex; France, vol. CT WG1, No. V1.0, Aug. 25, 2014, pp. 1-59, XP050774727.

International Preliminary Report on Patentability for PCT Application No. PCT/2016/023770, dated Sep. 26, 2017.

International Preliminary Report on Patentability for PCT Application No. PCT/2016/023774, dated Sep. 26, 2017.

International Preliminary Report on Patentability for PCT Application No. PCT/2016/023780, dated Sep. 26, 2017.

International Preliminary Report on Patentability for PCT Application No. PCT/2016/023781, dated Sep. 26, 2017.

International Preliminary Report on Patentability for PCT Application No. PCT/2016/023791, dated Sep. 26, 2017.

International Preliminary Report on Patentability for PCT Application No. PCT/2016/023792, dated Sep. 26, 2017.

International Preliminary Report on Patentability for PCT Application No. PCT/2016/023799, dated Sep. 26, 2017.

International Search Report and Written Opinion for PCT Application No. PCT/2016/023770, dated Jun. 10, 2016.

International Search Report and Written Opinion for PCT Application No. PCT/2016/023774, dated Jun. 20, 2016.

International Search Report and Written Opinion for PCT Application No. PCT/2016/023780, dated Jun. 9, 2016.

International Search Report and Written Opinion for PCT Application No. PCT/2016/023781, dated Aug. 11, 2016.

International Search Report and Written Opinion for PCT Application No. PCT/2016/023791, dated Jun. 10, 2016.

International Search Report and Written Opinion for PCT Application No. PCT/2016/023792, dated Jun. 16, 2016.

International Search Report and Written Opinion for PCT Application No. PCT/2016/023799, dated Jun. 10, 2016.

The First Office Action for Chinese Patent Application No. CN201680031483.9, dated Mar. 4, 2019.

* cited by examiner

| EXAMPLE MANUFACTURER'S SPECIFICATIONS |
|---|
| DESCRIBED BY FOLLOWING PARAMETERS:<br>• MOUNTING HEIGHT<br>• MOUNTING ORIENTATION<br>  • ORIENTATION RANGE ($\pm\alpha$)<br>  • ORIENTATION STEP SIZE ($\alpha_{min}$)<br>• MOUNTING CONSTRAINTS<br>  • FIELD OF VIEW [FOV] OVERLAP RESTRICTIONS<br>  • MOUNTING SURFACES RESTRICTIONS [WALL, CEILING, CORNER] |

| S. NO (UID) | ADDRESSING INFO | TYPE | LOC INFO | RF LM | DISCOVHERED | AUTHORIZATION |
|---|---|---|---|---|---|---|
| S1101 | 1 | PIR | LIVING, NE,.... | G | NO | YES |
| - |  |  |  |  |  | ----- |
| - |  |  |  |  |  | ----- |
| S1109 | 192.168.1.9 | CAM | ---- | G | YES | NO |

PREDICTED RF SIGNAL (NORMALIZED)

| | $LOC_0$ | $LOC_1$ | $LOC_2$ | | $LOC_N$ |
|---|---|---|---|---|---|
| $LOC_0$ | NA | $P_{01}$ | $P_{02}$ | | $P_{0N}$ |
| $LOC_1$ | $P_{12}$ | NA | $P_{12}$ | | $P_{1N}$ |
| $LOC_2$ | $P_{12}$ | $P_{12}$ | NA | | $P_{2N}$ |
| | | | | | |
| $LOC_N$ | $P_{N1}$ | $P_{N1}$ | $P_{N2}$ | | NA |

DEVICES

FIG. 5G  610

MEASURED RF SIGNAL (NORMALIZED)

| | $DEV_0$ | $DEV_1$ | $DEV_2$ | | $DEV_N$ |
|---|---|---|---|---|---|
| $DEV_0$ | NA | $M_{01}$ | $M_{02}$ | | $M_{0N}$ |
| $DEV_1$ | $M_{12}$ | NA | $M_{12}$ | | $M_{1N}$ |
| $DEV_2$ | $M_{N2}$ | $M_{12}$ | NA | | $M_{2N}$ |
| | | | | | |
| $DEV_N$ | $M_{N1}$ | $M_{N1}$ | $M_{N2}$ | | NA |

DEVICES

FIG. 5H  612

| | DEV₀ | DEV₁ | DEV₂ | | DEV_m |
|---|---|---|---|---|---|
| LOC₀ | D₀₀ | D₀₁ | D₀₂ | | D₀ₘ |
| LOC₁ | D₁₀ | D₁₁ | D₁₂ | | D₁ₘ |
| LOC₂ | D₂₀ | D₂₁ | D₂₂ | | D₂ₘ |
| | | | | | |
| LOCₙ | Dₙ₀ | Dₙ₁ | Dₙ₂ | | Dₙₘ |

FIG. 5J

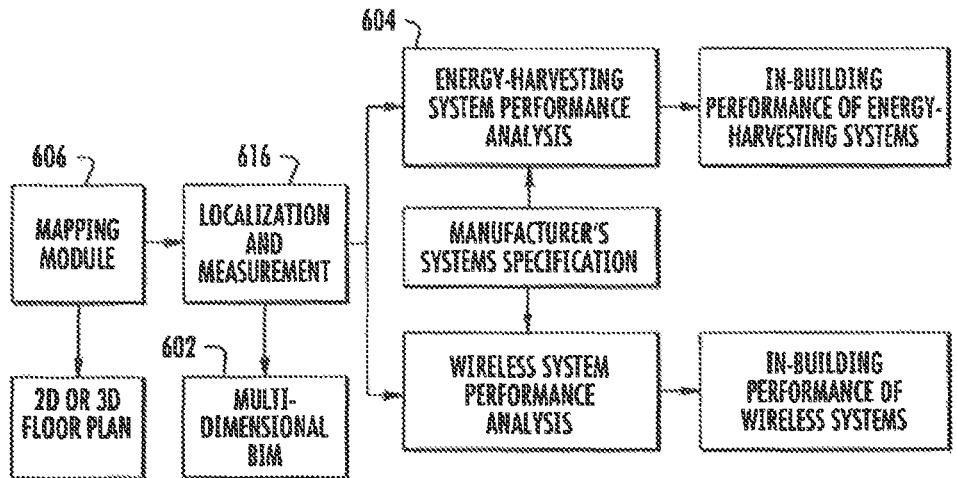
FIG. 6B
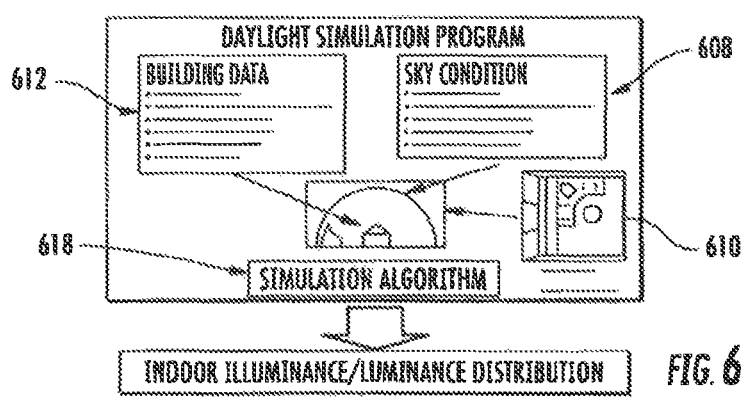
FIG. 6C
FIG. 6D

FLOOR PLAN BASED PLANNING OF BUILDING SYSTEMS

CROSS REFERENCE TO RELATED APPLICATIONS

This application is a 371 U.S. National Phase of International PCT Patent Application No. PCT/US2016/023781, filed on Mar. 23, 2016, which claims the benefit of and priority to U.S. Provisional Patent Application Ser. No. 62/137,531, filed Mar. 24, 2015, and entitled FLOOR PLAN BASED PLANNING OF BUILDING SYSTEMS, which is expressly incorporated herein by reference in its entirety.

FIELD OF THE INVENTION

The present disclosure relates to building systems, and more particularly to planning and placement of components in a floor plan of a building, for example.

DESCRIPTION OF RELATED ART

Installation of security systems is often preceded by system planning or design, which involves walk-through site surveys by experts to determine the number, type, and location of various system components in the building. The manual nature of the system planning makes it error prone and time consuming. Traditional systems to help with planning however remain narrowly focused and require considerable manual input.

Installation of security systems in buildings is a complex problem that typically involves the placement of heterogeneous sensors so as to maximize the probability of detecting the entry of an intruder into a room or to minimize the time taken to detect an intrusion. Different performance parameters such as coverage, sensitivity and false alarm rates of different types of sensors such as motion, camera, etc. depend on the mounting location and orientation (the "placement") once deployed in the field. These sensors are usually designed to be mounted on specific surfaces and locations like wall vs. ceiling or outdoor vs. indoor and most of them support a limited number of placements.

Traditional solutions either require a manual input of mounting positions and orientations or try random positions and orientations to see which ones show better coverage, which is an approach which could lead to placement at an invalid location or mounting orientation. Providing the required information manually is a time consuming and error-prone task. Moreover it is not always possible or desirable to use traditional automated algorithms to obtain desired sensor performance in a building.

Such conventional methods and systems have generally been considered satisfactory for their intended purpose. However, there is still a need in the art for improved method and system of placement of components within a floor plan of a building. The present disclosure provides a solution for this need.

SUMMARY OF THE INVENTION

A method for planning a building system includes incorporating user requirements into a floor plan accessed through a mobile device. An installation map is generated of locations for components corresponding to the user requirements. The placement of components is displayed on the floor plan based on specifications of the components and the user requirements.

Displaying the components can include showing an indication of the expected security performance for the given component on the floor plan. The expected security performance can be displayed in terms of coverage provided by the components. The expected security performance can also be displayed in terms of probability of detection of a hazardous event provided by the components. The expected security performance can be displayed in terms of number of selected devices placed on the floor plan relative to a maximum number of locations requested to be secured. Displaying the components can include showing an indication of the expected system performance for a given device placement on the floor plan.

The user requirements can include specifications of the types of components available. The types and specifications of the components available can be downloaded from a remote server database. The user requirements can include system partitioning, system functionality, compliance with building standards and regulations, communication parameters, coverage parameters, detection performance, accuracy, battery life, cost, and false alarm probability of the components or the system as a whole. The user requirements can also include constraints on the placement of the components. The components can be selected from the group consisting of PIR, motion sensors, contact sensors, glass break sensors and video cameras, shock sensors, panels, and safety sensors.

Generating the installation map can include auto placing the components based on a dynamic threat model for a hazardous event. The dynamic threat model can include a statistical probability distribution of a hazardous event moving throughout the floor plan. The dynamic threat model can further include a relative threat level designated by the user for each room of the floor plan. The dynamic threat model can include a relative threat level designated by the processing of interior building images for each room of the floor plan. The dynamic threat model can include relative threat level designated by the user for each entrance and exit of the floor plan. The relative threat levels can be estimated using historical data of robberies for the geographic site and aerial or exterior building images of the entrance and exit of the building. Generating the installation map can include repeatedly placing different combinations of components throughout the floor plan and evaluating performance for each combination using the dynamic threat model and component characteristics. The best combination of components is identified based on system cost and performance for a given dynamic threat model.

Generating the installation map can further include placing at least one component in a room of the floor plan and evaluating performance achieved based on parameters of the room and component characteristics. The steps of placing at least one component and evaluating performance are repeated until optimal placement for each room is achieved. Generating the installation map can include placing components based on connectivity between rooms. Generating the installation map can include placing components based on value of contents within a room of the floor plan as designated by the user.

Generating the installation map can include auto placing the components based on a wireless connectivity model. The wireless connectivity model can include a statistical probability distribution of data correctly received at each component location in the floor plan.

Generating the installation map can include manually placing at least one component within the installation map using the mobile device such that manually placing at least one component can include allowing the user to select a component from a predefined list and indicate a desired location. The indicated desired location can be selected from a set of valid mounting locations and orientations identified based on component characteristics and floor plan characteristics. The valid mounting locations can be displayed as a visual aid for manual placement of a selected component based characteristics of the selected component and the floor plan.

The method can include displaying coverage area of each component based on the placement, orientation and tilt of the component. At least one component can be a glass break sensor wherein optimal placement is based on glass size of a window, glass break sensor specification and a room layout.

At least one component can be a motion sensor wherein optimal placement is based on direction of target movement relative to the motion sensor's location, field of view, motion sensor specification and room layout and is based on size of motion sensor coverage region and room size. At least one component can be a motion sensor wherein optimal placement avoids overlap of coverage region with components monitoring doors and windows of the room. At least one component can be a motion sensor placed in a rooms with two or more perimeter windows, rooms with maximum number of interior doors or rooms with more than a certain number of interior doors and no perimeters doors or windows.

Placement can be based on correlating type of sensor with type of room. Placement can also be based on correlating type of sensor and type of room feature being monitored.

A device for planning a security system of a building includes an interactive user interface to specify building information and user requirements having a visual display. A processor is operatively connected to the user interface having a memory, wherein the memory includes instructions recorded thereon that, when read by the processor, cause the processor to generate a preferred installation map of a plurality of components within the building.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 2O is an exemplary diagram of a completed floor plan, showing components placed therein;

FIG. 5G is a schematic view of a predicted RF fingerprint table for use with the method of FIG. 5F;

FIG. 5H is a schematic view of a measured RF fingerprint table for use with the method of FIG. 5F;

FIG. 5I is a schematic diagram of the matching and association scheme for the method of FIG. 5F:

FIG. 5J is a schematic view of results after one iteration of the scheme of FIG. 5I, showing association results and ambiguities;

FIG. 6B is a schematic view of the modules that include the disclosed system and method for planning energy harvesting devices;

FIG. 6C is a schematic view of a lighting schedule for a given zone for use with the system of FIG. 6A;

FIG. 6D is a schematic view of an exemplary process for importing historical radiance data for use with the system of FIG. 6A;

FIG. 7I illustrates a schematic diagram of a two-node Markov model;

DETAILED DESCRIPTION OF THE PREFERRED EMBODIMENTS

Figure 1A:
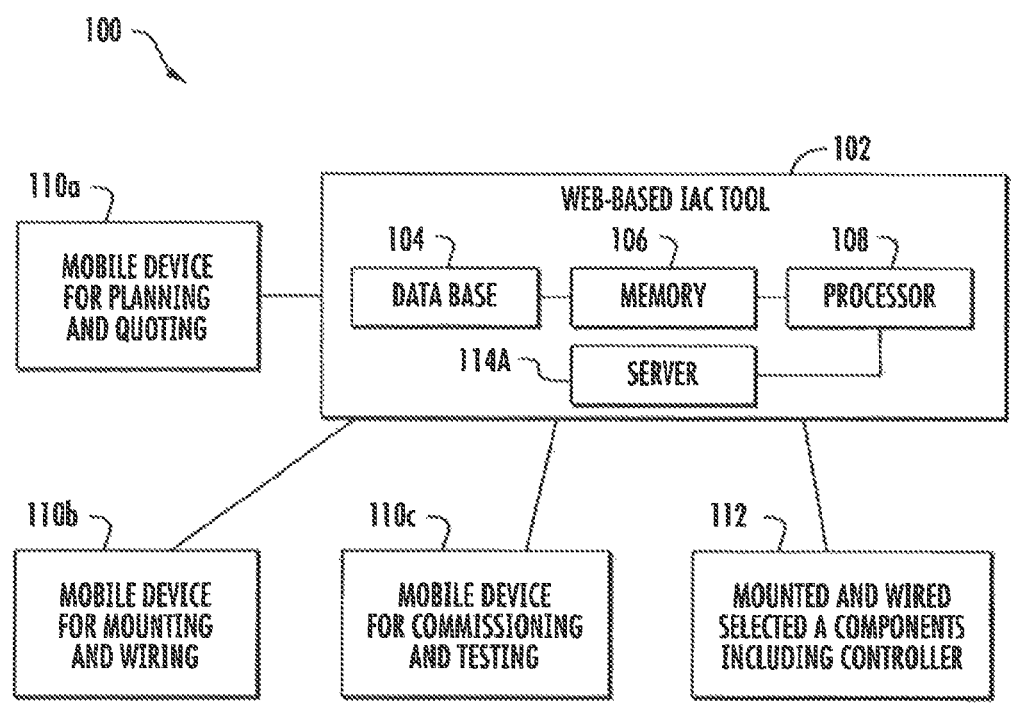
FIG. 1A is a schematic view of an exemplary embodiment of a system constructed in accordance with the present disclosure, showing a web-based installation and commissioning framework (IAC) accessible by more than one device during all stages of an IAC process.

The illustrated embodiments are now described more fully with reference to the accompanying drawings wherein like reference numerals identify similar structural/functional features. The illustrated embodiments are not limited in any way to what is illustrated as the illustrated embodiments described below are merely exemplary, which can be embodied in various forms, as appreciated by one skilled in the art. Therefore, it is to be understood that any structural and functional details disclosed herein are not to be interpreted as limiting, but merely as a basis for the claims and as a representation for teaching one skilled in the art to variously employ the discussed embodiments. Furthermore, the terms and phrases used herein are not intended to be limiting but rather to provide an understandable description of the illustrated embodiments.

Where a range of values is provided, it is understood that each intervening value, to the tenth of the unit of the lower limit unless the context clearly dictates otherwise, between the upper and lower limit of that range and any other stated or intervening value in that stated range is encompassed within the illustrated embodiments. The upper and lower limits of these smaller ranges may independently be included in the smaller ranges is also encompassed within the illustrated embodiments, subject to any specifically excluded limit in the stated range. Where the stated range includes one or both of the limits, ranges excluding either both of those included limits are also included in the illustrated embodiments.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the illustrated embodiments, exemplary methods and materials are now described. All publications mentioned herein are incorporated herein by reference to disclose and describe the methods and/or materials in connection with which the publications are cited.

It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth.

The publications discussed herein are provided solely for their disclosure prior to the filing date of the present application. Nothing herein is to be construed as an admission that the illustrated embodiments are not entitled to antedate such publication by virtue of prior invention. Further, the dates of publication provided may differ from the actual publication dates which may need to be independently confirmed.

It is to be appreciated the illustrated embodiments discussed below are preferably a software algorithm, program or code residing on computer useable medium having control logic for enabling execution on a machine having a computer processor. The machine typically includes memory storage configured to provide output from execution of the computer algorithm or program.

As used herein, the term "software" is meant to be synonymous with any code or program that can be in a processor of a host computer, regardless of whether the implementation is in hardware, firmware or as a software computer product available on a disc, a memory storage device, or for download from a remote machine. The embodiments described herein include such software to implement the equations, relationships and algorithms described above. One skilled in the art will appreciate further features and advantages of the illustrated embodiments based on the above-described embodiments. Accordingly, the illustrated embodiments are not to be limited by what has been particularly shown and described, except as indicated by the appended claims. All publications and references cited herein are expressly incorporated herein by reference in their entirety.

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Reference will now be made to the drawings wherein like reference numerals identify similar structural features or aspects of the subject disclosure. For purposes of explanation and illustration, and not limitation, a partial view of an exemplary embodiment of a system and method in accordance with the disclosure is shown in FIG. 1A and is designated generally by reference character 100. Other embodiments of the system and method in accordance with the disclosure, or aspects thereof, are provided in FIG. 1B-8F, as will be described.

It will be understood that the system 100, 300, 400, 500, 600, 700 is used interchangeably throughout the document with all references referring to the same system highlighting different aspects thereof. The system 100 of the present disclosure automates critical tasks and enables a consistent flow of information across three process stages (planning and quoting, mounting and wiring and commissioning and testing) related to integrated systems. The system 100, as shown in FIG. 1, consists of an installation and commissioning (IAC) tool 102. The IAC tool 102 is an application which can be accessed through a mobile device or computing device to aid and guide a user through the entire three stage process, as will be discussed in further detail below. The IAC tool 102 includes a database 104 having a memory 106 operatively connected to a processor 108 and a server 114a to process, store and disseminate up-to-date information related to each building. The server 114a along with the database may take the form of a web application hosted on a webserver or a cloud computing platform, located at a different location, which is accessible by various customer entities to perform different tasks across the three process stages. The database 102 is accessible by more than one mobile device 110a, 110b, 110c and/or computing devices with network capability. For example, a computer located at an office of a sales representative and a tablet usable by either an installer or a customer can each access the database. The IAC tool 102 is also accessible by mounted and wired components 112 installed as part of a building system. In another embodiment, the whole system 100 may exist on a single platform such as a tablet computer with no network connectivity or a computing device with network connectivity.

I. Planning and Quoting

Figure 1B:
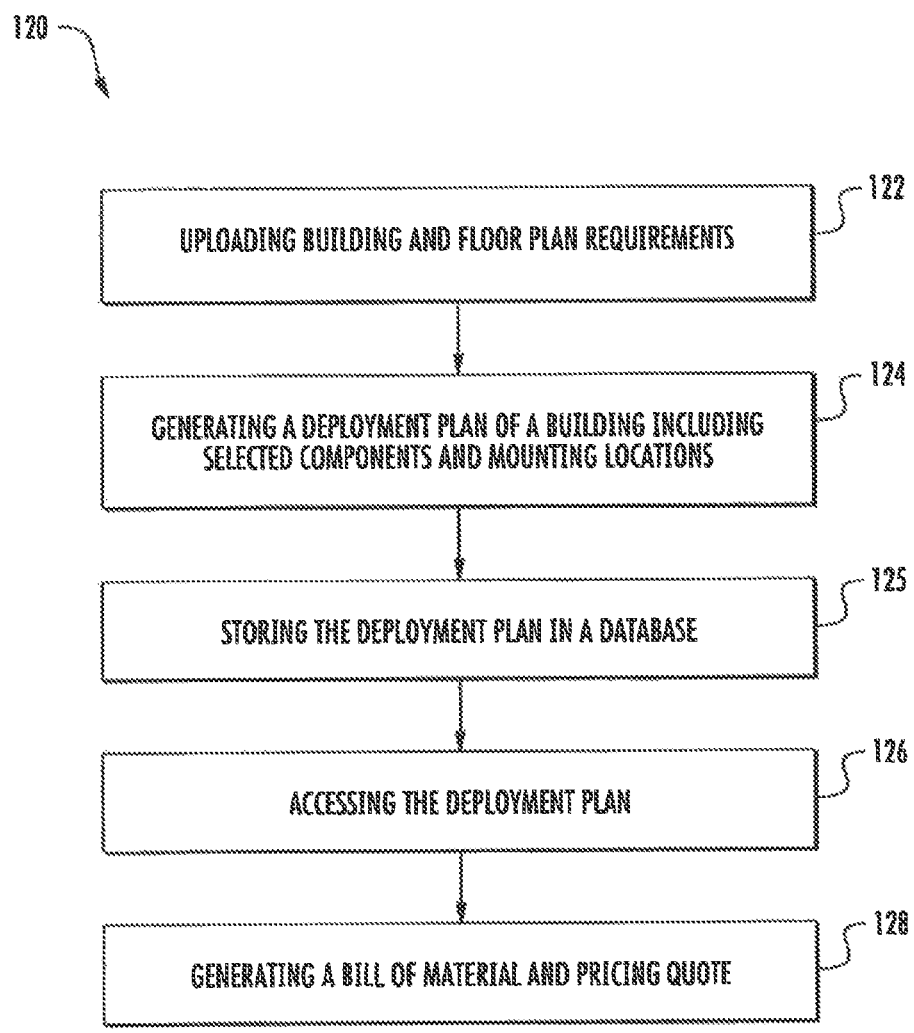
FIG. 1B is a flowchart showing the method of planning and quoting a building using the system of FIG. 1A.

A method 120 of completing the first stage of an integrated building system is shown in FIG. 1B. A user such as a sales representative or a customer accesses the IAC tool 102 via the mobile device or other network connected computing device to create a customer account. The customer account also includes building description, such as, floor plan, address, number of occupants, typical building usage, etc. As shown in box 124, the IAC tool 102 includes a guided interface which requests building system requirements, including the types of building system (e.g. intrusion detection system, video surveillance, access control, fire safety, HVAC, elevator, etc.) and their desired level of certifications (e.g., NFPA rating for fire safety sensors. ASHRAE standards for HVAC and UL or EN-grade for intrusion sensor). The IAC tool 102 allows updating the selected components based on stock availability and lead times of the selected components Based on the building system requirements, building description, and stock availability of components, a deployment plan for the building is generated either by using an automated computer program that is a part of the IAC tool 102 or manually, as shown in box 122. The deployment plan includes a floor plan (i.e. a geometric representation of the building) with selected components positioned at their planned mounting locations, configuration for selected components. The selected components can include, motion sensors, fire hazard sensors, light sensors, image sensors, video or infra-red cameras, heat, flame, smoke or carbon-monoxide detectors, sound detectors, shock detectors, vibration sensor, accelerometers, moisture detectors, humidity sensors, magnetic contacts, temperature sensors, photo-detectors, actuators (e.g. key fob, garage door opener, sounders, panic buttons, thermostats, lighting and appliance control modules, light switch, etc.) routers, repeaters, mobile or static displays, intelligent meters, intelligent appliances. If an automated computer program is used to create the deployment plan, the program automatically places the selected components at designated mounting locations on building floor plan, described in further detail below. The building description (includes address, floor plan, number of occupants, building usage, etc.) system requirements, and the deployment plan are all stored in the database 104 as detailed building information, as shown in box 125. The building information identifies a set of building system components, from a database of supported components, which meet the requirements of the customer and building. The building information also includes the location of the selected components in the building. This could be displayed either graphically on a floor plan or as a list with location identifiers. Next, the building information illustrates the configuration for each of the selected components in the building. This configuration can be specific to the building type, building usage, and location of the components within the building.

The customer account which includes the detailed building information can be accessed at a later time by a system designer, as shown in box 126. The system designer may also retrieve the customer/building information using a separate device as the device used to receive and store the building information. In other words, multiple users are capable of accessing the stored building information from unique devices at any point in time after the deployment plan is stored under the related customer account.

As shown in box 128, the building information is used to generate a bill-of-material and pricing quote for the sales, installation, commissioning of the building system. This step again could be performed either automatically or by a sales representative or a customer with assistance from a computer program provided by the IAC tool.

In order to provide a detailed deployment plan the system provides an interactive user interface for specifying building information and user requirements, including automated algorithms for fast placement of sensors and assessment of connectivity, and a visual representation of an installation map to assist with field deployments. The system 100 allows multiple users to complete a method 201 for planning a building system, shown in FIG. 2A and boxes 202, 204, 206, 208, 210 and 212. The method 201 includes the following key steps: (1) obtaining a floor plan; (2) obtaining user requirements; (3) selecting system components; (4) placing system components; (5) assessing connectivity; and (6) generating a price quote.

A. Obtaining a Floor Plan

To obtain a floor plan of a building a user can browse through a set of model floor plans to select the model floor plan representative of their building. The user is a customer looking to install an integrated system within a building, for example, a home. The user may use typical drawing tools to modify the model floor plan and also provide measurement information for different rooms so that the floor plan matches closely with the building. The user selects the model floor plan based on the following information: area, number of floors, number of rooms, architectural style, and construction year.

In another embodiment, the user uses the mobile device interface to access a web based tool to capture 360 degree panoramic images of each room and create the floor plan. In creating the floor plan, the user also categorizes each room, for example, bedroom, bathroom, basement, living room, etc.

Figure 3A:
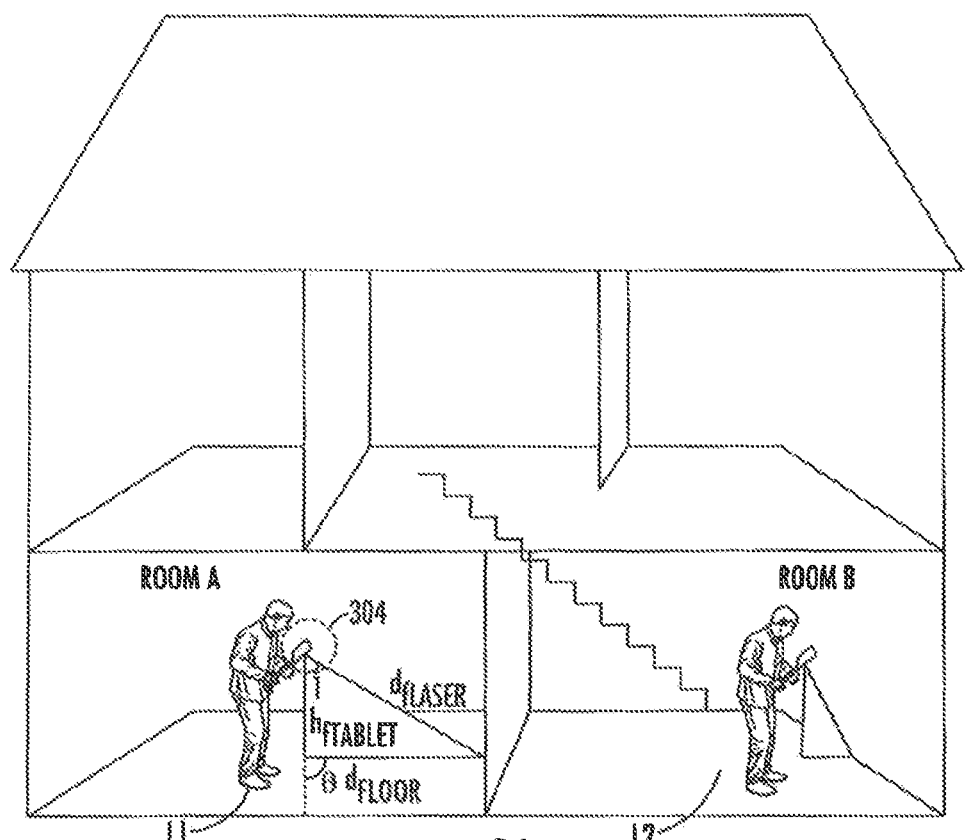
FIG. 3A is a schematic view of an exemplary embodiment of a system constructed in accordance with the present disclosure, showing a user capturing a 360 degree panoramic floor to wall intersection measurements and image of a room geometry using a mobile device.
Figure 3B:
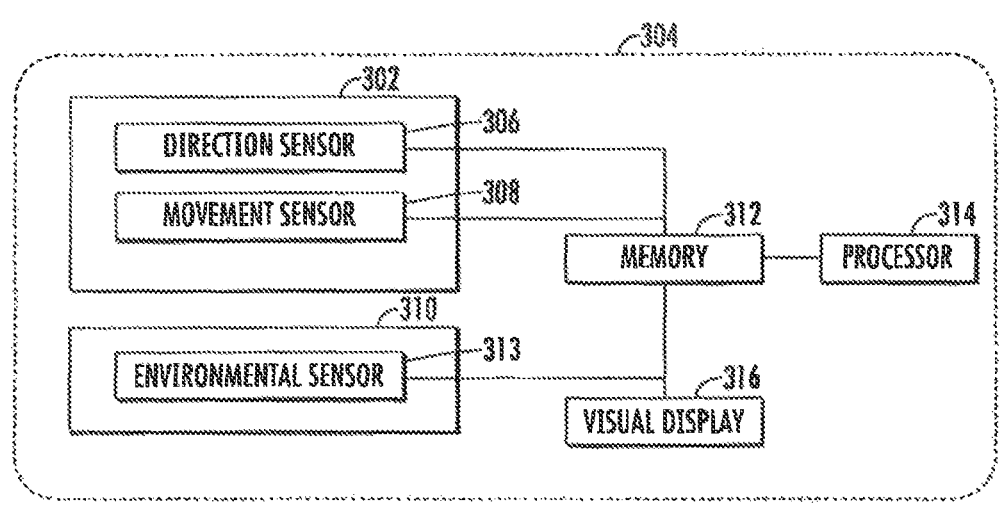
FIG. 3B is a schematic view of the mobile device of FIG. 3A.

The system 300 as shown in FIG. 3A, provides a method to capture, update, and process multi-dimensional building information from a site to assist with the design and deployment of building systems. The system 300 allows a user to walk around a building with a mobile device such as a tablet or mobile phone to capture descriptive information about the building. For example, geographic location attributes, a 2D or 3D scaled floor plan, and localized environmental descriptors within the building. With reference to FIG. 3A, an example of multidimensional building information mode is shown. The system 300 consists of two key modules: a mapping module 302 and a localization and measurement (LAM) module 310.

i. Mapping Module

Figure 3C:
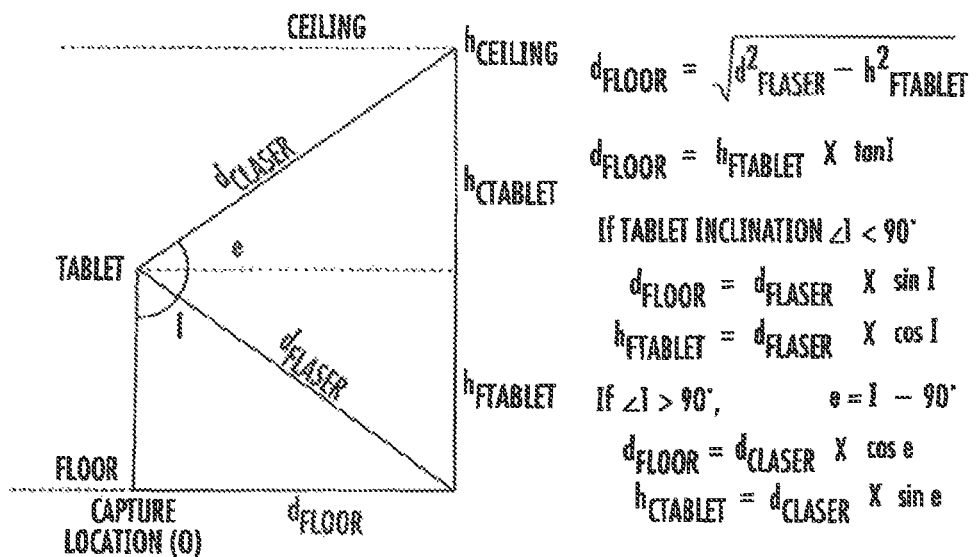
FIG. 3C is a schematic view, showing geometric relationships used to calculate distance from a capture location to the floor to wall intersection and height of the mobile device and ceiling.

The mapping module 302 uses a mobile device 110a, 304 (e.g., mobile, tablet, glasses, etc.) equipped with at least one direction sensor 306 and at least one movement sensor 308. Mobile device 304 is a detailed schematic view of mobile device 110a referenced in FIG. 1A. The direction and movement sensors 306, 308 can include a camera, accelerometer, gyroscope, digital compass, a laser pointer and/or laser meter (i.e. distance sensors). The laser pointer or meter is attached to the tablet such that the projected laser beam is aligned (i.e. parallel) with an optical axis of the camera. The mapping module is implemented on the mobile device 304 to allow a user to map a room within a building to scale. A user, for example, a customer, stands at a given capture location L1 in the room (e.g., room A) and points the camera and/or laser pointer towards the floor and rotates around the capture location L1 to obtain a 360 degree panoramic image of the floor-to-wall intersection while ensuring that the intersection is always within the visible guides overlaid on a visual display 316. As the user captures the 360 degree image of the room's floor-to-wall intersection, the mapping module 304 uses the laser meter and gyroscope to record the distances and azimuth angles from the capture location to various points in the periphery of the floor-to-wall intersection, as shown in FIG. 3A. These points are represented by polar coordinates ($d_{flaser}$, θ) with the capture location as the origin. The distances, $d_{flaser}$, are measured by the user holding the mobile device 304 at a height, $h_{ftablet}$, which can be translated into distances, $d_{floor}$, from the capture location L1 at floor level by using Pythagoras theorem as shown in FIG. 3C. This step provides an initial set of vertices, ($d_{floor}$, θ), for a polygon representation of the room geometry in two dimensions (2D). In order to correct for various capture errors such as laser meter measurement errors and user errors in ensuring laser alignment with floor-to-wall intersection, segmentation and line extraction algorithms like split-and-merge and line fitting can be applied to the initial set of room vertices to obtain an improved estimate of room geometry in 2D.

The user repeats the step of capturing dimensions of a 360 degree image in at least one additional room (e.g., room B) of the building. The user repeats the steps of rotating 360 degrees in a capture location L2 while maintaining the floor-to-wall intersection in view within the display of the mobile device 304. When both images are captured, a 360 degree image of the first room (room A) and a 360 degree image of the second room (room B) are recorded within a memory 312 of the mobile device 312. The user indicates 302 how the rooms are connected to create the floor plan of the building. For example, the user can indicate which adjacent walls are shared between the first and second rooms. Alternately, adjacent rooms can be determined by using the compass readings associated with room corners. The room corners with same or closer readings can be joined to automatically assemble the floor plan from rooms. By repeating these steps in each room of the building the user creates a floor plan of the building. While capturing the 360 image, the mapping module 302 auto detects doorways and window frames such that the mapping module builds these features of the room/building into the floor plan.

Figure 3D:
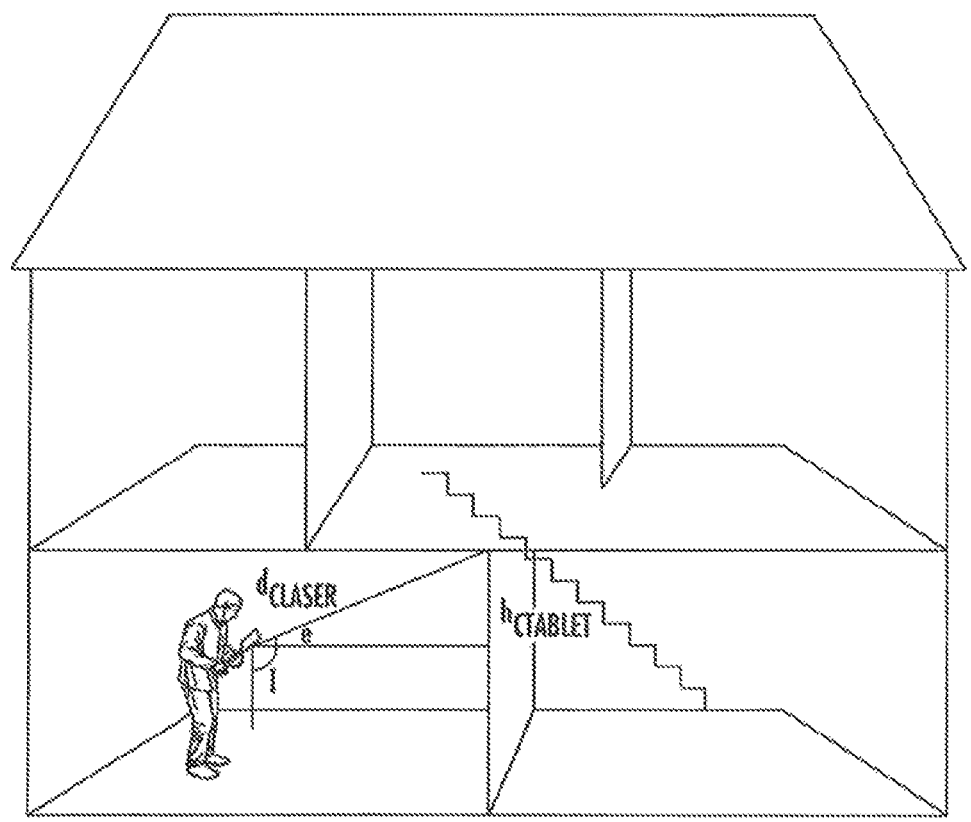
FIG. 3D is a schematic view of the system of FIG. 3A, showing the user capturing 360 degree ceiling to wall intersection measurements and image of a room geometry.
Figure 3E:
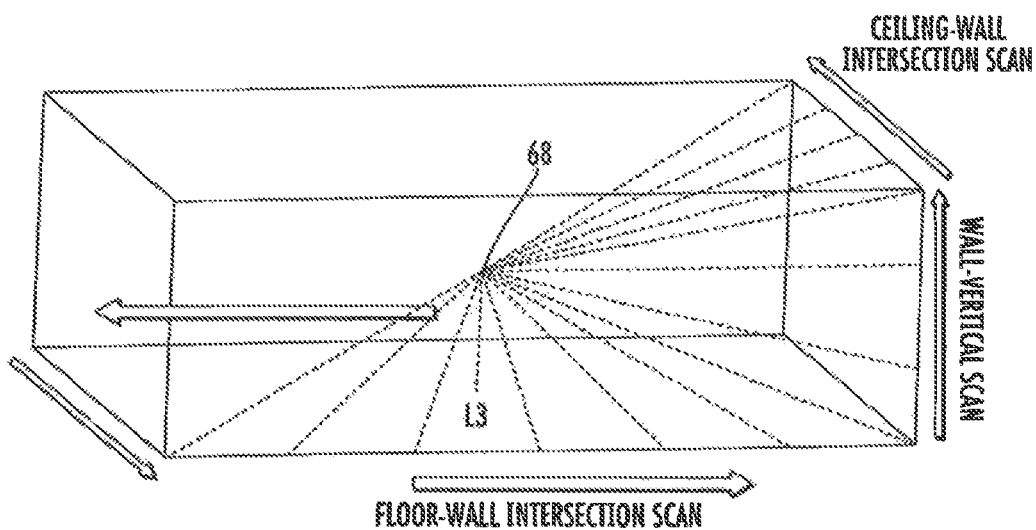
FIG. 3E is a schematic view of the system of FIG. 3A, showing capturing a 3D view of the room geometry using a laser scan.
Figure 3F:
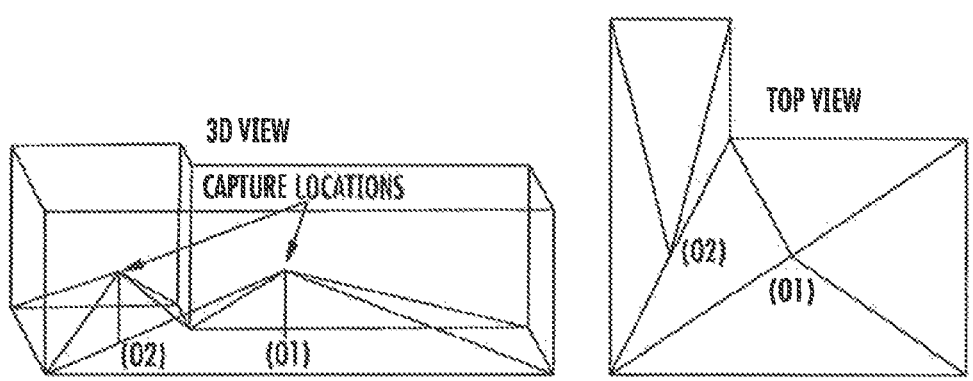
FIG. 3F is a schematic view of the system of FIG. 3A, showing different locations for capturing the laser scan measurements of a room geometry.

The mapping module allows the user to build upon the stored floor-to-wall 360 image of the room to create a three dimensional (3D) floor plan. To create a 3D floor plan of the room, the user tilts the mobile device towards the ceiling and captures a 360 degree image of ceiling-to-wall intersection, as shown in FIG. 3D. The mapping module uses the accelerometer to measure the tablet inclination angle, I, as the user changes the tablet inclination from floor-to-wall facing to ceiling-to-wall facing. The mapping module also uses the laser meter to capture the distance, $d_{claser}$, to ceiling-to-wall intersection. As shown in FIG. 3C, ceiling height, $h_{ceiling}$ can be calculated by adding $h_{ftablet}$ & $h_{ctablet}$, which are derived from I, $d_{claser}$ and, $d_{flaser}$. Following the ceiling height calculations, the steps above are repeated to obtain polar coordinates $d_{floor}$, $\theta$ for various points along the ceiling-to-wall intersection to obtain an estimate of ceiling geometry (e.g., changes in ceiling height). The image of the floor-to-wall geometry and the image of the ceiling-to-wall geometry can then be aligned with the calculated ceiling height, $h_{ceiling}$, to provide a 3D representation of the room. Those skilled in the art will readily appreciate that the steps for capturing the ceiling-to-wall intersection can be repeated in additional rooms throughout the building to create a 3D representation of each room of the floor plan. Alternatively, floor plans at different levels, e.g. first floor, second floor, etc., can be aligned on top of each other by either a) allowing a user to drag and drop floor plans on top of each other and specify ceiling height for each floor, or b) by using the compass readings associated with room corners to automatically align floor plan on top of each other. The mapping module can also capture a 2D representation only using a laser meter of the mobile device. The user stands at a given capture location L3 in the room to capture a 360 degree laser scan of the room wall surfaces, as shown in FIG. 3E. The user rotates around the capture location L3 while continuously adjusting the tablet inclination so that the projected laser beam falls onto room wall surfaces. In a room filled with furniture and other objects, a user may need to go over the complete spectrum of tablet inclination angles for example, all the way from floor-wall intersection to floor-ceiling intersection. In some cases, in order to expedite the capture process, a user can obtain laser scans measurements from only the corners of the room at either ceiling level or floor level or in-between depending on the visibility of the corners. In such scenarios room geometry can be constructed directly by joining the captured corners via straight lines, as shown in FIG. 3F, where O1 and O2 indicate the two locations where the user may stand to capture the visible corners. As the user captures the 360 degree laser scans, the mapping module uses the laser meter, accelerometer, and gyroscope to record the distances ($d_{laser}$), inclination angles (I), and azimuth angles ($\theta$) from the capture location to various points on room walls. The mapping module uses the inclination angle (I) measurements at each point to translate $d_{laser}$ to $d_{floor}$ distances, which are equivalent to the distances from the capture location to the points on the wall in the same plane, at tablet height ($h_{ftablet}$). As shown in FIG. 3C if the inclination angle, I<90°, $d_{floor}=d_{laser} \times \sin$; and if inclination angle, I>90°, e=I−90°, $d_{floor}=d_{laser} \times \cos e$.

In cases where all parts of the room are not in the user's line-of-sight from any single location, the mapping module provides the option to capture the room from a plurality of locations. At first, the user captures the part of the room that is visible from a given location. The mapping module then guides the user to relocate to a more suitable location in room and capture a set of new points, those which were previously hidden. In addition, the user must choose to capture at least two points previously captured for automated assembly of the room.

Alternatively, an inertial measurement unit in the device could be used to evaluate the displacement of the user between room capture locations of the user. Either way, the accelerometer and the gyroscopic measurements are used with the distances, as obtained from the laser, to combine measurements from all the locations to a single room. This procedure may be recursively used to map rooms with complex geometries. The mapping module then combines distances $d_{floor}$ with corresponding azimuth angles to obtain an initial set of vertices, with polar coordinates ($d_{floor}$, $\theta$), for the polygon representing the room geometry in 2D. During the process of capturing the room, the user also points the laser and records the locations of room details of interest, for example, doors, windows, etc. into the mapping module. The room details could include, but are not limited to, thermostats, HVAC ducts, light sources, smoke alarms, CO2 sensors, sprinkles, plug sockets, intrusion sensors. The mapping module automatically recognizes these features as room details and incorporates the room details into the floor plan. Alternatively, the location of room details could also be recorded after the entire room geometry is captured.

ii. Localization and Measurement Module

Figure 3G:
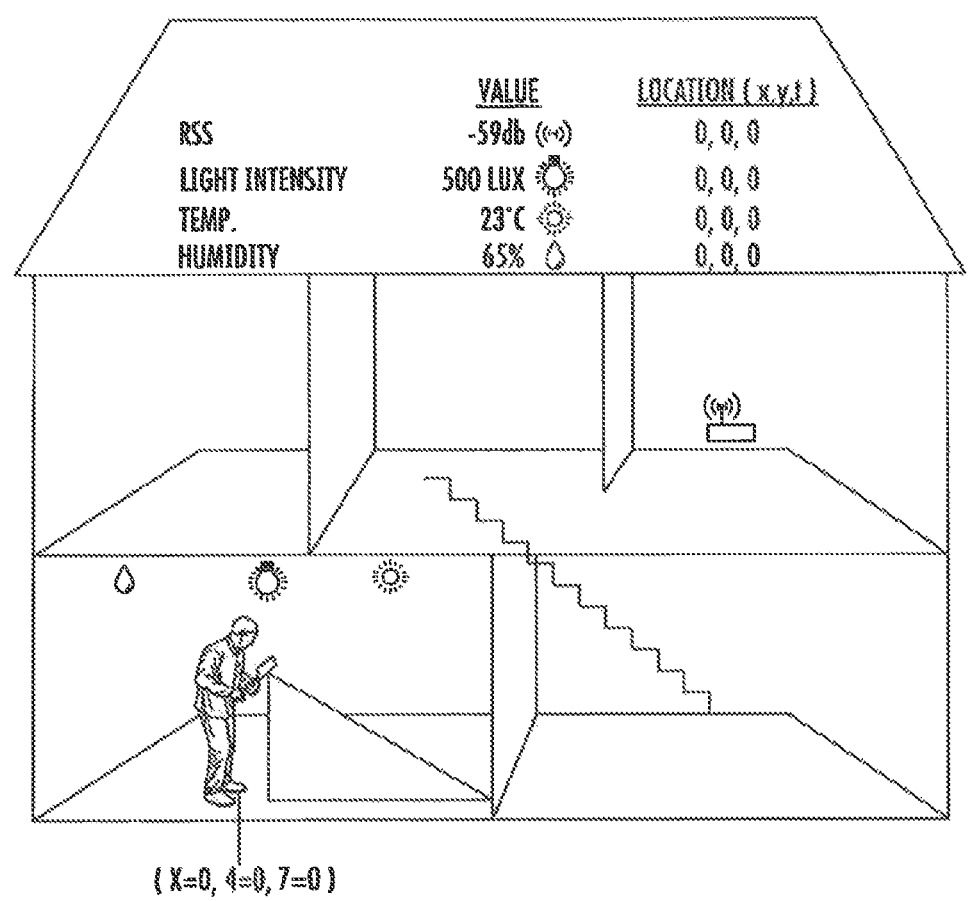
FIG. 3G is a schematic view of the system of FIG. 3A, showing the environmental measurements taken while capturing the 360 floor to wall intersection image.

The localization and measurement (LAM) module 310 performs localized measurements from various sensors on the mobile device 304 to create a building information model having the floor plan integrated with the localized measurement. As shown in FIG. 3G, as the user maps the room (e.g., room A) by rotating the mobile device 304 around the capture location origin L1, the LAM module 310 initializes the capture location as the origin with Cartesian coordinates (X=0, Y=0, Z=0). Further, as the user rotates around the capture location L1, the LAM module 310 records measurements at certain intervals from various environmental sensors 313 of the mobile device 304. Environmental sensors can include, but are nom limited to, light sensors, radio signal sensor, temperature sensors and the like. In other words, as the user is capturing the 360 degree image of the room geometry, the LAM module 310 is using environmental sensor(s) 313 to capture, for example, light intensity, temperature and/or humidity at the capture location. The LAM module simultaneously records tablet inclination ($I_{li}$) and rotation ($\theta_{li}$) associated with each sensor reading ($S_{li}$). (The subscript l describes the location, l=0 for origin described coordinates X, Y, Z. The subscript (i) describes multiple readings made at the same location). Radio receivers like Wi-Fi, Bluetooth, cellular network, etc. are also treated as sensors by the LAM module. The LAM module is able to measure various attributes of radio signals from each of the connected receiver such as: Received Signal Strength Indicator (RSS), Link Quality Indicator, Signal-to-Noise ratio, Noise level, Channel state information, and Network or transmitter identifier.

The LAM module 310 measures incident light luminance (in lux) via the light sensor and by using the camera feature of the mobile device 304 (described in further detail below). The LAM module 310 can also measure the reflected light luminance via a back camera at various locations seen from the capture location L1. When the mapping module 302 uses the laser pointer, the LAM module 310 would measure reflected light luminance at the laser point visible from the back camera. The location coordinates of the laser point thus provide the location associated with the measured reflected light luminance. Also using the known color of the laser point, the reflected luminance measurement can be converted into an estimate of incident light luminance at the laser point location.

To complete and update the building information model, the user preferably captures additional environmental information from at least one more location in the room. The user moves to a different location within the room after completing the mapping and measurements at the capture location origin (0, 0, 0). The LAM module 310 uses the readings from accelerometer and gyroscope to estimate the user's displacement and direction and applies dead reckoning methods to obtain coordinates (X, Y, Z) for the new location. Once the coordinates for the new location are established, the module repeats the steps noted above to obtain environmental sensor measurements at the new location.

Figure 6A:
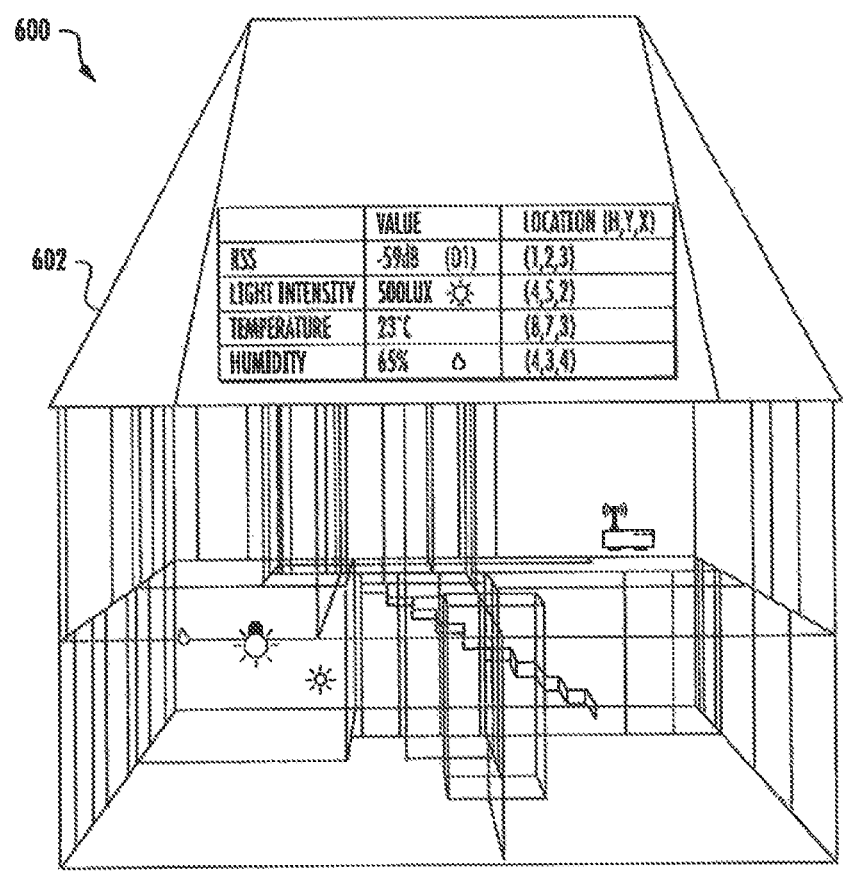
FIG. 6A is a schematic view of an exemplary embodiment of a system with a lighting fixture for planning solar-powered devices and its corresponding multi-dimensional building model with stored point-in-time illuminance data.

As noted above, the system 600 calibrates a site-specific light simulation model using the multidimensional building information model 602, as shown in FIG. 6A. The light simulation model is then used to estimate the illuminances at any given location within the building. Knowing the average illuminance available at a location allows the energy-harvesting system performance analysis (ESPA) module 604, shown in FIG. 6B, to determine the feasibility of powering an electronic device (e.g. Door/Window Contact sensor) via a photovoltaic energy harvester. A goal of this module 604 is to simplify the process for installers and remove the need to perform any extensive data processing an analysis regarding energy harvesting.

The ESPA module 604 uses the building information model 602 that provides illuminance measurements at some of the locations within the building along with a light simulation model to determine the feasibility of using a photovoltaic (PV) cell powered electronic device at any given location within the building. The method used by ESPA module 604 is described below.

System 600 uses point-in-time illuminance measurements at various locations within the building under known lighting conditions. The building information model 602 can provide two sets of illuminance measurements: one under typical daylight condition and another under typical interior light condition. In order to obtain point-in-time illuminance estimates at locations where measurements are not available, the ESPA module 604 uses the following method. ESPA module 604 defines virtual luminaries at locations with illuminance measurements. The virtual luminaries are assumed to radiate light in an omnidirectional pattern with intensity equivalent to measured illuminance at respective locations. The ESPA module 604 then uses a light simulation model like ray tracing to trace light from the virtual luminaries to any given location within the room based on the room geometry and wall material properties (provided by the mapping module 606 in FIG. 6B). An estimate of illuminance at any given location can thus be obtained by adding up the light received at that location from all the virtual luminaries.

For known interior lighting conditions where the location of interior lighting fixtures along with their photometric specifications is available, the ESPA module 604 can directly use the lighting simulation model 618 (shown in FIG. 6D) with the room geometry and material information (provided by the mapping module 606) to obtain initial estimates for illuminance at various locations, indicated schematically in FIG. 6B with module 616. The available illuminance measurements at the given locations are then compared with the estimates at those locations. The room wall material properties can then be adjusted to minimize the difference between the measured and estimated illuminance values at the given locations. These adjusted material properties are then able to provide more accurate estimates of point-in-time illuminance at any location.

Similarly, for known daylight conditions where the position of door and window blinds/shades, and other building data 612 are known, the ESPA module 604 leverages the historical sunlight data 608 available for the geographical site to obtain initial estimates of illuminance at various locations, as indicated schematically in FIG. 6D. This historical data can be, for instance, derived from Google Maps, available from Google Inc. of Mountain View, Calif., for example. The available illuminance measurements at the given locations are then compared with the estimates at those locations 610. The room wall material properties and door/window blind positions are then adjusted to minimize the difference between the measured and estimated illuminance values at the given locations 610. The adjusted material properties and blind positions are then able to provide more accurate estimates of point-in-time illuminance at any location 610.

The size and shape of doors and windows in a room can be obtained by performing image content analysis over panoramic images of the room captured by the mapping module 606. Image content analysis can also be performed over aerial or exterior images of the building and/or site to obtain location of neighboring buildings/external obstacles and the orientation of the building. The magnetic azimuth readings (e.g., from a mobile device compass) associated with points on doors/windows are used to obtain the position of doors and/or windows relative to sun. All possible lighting conditions can be defined for a building or zone within the building, using already associated illuminance measurement data and a machine learning algorithm to classify all the new point-in-time measurements with one of the possible room lighting conditions.

With reference now to FIG. 6C, the lighting schedule 614 for a building or specific rooms specifies the likely lighting conditions within rooms on a specific day of week and at specific time intervals within a day. The lighting schedule can describe the lighting conditions as daylight or interior or a mix. For daylight conditions it can further specify different door/window positions at different times, e.g. fully open windows and doors during morning, partially open windows and closed doors during evening, etc. For interior lighting conditions, schedule 614 can further specify different types of lights that are turned on at different times. e.g. night lights during night, reading lights during evening, etc. The lighting schedule can be populated automatically by the ESPA module 604 based on user demographics, geographic location, and season of the year. In embodiments, some or all of the lighting schedule 614 can be provided by a user via user interface, e.g., at a central panel in the building, or a mobile device connected to the central panel.

The ESPA module 604 generates cumulative point-in-time illuminance estimates under different lighting conditions as specified by the lighting schedule 614. The ESPA module 614 is thus able to obtain a weekly (and/or daily) average of light energy available at a location 610. The ESPA module 604 then uses the efficiency specifications of the photovoltaic cell to estimate the average power that can be harvested, at any given location, from the available light illuminance at the location.

The ESPA module 604 determines feasibility of operating PV powered devices. The ESPA module 604 compares the average power available from PV cells at a location 610 with the power usage profile of the electronic device. If the available power exceeds the required average power. ESPA module 604 recommends deploying the PV powered electronic device. The ESPA module 604 can also search through all the locations within a room to determine locations 610 where the average power harvestable exceeds the power usage profile for a given electronic device. In embodiments, the ESPA module 604 sorts the locations 610 based on the harvestable power. The final mounting location for an electronic device can then be determined by combining other placement criteria based on device type, e.g. a door/window sensor would have to be placed on a door/window, and connectivity requirements, e.g., a device would need enough wireless signal strength from the panel to communicate its measurement back to the panel. This output may also drive requirements for sensors (e.g. movable or re-locatable PV panels). The method can include determining the type of harvester to be used at a mounting location (e.g. movable or re-locatable PV panels) given the sensing and connectivity requirements for a particular device type.

The Energy-harvesting system performance analysis described in this disclosure provides the following potential benefits over the traditional systems: allowing an installer to verify the feasibility of achieving continuous operation for photovoltaic-cell powered electronic devices based on their mounting locations, easy to use functionality, when integrated with the mapping module also described herein, allowing use of battery-free alternatives for devices where feasible, providing a set of locations within a building that would be able to facilitate continuous operation of photovoltaic powered devices, providing an integrated tool that takes into account both interior and daylight conditions to predict the performance of energy harvesting devices over time, provides a method to use point-in-time illuminance measurements from field to calibrate both interior and daylight simulation models and correct for errors in building information input, and eliminating the need to have accurate photometric specifications of light fixtures to predict interior lighting performance.

The LAM module 310 is thus able to automatically measure and localize various environmental attributes onto the 2D and/or 3D map of the room. The module also allows a user to manually specify the location of various objects like router, lighting fixtures, furniture, etc. within the room. This detailed building information model is then used by other modules or external systems to assist with building operations and maintenance.

B. Obtaining User Requirements

Once the floor plan/building information model is complete, the user specifies the requirements. For example, the user can specify multiple partitions of the building so that each of the partitions can be planned and controlled independently. The user can also specify perceived threat at each entry/exit and the level of protection to each room based on importance/valuable. The user can further specify the presence of pets and protection preferences when away or at home. The user can use the mobile device interface to select the room or regions belonging to individual partitions. The user may then select functionality of each partition, for example, security, safety, home automation (lighting control, environmental monitoring, and self-monitoring and control). The user can also specify compliance for each functionality. For example for security functionality, the user can select the UL standards that the system must comply with. The user can also select the regulatory standards that the system should comply with. The system 100 automatically determines the applicable regulatory standards based on the location of the building. For example, in the United States, the system 100 would be able to determine the regulatory requirements for smoke and carbon dioxide sensors based on the state in which the building is located.

C. Selecting System Components

After obtaining the user requirements, the system 100 automatically selects components from a manufacturer's database, which are able to meet the user requirements and are appropriate for the building. In doing so, the system 100 analyzes the building floor plan size and the number of rooms to determine the required system capacity. The system 100 also takes into account the types of available components such as, PIR/motion sensors, door/windows/contact sensors, glass break sensors, image sensors, video or infra-red cameras, heat, flame, smoke or carbon-monoxide detectors, sound detectors, shock detectors, vibration sensor, accelerometers, moisture detectors, humidity sensors, magnetic contacts, temperature sensors, photo-detectors, actuators e.g. key fob, garage door opener, sounders, panic buttons, thermostats, lighting and appliance control modules. For each component, the system 100 also evaluates the parameters such as coverage (radial range, angular range), detection performance (e.g. detection probability), accuracy, battery life, wireless connectivity, false alarm likelihood, false alarm probability, and the like. Constraints on placement of components such as, compatibility of doors and windows and possible constraints on the location are also reviewed prior to selecting the components. In addition, the system 100 allows a user to select the desired system control panel and selects system components that are compatible with the selected panel that meet user requirements D. Placing System Components i. Placement Based on Type of Component Next, the system 100 automatically places the selected components on the floor plan by using different methods for different types of components.

For magnetic contact sensors, the system 100 analyzes the floor plan to identify all perimeter doors and windows, for example, by selecting the doors and windows that do not belong to more than one room.

For motion sensors, the system 100 analyzes the floor plan and motion sensor coverage specifications to automatically place sensors by identifying rooms suitable for motion sensor placement. This is done by analyzing the floor plan to identify rooms with certain characteristics. For example, room sizes are compared and rooms greater in area than a predetermined percentile are considered big rooms and deemed suitable for a motion sensor. Other rooms suitable for motions sensor include: rooms with two or more perimeter windows, rooms with more than a certain number of interior doors and no perimeter doors are windows, and rooms labeled "living room" or other similar categories. The system 100 also identifies the type of motion sensor best suited for the specified room. This can be accomplished by calculating the differences between the area of the room and the area of coverage for compatible motion sensors (provided in sensor specifications) and then selecting the motion sensor that provides the minimum absolute difference.

For glass break sensors, the system 100 analyzes the floor plan to identify rooms with one or more glass doors, windows, etc. and automatically places a glass break sensor in each of these rooms. For a single item within a room, for example, one glass window a potential placement region for a glass break sensors is calculated based on the item characteristics/attributes, e.g. glass size and material, the sensor specifications which describe the placement requirements/rules for the glass break sensor in terms of maximum and minimum radial distance from the window and angular relationship with the item, and finally the room layout and item location in the building (i.e. relative coordinates).

In an alternate embodiment, in order to calculate the potential glass break sensor placement region for protecting a single item, the room area can be sampled to obtain a distributed grid of points. The points that satisfy the placement requirements for the sensor in relation to the item to be protected are determined and the sensor is automatically placed in the optimal location.

Whenever the protection of multiple items within a same room is desired, the system 100 attempts to find a single mount area from where a single glass break sensor could be placed to protect all the items. When this is not feasible, the proposed approach places additional glass break sensors to provide protection to all desired items within the room. The mounting area of a particular item is picked and intersected with the mounting area of another item, if the resulting intersected area is bigger than a certain minimum size, the resulting area is taken as input and intersected with other single mounting areas until all the single areas corresponding to the different items have been checked or the resulting intersected area is smaller than a minimum size. Whenever the intersected area is smaller than a minimum size, a sensor is placed in the last valid intersected area. This is repeated with the remaining windows for placement of multiple sensors. When no more areas remain to be checked, a glass break sensor is placed in the last resulting intersecting area.

In another embodiment, mounting areas for all possible placement of windows are intersected with each other to find out which combination of intersections provides the best solution in terms of number of required sensors to protect all the available items in the room. In a yet another embodiment, grid points are checked against the mounting rules of all the different items to protect to verify which items could be protected if a sensor was to be placed at the particular point. Once the protected items for each grid point are known, the engine selects as placement point any point that covers all items. If none of the points covers all items, then several points are chosen so that all items are covered.

ii. Placement Based on Location and Orientation within the Room

Figure 2A:
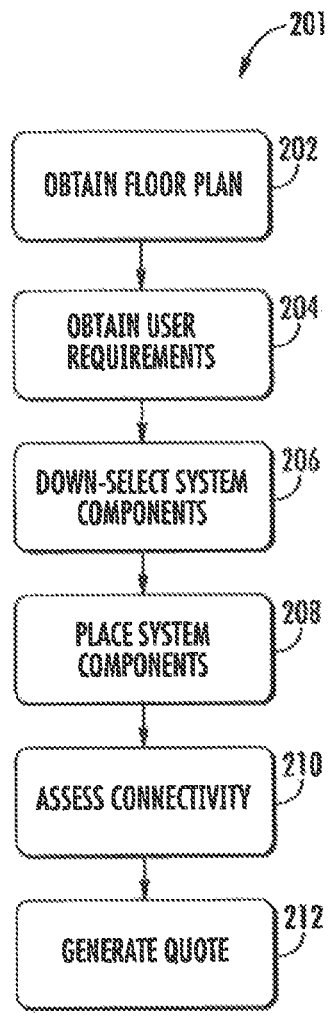
FIG. 2A is a schematic view of an exemplary embodiment of a method constructed in accordance with the present disclosure, showing steps for component placement.
Figure 2B:
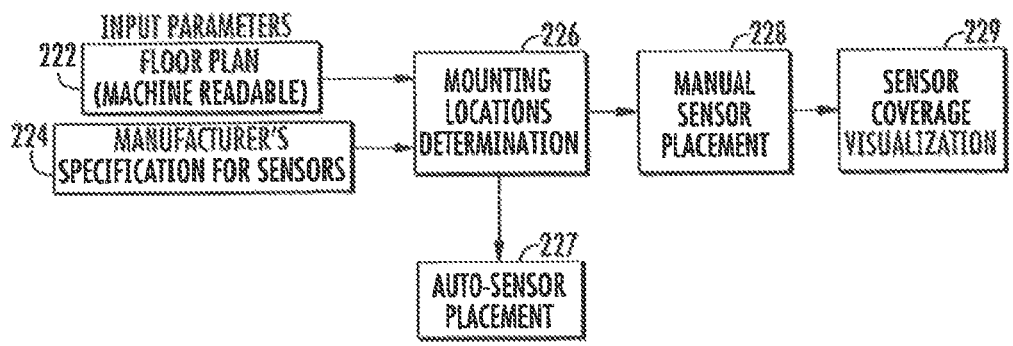
FIG. 2B is a schematic view of a system in accordance with the present disclosure, showing modules for placing components on a floor plan.

Once the system 100 determines the preferred locations of each component based on type, the system 100 automatically determines the optimal mounting location (i.e. ceiling, wall, corner, etc.) and orientation within a room for a given component and dynamically visualizes the coverage realized for the component on the floor plan. The valid mounting locations and orientations can also be used as an input to automated placement algorithms. FIG. 2B shows an overview where the system takes as input parameters the floor plan 222 obtained by the user and the manufacturer's specifications 224 for each of the components. Four key modules are used to determine mounting location and orientation: a mounting location determination module 226, an auto sensor placement module 227, a module to assist in manual placement 228, and a coverage visualization module 229. The mounting location determination module 226 analyzes the generated floor plan to identify valid mounting locations and orientations for a component based on physical constraints derived from the component's manufacturer's specifications. For a given component, the mounting locations determination module automatically identifies vertices of a room and ceiling high furniture (e.g. wall attached cabinets). The set of identified vertices are analyzed and combined to generate a set of polygons that describe the individual rooms within the plan.

For ceiling mounted sensors, mount-type is determined from the manufacturer's specifications (extracted from a sensor specification database), and a room polygon is discretized with a grid of specific size to obtain an exhaustive set of potential mounting locations. The appropriate grid size is determined based on sensing range, room size, and other mounting guidelines from the manufacturer's specifications.

For wall mounted sensors, the exhaustive set of potential mounting locations can be determined by segmenting each wall section in equal parts. This can be done by identifying the set of points between two consecutive polygon vertices separated by a specified minimum distance, which is again determined based on manufacturer's specifications.

For corner mounted sensors, each vertex in the room polygon is a potential mounting location. The valid set of mounting locations are then obtained by processing the exhaustive set of potential mounting locations such that the points that overlap with ceiling-high objects/furniture in the room are eliminated. For a particular point, different heights can be considered depending on manufacturer mounting specifications for a sensor.

Figure 2C:
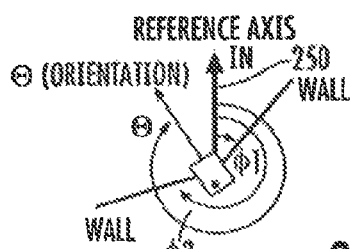
FIG. 2C is schematic diagram, showing calculation of orientation of a component when a reference axis falls inside a polygon of interest.
Figure 2D:
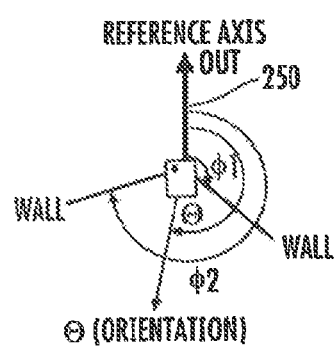
FIG. 2D is a schematic diagram, showing calculation of orientation of a component when a reference axis falls outside a polygon of interest.
Figure 2E:
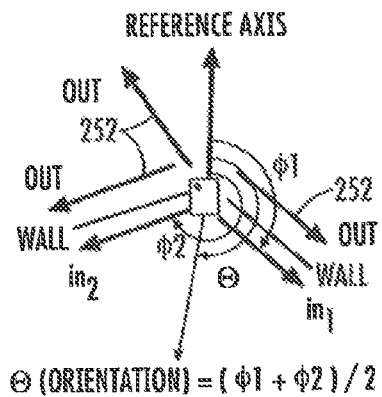
FIG. 2E is a schematic diagram, showing calculation of orientation by multiple rays that fall inside a polygon of interest.
Figure 2F:
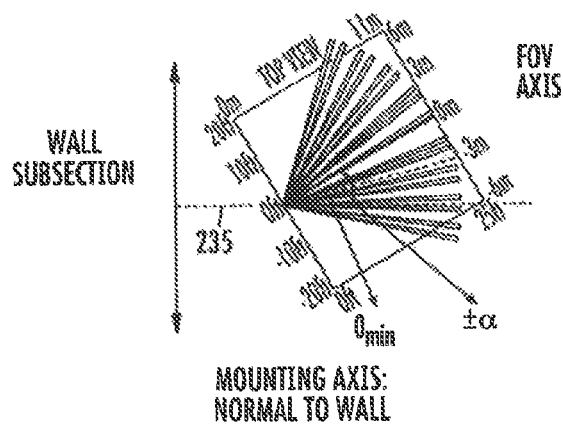
FIG. 2F is an exemplary diagram, showing use of manufacturer's specifications to determine mounting axis and field of view of a component.

For wall and corner mount sensors, valid mounting orientations for each valid location can be determined by first estimating a principal mounting axis 235, as shown in FIG. 2F, which in case of a wall location is a normal to wall subsection looking inside the room and in case of a corner location, is the angle bisector for the corner looking inside the room. In order to determine the mounting axis in two dimensions (2D), a ray 250 is launched towards the reference axis with a small delta radius producing a new reference vector and point (FIGS. 2C and 2D). For the reference point, the point-in-polygon algorithm is run to determine whether it falls within the polygon of interest. If the point is inside the polygon, the orientation with respect to the reference axis or vector is obtained through equations (1) and (2) as shown in FIG. 2C:

$$\theta' = \phi 2 + (360 - \phi 2 + \phi 1) * 0.5 \quad (1)$$

$$\theta = \begin{cases} 360 - \theta' & \text{if } \theta' \geq 360 \\ \theta' & \text{if } \theta' < 360 \end{cases} \quad (2)$$

On the other hand, if the reference point does not fall within the polygon of interest, the orientation with respect to the reference axis or vector is obtained through equation (3) as follows (FIG. 2D):

$$\theta = (\phi 1 + \phi 2) * 0.5 \quad (3)$$

In an additional embodiment, in order to determine the mounting axis in 2D, at the given mounting point rays 252 are launched in all possible directions around the point for a given radius resulting into a new set of check points whose direction or orientation is known with respect to a reference axis (see FIG. 2E). For each of the points, the point-in-polygon algorithm is applied to check if they remain in the original room polygon of interest. Finally, the mounting axis for a point in a 2D floor plan is the mean between the most distant orientations, with respect to the reference axis, of the check points that were found to be within the original polygon of interest.

Once the mounting axis has been determined, the set of valid mounting orientations is obtained using the manufacturer's specifications in the form of a set of feasible mounting angles with regards to the mounting axis, as shown in FIG. 2F. For each valid mounting angle, feasible mounting inclinations are also obtained e.g. flush mount with downward inclinations, upward inclination or inverted mounting for pet immunity. An additional check can be performed for each calculated location and orientation to eliminate the location and orientation combinations that do not meet any of the mounting constraints or guidelines stipulated in the manufacturer's specification. For e.g. a PIR-based motion sensor should not be placed such that its field of view is directed toward a window, an outside door, or a heat source like a heating vent.

For sensors like PIR or cameras that have tilt specifications, for a determined placement the tilt is specified based on the height of the room as provided by the floor plan description and manufacturer specification. In an embodiment, where an auto-sensor placement algorithm is implemented, the set of valid mounting placements can then be passed as an input to the placement algorithm that can then select the best mounting location to achieve a desired performance.

Figure 2G:
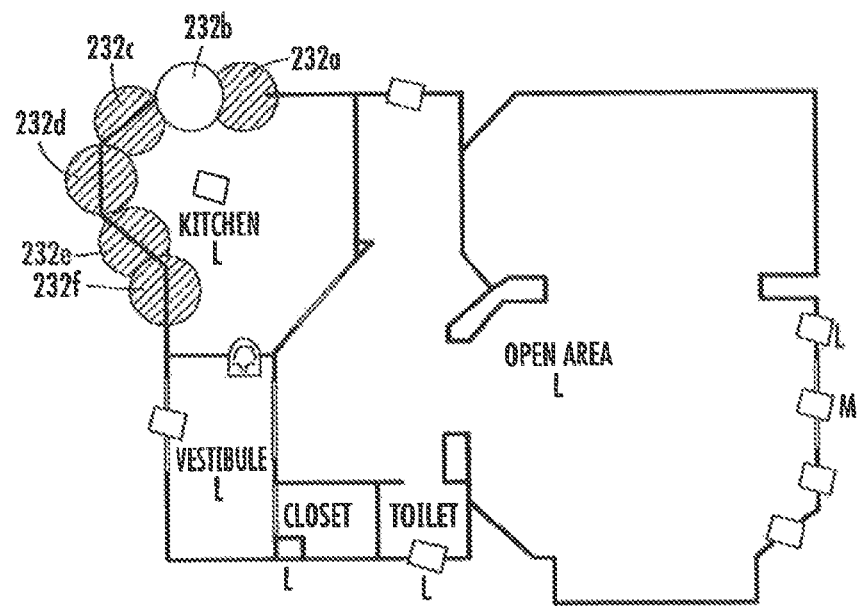
FIG. 2G is a schematic diagram, showing visual feedback during manual placement of components.

The manual component placement module 228 facilitates manual placement of sensors. The system 100 provides a user interface that illustrates the floor plan and allows a user to drag a specific component and drop it at a particular location on the floor plan. In order to assist a user during manual placement of components, the module 228 allows the user to select a component type from predefined list. For example, the user can drag and drop a component icon. The module keeps track of the component icon location, obtains the sub-set of valid locations that are in the vicinity of the icon, and for example, highlights these valid locations 232a-f in the vicinity, as shown in FIG. 2G. This provides a visual/audio/haptic feedback to guide the user about the potential valid placement options. The module automatically places the component at the nearest valid location when the component is dropped at a location by the user ("snap to valid location") and automatically orientates the placed component along the wall tangent axis.

Figure 2H:
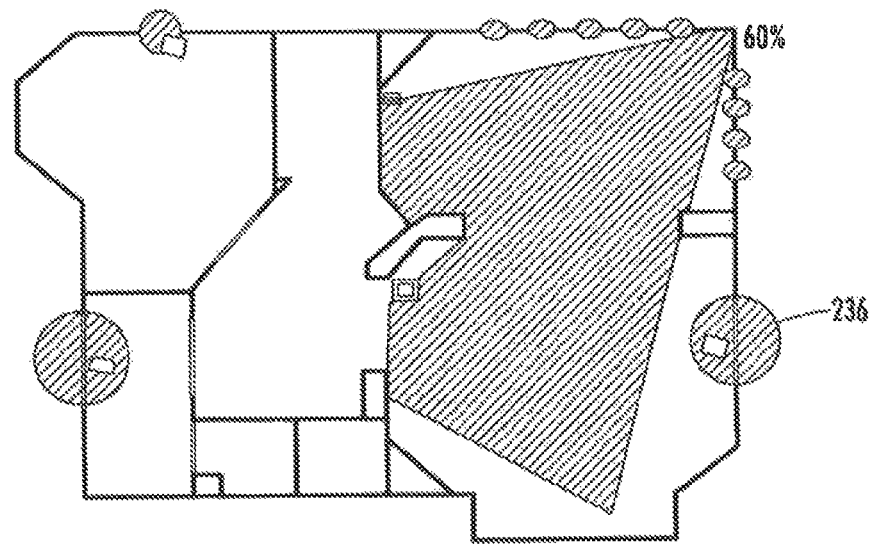
FIG. 2H is a schematic diagram, showing component coverage visualization.

Once the components are mounted in the optimal location and oriented, the coverage visualization module 229 estimates the coverage provided by a component based on its sensing modality, sensing range, position, orientation and tilt. This can be done in many different ways. For example, in case of door/window contact sensor, the coverage can simply be visualized by a circle 236 around the protected door or window, as shown in FIG. 2H. In the case of a motion sensor or a camera, coverage visualization can be accomplished by first calculating visibility polygon, which is a 360 degree set of all points visible from the mounting location. This takes into account the shape of the room polygon and any type of obstacle inside the room such as furniture, staircase, etc. as defined by the floor plan description. Then field of view can be calculated for the given mounting location, orientation, height and tilt, this can obtained from manufacturer's specification, as shown in FIG. 2F. By taking the intersection of the visibility polygon and the field of view polygon the coverage polygon can be obtained. If component placement is done manually, the module 229 allows for coverage visualization dynamically as a user drags the component across the floor plan.

iii. Placement Based on Room Layout

Figure 8A:
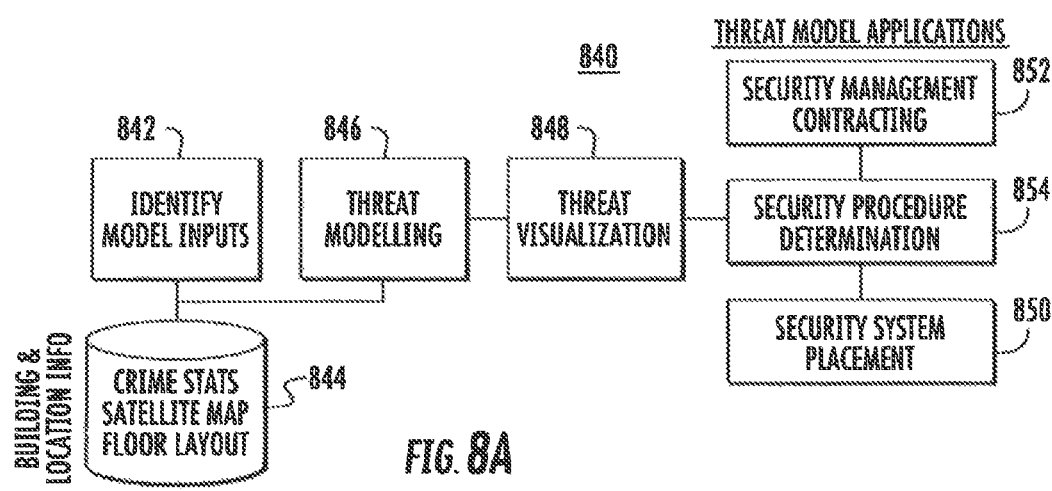
FIG. 8A illustrates a schematic block diagram of an intruder threat detection systems in accordance with the present disclosure.

For rooms within the floor plan that have free/open space but may be arbitrary in shape and which may have obstacles present which lead to constraints in visibility of one location from another location, the system 100 uses a coverage maximization process for optimal placement of components. The system 100 also assesses coverage by the component network taking into account the capabilities of each individual component as well as probabilistic models for intruder locations and directionality of intruder motion. With reference to FIG. 8A, an intruder threat detection system 840 is shown that models, maps and generates a GUI that visualizes intrusion threats for a given building for display on a display device. The model shown on the mobile device allows the user can update the intruder models to re-compute the optimal component placement in real time.

The task of optimally placing components in a confined domain can be expressed as a problem to minimize the distance between a coverage distribution (which captures how well each point in the domain is covered by the sensors) and the intruder prior distribution. Minimizing this distance leads to the sensors footprints being concentrated in the regions where there is higher probability of detection of intruders. This can be achieved by changing the locations and orientations of the components until the minimum cost or distance is realized. The stochastic gradient descent approach is particularly powerful in this application. For the case where the number of components and possible locations are low, the system 100 can enumerate all possible combinations of sensor locations and orientations to find the optimal location and orientation of each sensor. The approach is independent of specific component characteristics (like detection range and detection probabilities).

First, the room layout is taken into account as created during generation of the floor plan The room layout includes the following: geometric shape and coordinates of the room, the set of valid sensor mounting locations and orientations within the room, the location and size of other objects within the room (e.g. walls, furniture, windows etc.) and an intruder prior map, which captures the likely location of intruders and likely direction of motion of intruders (discussed in further detail below). The method also takes as input the list of sensors to be used and their individual characteristics like detection range and detection performance to optimally place the given sensors within the room so as to minimize coverage metric. The coverage metric also takes into account visibility constraints caused due to the location of objects like walls and furniture.

Figure 2I:
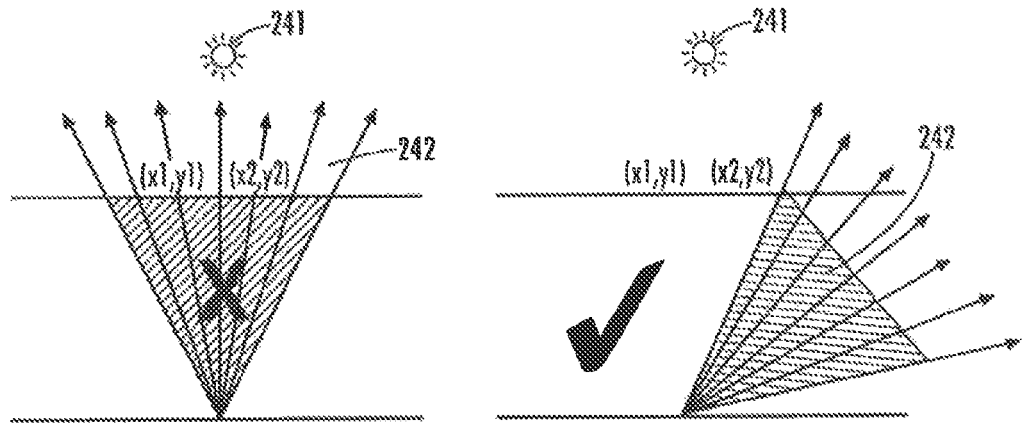
FIG. 2I is a schematic diagram, showing field of view constraints influencing placement of components.
Figure 2J:
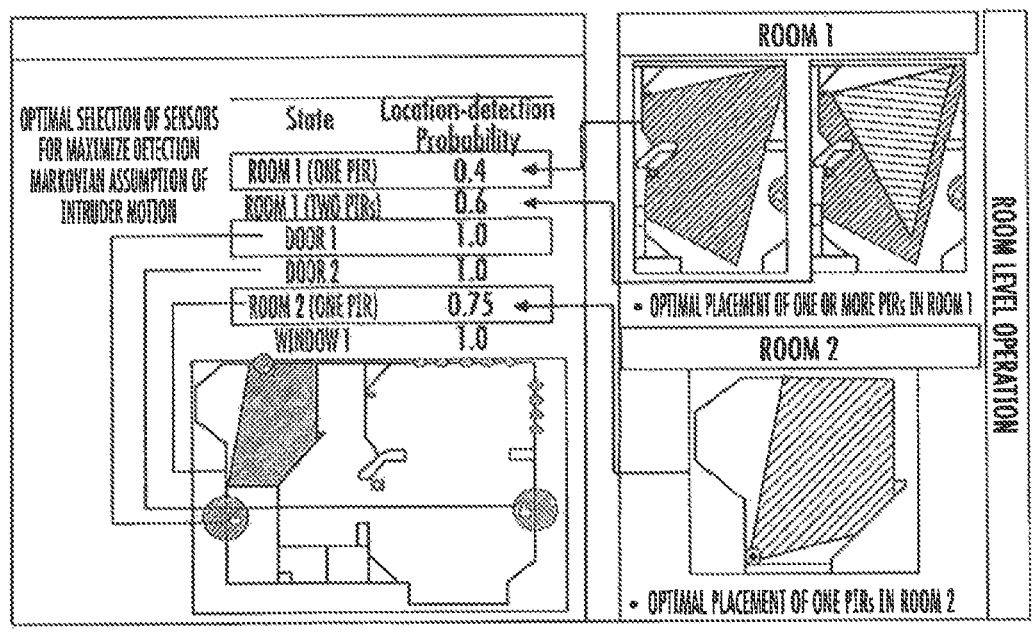
FIG. 2J is an exemplary diagram, showing hierarchical placement of drawings.

The method can also take as input Field Of View (FOV) constraints so as to prevent a component from observing certain objects in the room (like windows, radiators or vents). By taking into account these FOV constraints, the method can reduce the false alarms generated. The FOV constraints may be passed as sets of coordinates towards which the component may not be aimed, these may represent the location of a light source, heat source, etc. In order to evaluate if the selected position or orientation of the sensor does not meet the constraints, a set of rays 242 may be launched at the particular location and orientation to see whether these rays intersect an object 241 as shown in FIG. 2I. If an intersection is found, the location or the orientation or both may be discarded.

Figure 2K:
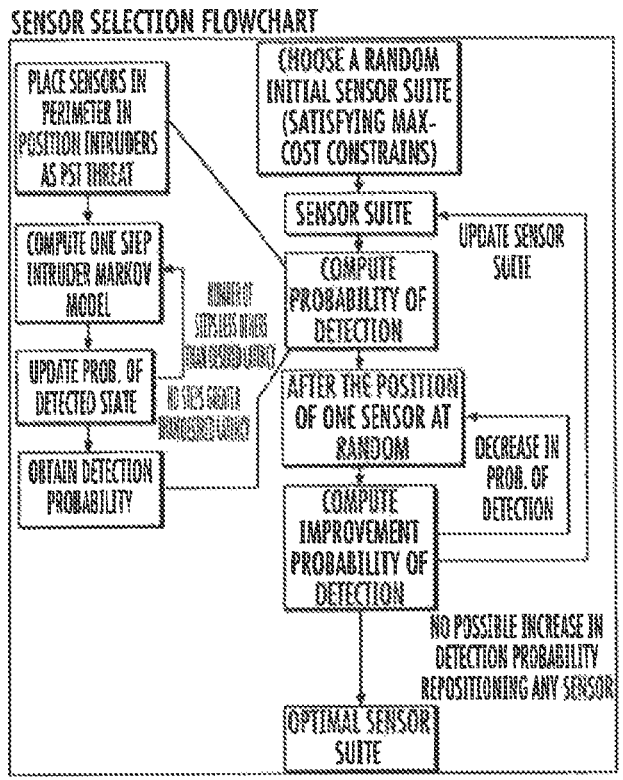
FIG. 2K is a flow chart showing building level component placement.
Figure 2L:
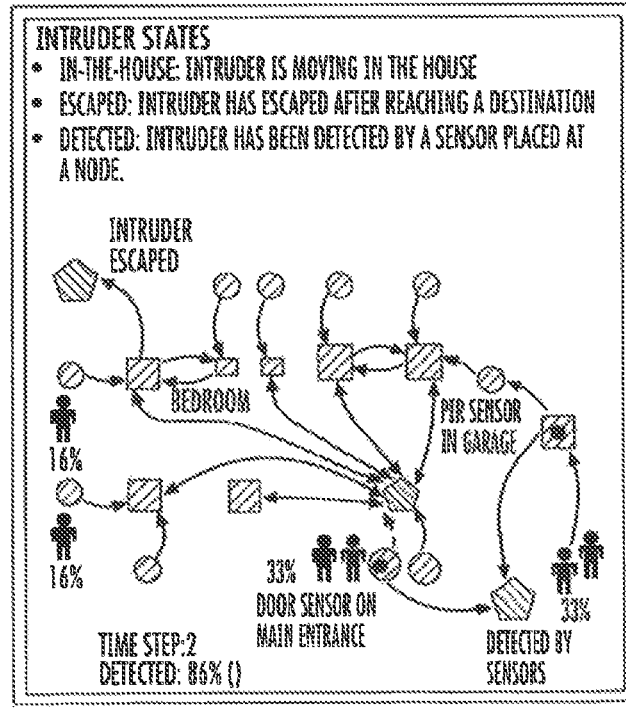
FIG. 2L is an exemplary diagram, showing a dynamic threat movement model.

The likely directions of intruder motion can also be taken into account for the sensor placement optimization, see FIG. 2L. The system 100 includes a dynamic threat model which uses data collected from previous intruders in similar buildings to analyze and determine a projected route an intruder may take based on entrance into the building. The dynamic threat model takes into account the static probability distribution of the intruder over the entire floor plan defined over a set of grid points. The model also incorporates the relative threat level for rooms in the building based on the likelihood of finding an intruder in the rooms. It is also contemplated that relative threat level for each of the exterior doors/windows can be provided by a user as input. These can then be used to derive the threat level for a given room. In this case, a graph is constructed with nodes that correspond to (X, θ) pair where X is a location in the room and θ is one of a possible finite set of angles at which the location X can be observed by a component. Two nodes on this graph are considered adjacent if and only if the corresponding locations are close to each other and the corresponding angles are close to each other.

Next, using the adjacency matrix A for the graph obtained in the previous step we compute the symmetrized Laplacian matrix $L = D^{-1/2} A D^{-1/2}$ and compute the eigenvectors of the matrix L given as shown in equation (4):

$$Lf_k = \lambda_k f_k \qquad (4)$$

The final step is to find the optimal locations and orientations for each component that minimizes the following cost-function as shown in equation (5):

$$\phi_s = \sum_{k=1}^{N} \frac{(c_k - \mu_k)^2}{(1 + \lambda_k)^s} \qquad (5)$$

where $\mu_k = \langle \mu, f_k \rangle$, $c_k = \langle C, f_k \rangle$ and N is the number of nodes on the graph. Here μ is a probability distribution defined on the nodes of the graph which captures the value of observing each node on the graph. And C is a coverage distribution defined on the nodes of the graph which captures how well each node on the graph is covered by the sensors. The coverage distribution is computed using the visibility polygons corresponding to the locations of each component and their mounting orientations. The visibility polygon corresponding to a location X is the set of locations that are visible from location X given the location and sizes of the objects that are obstacles to visibility.

The optimization described essentially minimizes the distance between the intruder prior distribution μ and the coverage distribution C by performing a stochastic gradient descent or exhaustive search over all valid sensor locations and orientations. The stochastic gradient descent is an iterative approach that starts with an initial guess for the sensor locations and orientations and proceeds by changing the component locations and orientations randomly such that the cost $\phi_s$ is reduced until no further improvement is possible The optimization method can be modified to take into account Field of View (FOV) constraints so as to prevent a component from observing certain objects in the rooms ((like windows, radiators or vents). If FOV constraints cannot be satisfied, the method will make valid component recommendations to guarantee that the constraints are met. Also, the optimization may be accelerated by truncating the number of eigenvectors used in the sum to compute the described cost-function.

The outputs of the described method are the optimal component locations and orientations for intruder detection. The quality of the solutions given by the optimization method can be assessed by computing the probability of detection of intruders (using Monte Carlo simulations) or by computing the fraction of the free space in the room covered (or observed) by the sensors. The quality of the solution can also be assessed by computing the false alarm rates caused by the sensor locations/orientations.

Figure 8B:
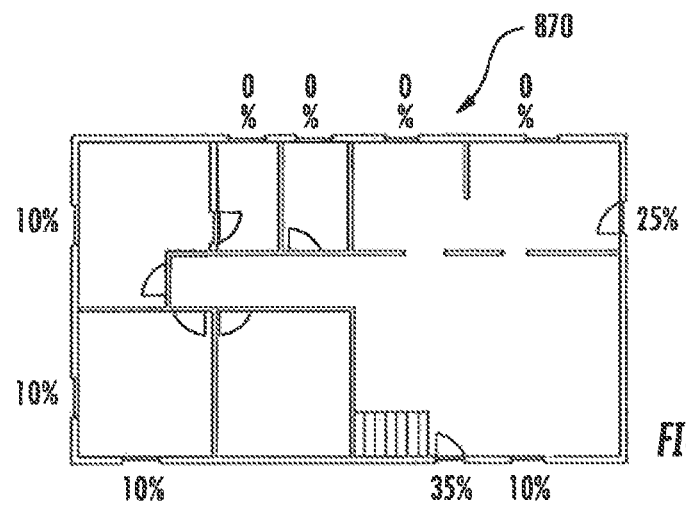
FIG. 8B illustrates a displayed Graphical User Interface (GUI) that shows a building floor plan with indications showing relative vulnerabilities to intruder threats.

The intruder threat detection system 840 includes an identify inputs module 842 that identifies input parameters specific to the building being modelled in order to model building specific threats. The inputs are selected from building and location information 844, which includes crime statistics, a satellite map and a building floor layout for the building. Example input parameters identified by the identify inputs module 842 include:

Neighborhood Crime Rate—In an embodiment, the identify inputs module 842 uses the building's geographic location information (e.g., GPS coordinates or zip code) to obtain current and historical crime rates for the building's neighborhood from a website or locally stored crime statistics database. In certain embodiments, a user can use a user interface to manually input the crime rate;

Offender Population Ratio—In an embodiment, the identify inputs module 842 uses the building's geographic location information (e.g., GPS coordinates) to obtain a ratio of offender's population relative to the total population within a given radius, e.g., 2 miles, of the building;

Criminal Activity—In an embodiment, the identify inputs module 842 uses the building's geographic location information (e.g., GPS coordinates) to gather an estimate of recent or historical criminal activity in the building's vicinity, e.g., from information available from local newspapers or law enforcement agencies;

Building Information Model—In an embodiment, the identify inputs module 842 can obtain a 2D or 3D geometric layout, such as shown in FIG. 8B illustrating a layout diagram 870, of the building from an electronic file;

Type of Building—In an embodiment, the identify inputs module 842 uses the building's geographic location information (e.g., address information) to identify the building as a residential or commercial property by querying a website or locally stored database. Further information about the use of the building (e.g., office space, factory, vacation home, etc.) can be provided by a user via a user interface;

Visibility, Surveilability & Accessibility—In an embodiment, the identify inputs module 842 uses the building's geographical location information to obtain a satellite view of the building and its vicinity and analyze the satellite view (e.g., an image) by using image processing techniques, such as edge detection, object detection and inter-object distance calculations to identify roads adjacent to the building, traffic volume on adjacent roads, proximity of the building to nearby buildings, and other characteristics to determine, for example:

Surveilability of Building Location—The identify inputs module 842 uses traffic volume information, e.g., available from public and/or private sources, and the image processing results of the satellite imagery to understand whether the building is located in a secluded area or neighborhood outskirts, in which case the surveilability of the building would be rated as low, due to a low availability of neighbors or passersby to notice or deter an intruder from scoping and planning an intrusion;

Visibility of Building Entry Points—The identify inputs module 842 uses the image processing results and the traffic volume determined on the adjacent roads to determine the visibility of various entry points, e.g., doors, windows, etc., from the adjacent roads and neighboring buildings. The more visible the entry points from a traveled adjacent road, the less likely an intruder would break into the building from those entry points;

Accessibility of Building Entry Points—The identify inputs module 842 determines accessibility of various entry points based on a detected presence of an alley or a road in front of the entry points. The more accessible the entry points from an alley or a road, the more likely a break-in attempt by an intruder. Accessibility can also be derived from the size/type of the door/window (e.g., size, sliding, hinged, crank), locks used, material of the door/window, height of door/window from the ground, and presence of a structure on or near the exterior of the building (e.g., fire escape, ledge, climber vines, drainage pipe) near the door/window that makes it more accessible;

Vulnerability Levels for Entry Points—In an embodiment, the identify inputs module 842 uses the accessibility and visibility metrics identified above for an entry point to determine its vulnerability to break-in relative to other entry points in the building. Alternatively, a user may be able to manually enter, via the GUI, the vulnerability information for each entry door, window or side of the building by clicking on it and selecting the vulnerability level as high, low, medium, or none, as shown in FIG. 8B. Vulnerability to break-in can be determined as a function of a level (e.g., ground floor level having a higher level of vulnerability than a first floor level, and the first floor level having higher level of vulnerability than higher level floors);

Vulnerability to break-in can be determined as a function of a type of window, door or wall provided at an entry point to the building or a room. A type of window can include, for example, armored glass window, conventional glass window, front side window, back side window, fixed window, hung window, sliding window, bay window, etc. A type of door can include, for example, front door, back door, security door, garage door, French door, metal door, wood door, etc. A type of wall can include, for example, brick wall, wood wall, stone wall, armored wall, etc.;

Protection Levels for Building Zones—In an embodiment, the identify inputs module 842 determines the protection level for a given zone in the building based on a likelihood of having valuables or occupants in the zone. For example, in a residential building, a bedroom can be set at a high protection level, as it is likely to have both occupants and valuables.

In an embodiment, the building floor plan can be semantically rich, which herein refers to providing details that can be used to estimate vulnerability to break-in, such as location, type and size of structures. The floor plan can list an describe different elements of the building such as walls, doors, windows, ceilings, floors, areas, and objects within and their particular relationships, attributes, and properties, e.g., height, width, material, shape, armoring, presence of a lock, associated value or quality, name, etc. In an embodiment the type of window, wall and/or door provided at a building entry point or a room entry point can be determined by extracting and processing information provided by the semantically rich building floor plan. In an embodiment, the type of window, wall and/or door provided at a building entry point or a room entry point can be determined by extracting and processing information provided in a captured image of the building. For example, characteristics of the semantically rich building floor plan and/or the captured image can be mapped to a computer database to determine information about the building, such as the type of window, wall and/or door.

In certain embodiments, a user may be able to manually enter, via the GUI, the protection levels for different zones, as shown in FIG. 8B. In certain embodiments, the above input parameters can be entered via a user interface. For example, the user may be able to select and enter a rating value, e.g., high, medium, low, or none, for a parameter.

Figure 8C:
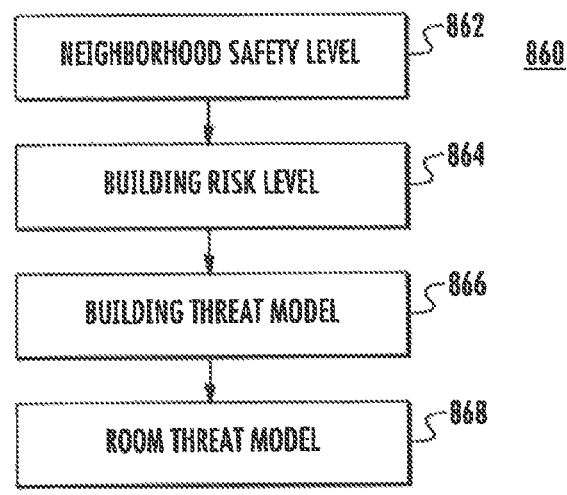
FIG. 8C illustrates a hierarchical model used to model intrusion threats for a building and/or external perimeter surrounding the building.

The intruder threat detection system 840 further includes a threat modeling module 846. FIG. 8C shows a hierarchical model 860 used by the threat modeling module 846 to model intrusion threats for a building.

At the highest hierarchical level, the Neighborhood Safety Level Model 862 provides structured data that uses the Neighborhood Crime Rate, Offender Population Ratio and Recent Criminal Activity metrics to provide an estimated metric for neighborhood safety based on equation (6):

$$\text{Neighborhood Safety Level} = 1/(\text{Neighborhood Crime Rate} \times \text{Offender Population Ratio}) \tag{6}$$

The higher the Neighborhood Safety Level, the lower the average intrusion threat for the buildings in the neighborhood.

At the next highest hierarchical level, the Building Risk Level Model 864 provides structured data that provides an estimated metric of the risk level for a given building based on the risk equation (7):

$$\text{Building Risk Level} = \text{BreakIn Likelihood} \times \text{BreakIn Impact} \tag{7}$$

wherein, BreakIn Likelihood is dependent upon the Neighborhood Safety Level, Type of Building (a residential property have a higher risk level than a commercial property), Surveilability of Building Location, Visibility of Building Entry Points, and Accessibility of Building Entry Points. BreakIn Likelihood can be calculated using equation (8):

$$\text{BreakIn Likelihood} = \text{Surveilability of Building Location} + \text{Visibility of Building Entry Points} - \text{Accessibility of Building Entry Points} \tag{8}$$

wherein BreakIn Impact is dependent upon building or room occupancy (Occupancy factor) and value or sensitivity of assets in the room or building (Asset factor).

BreakIn Likelihood associated with a room can also be determined based on the importance of the room. Importance indicates a degree of protection that should be provided to the room relative to other rooms, and/or the likelihood that an intruder may attempt to access a room. The importance of the room can be obtained by comparing semantic information available in the floor plan with available break-in statistics and may be altered by the user. Statistics about break-ins indicate likelihood of intrusion to different types of rooms. Burglary studies indicate that intruders first go to a master bedroom to find jewelry and/or cash that are easy to carry, followed by the kitchen or living room to find mobile phones, electronics, etc., and then to the bathroom to find narcotic drugs. (See: *Crime in US*, FBI UCR, 2011; *Burglary of Single Family Houses*, D L Weisel, US DOJ; *Burglar Reveals* 15 *Trade Secrets*. K. Raposo, 2012; *Criminal Investigation*, 7E, J. N. Gilbert, 1007.) These statistics can be used to automatically assign an importance level to a room based on the name or description of the room provided by the floor plan (e.g., high importance level for master bedroom, medium importance level for kitchen and living room, and low importance level for bathrooms.

In embodiments, a room's importance can be designated by user input. For example, a user can assign a higher importance level to a baby bedroom than to a master bedroom.

Regarding BreakIn Impact, a home that is occupied during the afternoon time would have more BreakIn Impact than homes that are not occupied. BreakIn Impact can be calculated using equation (9):

$$\text{BreakIn Impact} = \text{Occupancy factor} + \text{Asset factor} \quad (9)$$

The higher the Building Risk Level, the higher the likelihood of a break-in attempt on the building, and the higher the recommended protection for the building.

At the next hierarchical level, the Building Threat Model 866 provides structured data that models each perimeter door, window and perimeter wall section as a potential entry point for break-in. The relative break-in likelihood of using a given entry point for break-in is derived from the vulnerability levels assigned by the identify inputs module 842 above. In an embodiment, a sum of the relative likelihoods for all entry points within a building is 100%. If $\lambda_1, \lambda_2, \lambda_3, \ldots$ are relative break-in likelihoods for enumerated entry points, a normalized likelihood is obtained in accordance with equation (10):

$$\tilde{\lambda}_i = \frac{\lambda_i}{\Sigma_j \lambda_j} \times 100\% \quad (10)$$

The Building Threat Module 866 provides structured data that provides an estimated metric of the relative vulnerability of different zones, floors or rooms in the building, which is a function of break-in likelihood of entry points and rooms connected directly to a given zone in accordance with equation (11), as shown in FIG. 8B:

$$Vul_{Room} = \Sigma_{Connected\ Entry\ Points} \tilde{\lambda}_i + \Sigma_{Connected\ Rooms}(Vul\text{-}Connected\ Room} \times \text{Prob. of Motion}_{between\ rooms}) \quad (11)$$

wherein the Probability of Motion between rooms is the probability of motion into a given room from a connecting room, which can be a function of room labels that describe the purpose of the rooms (e.g., bathroom, bedroom, living room, office, warehouse, computer server room).

The Building Threat Module 866 can also provide structured data that provides an estimated metric of the relative vulnerability along the perimeter of the building. The vulnerability along the perimeter can be determined based on exit an entry points of the building and characteristics of the environment outside of the building or on the exterior of the building, such as lighting, fire escapes, whether the area is visible from a nearby street.

At the next hierarchical level, the Room Threat Model 868 provides structured data that models the perimeter of the building, each perimeter door, window and perimeter wall section in the room as a potential entry point and each of the interior doors or openings as an exit point. Assuming a break-in is attempted via the room, the relative room-level break-in likelihood of using a given room entry point is derived from the building-level likelihood values for the entry-points. The module then uses probabilistic modeling, such as a Markovian decision process, to track the movement of intruders from entry points to exit points while assuming the following:

Intruders move along the shortest path with a high given probability P

Intruders explore the room with probability 1-P

Intruders avoid obstacles, like furniture pieces, within the room

Intruders may escape the room without reaching a particular exit

Intruders detection should occur closer to entry point versus exit points

The probabilistic modeling can generate a probability distribution for intruder movement within the room. Note that in alternative embodiments, other agent based simulation techniques can be used to obtain the probability distribution for intruder movement within a room based on the factors described above. In other embodiments, probabilistic distribution of intruder movement in a room is derived by aggregating the intruder distributions obtained from several simulation runs where each individual run assumes a given opening in the room as an entry point and all other openings as potential exits with certain probabilities and then obtains intruder distribution then repeats the simulation with another opening as entry point and all other as exits until all openings in the room have been considered as entry point at least once.

The intruder threat detection system 840 further includes a threat visualization module 848. The threat visualization module 848 uses the outputs from the threat modeling module 846 to generate a displayable visualization of the threat on a display of the building floor plan that can be provided as a GUI displayed on a display device. The displayable visualization allows a user to visualize the threats at the building level, floor level and room level. This visualization can depict a relationship between intrusion threat probabilities and locations on the buildings floor plan.

Figure 7A:
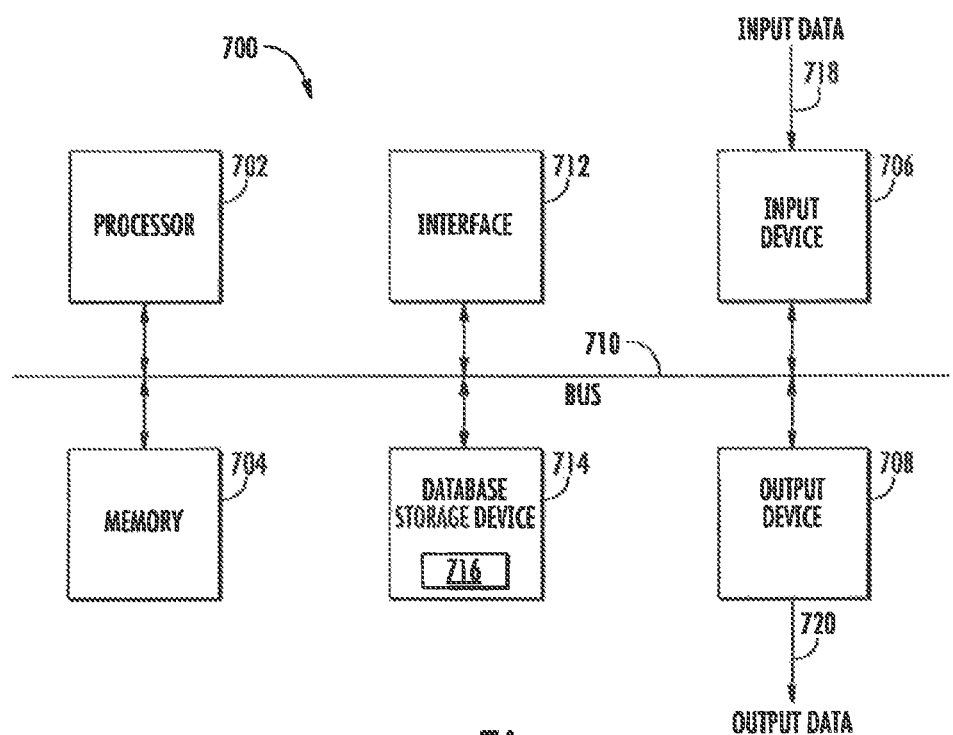
FIG. 7A illustrates a system overview and data-flow in one embodiment of system operation.

The intruder threat detection system 840, in particular the identify inputs module 842, the threat modeling module 846 and the threat visualization module 848 can be implemented with the exemplary computing system environment 700 of FIG. 7A.

Figure 8D:
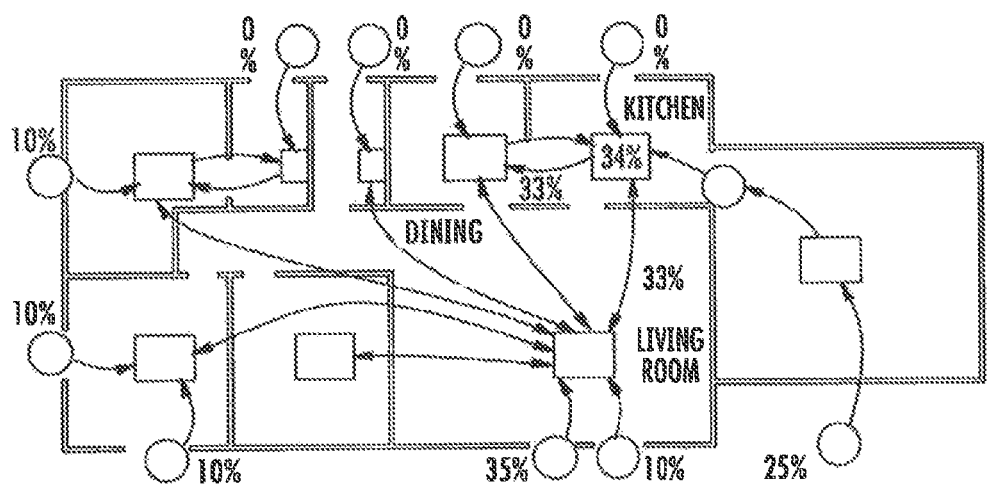
FIG. 8D illustrates an Intruder Movement Model which models likelihood of intruder movement between rooms of a building.
Figure 8E:
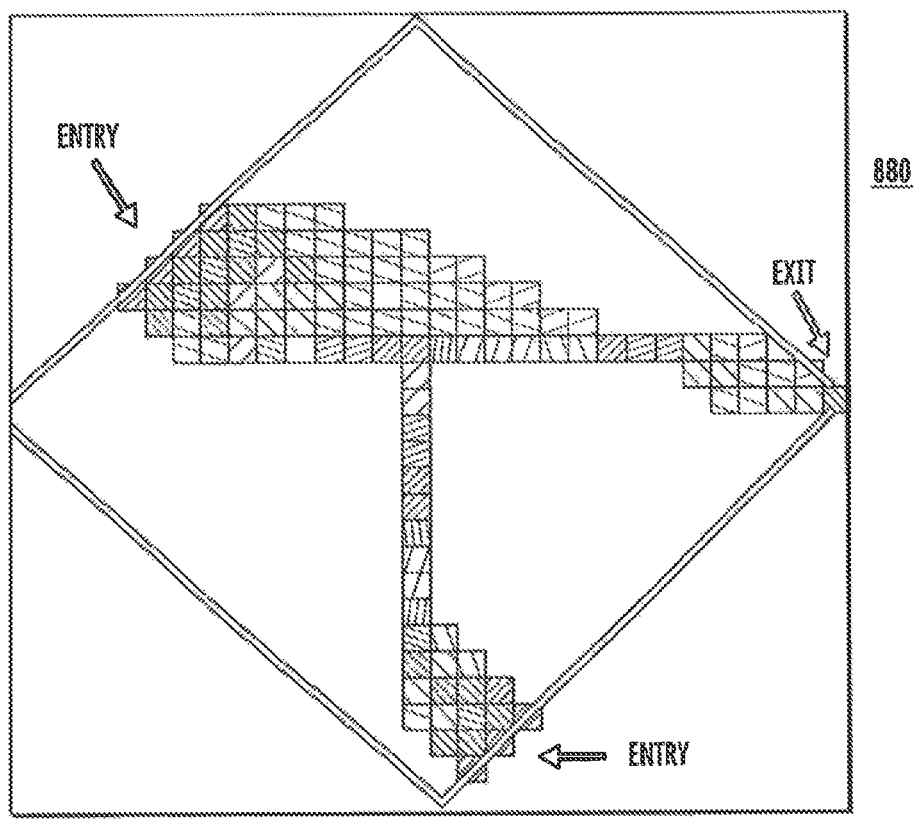
FIG. 8E illustrates a displayed GUI that shows a room-level threat model with visual indicators showing a probability distribution of intruder movement within a room.

Regarding FIG. 8D, an intruder movement model 872 is shown that models entry and exit points of a building (perimeter openings) and connectivity between the rooms. The rooms are modeled as nodes of network. The physical room connectivity identifies possible node transitions. An intruder is assumed to move from a given node to all the connected nodes with a certain likelihood. A pair of rooms is considered to be connected when an intruder is able to move between the pair of rooms without the need to enter a third room. The movement likelihood could be a function of the importance of connected rooms and the past history of rooms visited. Model 872 can also indicate connectivity between floors, e.g., via a staircase or elevator. Regarding FIG. 8E, a room-level threat visualization is shown as a room-level threat heat map 880. The threat modeling module 846 uses the probability distribution for intruder movement generated by the Room Threat Model Module 868 to generate a display of the calculated threat probability distribution as heat map 880. Heat map 880 uses a visual indicator, such as color coding, to show different probabilities of threats and their locations relative to the building floor map.

Figure 8F:
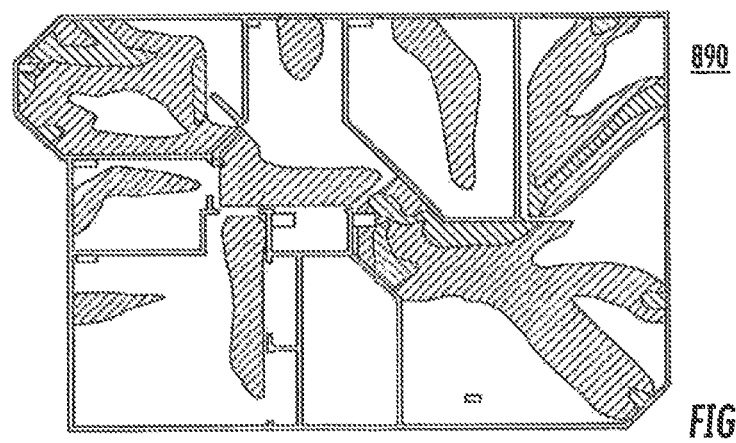
FIG. 8F illustrates a displayed GUI that shows a floor-level threat model with visual indicators showing relative threats of intruder movement for different rooms on a floor.

Regarding FIG. 8F, a floor-level threat visualization is shown as a floor-level threat heat map 890. In an embodiment, in order to generate a display of a threat probability at floor-level, the threat visualization module 848 adjusts the room-level threat heat map 880 for each room with a relative vulnerability level for that room in accordance with the relative vulnerabilities derived by the Building Threat Model 866 and their locations relative to the building floor map. FIG. 8F can also depict the visualization of aggregated room-level threat heat maps 880 arranged at the floor-level. In another embodiment, the floor-level threat heat map 890 can include a heat map that visually indicates for each room, e.g., using color codes, the room's relative vulnerability level.

In an embodiment, a building level threat visualization can be generated for display on a display device, in which floor-level threat heat maps 890 are stacked in accordance with the arrangement of floors in the building. The building level threat visualization can indicate relative threat levels for different floors of the building. In other embodiments, the relative vulnerability levels for all of the rooms and/or zones on a given floor are aggregated to obtain a relative vulnerability level for the floor. The building level threat visualization can visually indicate for each floor, e.g., using color codes, the floor's relative vulnerability level.

In embodiments, the building level threat visualization can indicate relative vulnerability along the perimeter. The visualization of relative vulnerability along the perimeter of the building can be overlaid on a satellite image of the building.

With returned reference to FIG. 8A, in certain embodiments, output from the threat modeling module 846 and the heat maps 880 and 890 can be used for the following threat model applications:

Safety and Security System Placement 850—Given a visual heat map depicting intrusion threat probabilities, such as room-level threat heat map 880 or floor-level threat heat map 890, a user can manually designate placement of safety and/or security devices to counteract the threats. In embodiments, the visual heat map can include a graphic depiction of a coverage region of a device, such as a camera, heat detector, or motion sensor. A user can determine a location to place the device in a room and/or zone of the building or exterior to the building such that the displayed coverage region of the sensor overlaps the threat mapped within the room, zone, or along the perimeter of the building. In embodiments, a computer program can automatically determine a location for placement of a device in the room, zone, or along the perimeter of the building, such that a calculated coverage region of the device overlaps the threat mapped;

Safety and Security Management Contracting 852—The visual heat maps 880 and 890 and/or determination of device placement can be used to manage safety and security provisions, such as to develop a solicitation proposal or a security management contract for a security provider to protect the building;

Security Procedure Determination 854—The visual heat maps 880 and 890 and/or determination of device placement can be used by safety and/or security consultants to determine appropriate security procedures for the building.

In accordance with the above, in certain embodiments of the disclosure, a safety or security threat to a building can be identified, modeled and/or visualized for display, providing useful information to a user regardless of the user's technical background or knowledge regarding security. For example, the user can specify a priority level (e.g., high, medium, low, or none) for protection of zones and/or rooms based on a value or importance associated with the zones and/or rooms. In another example, the threat level for a building can be estimated based on the building's geographic location and type. In still another example, the threat distribution within a building can be estimated and a visualization of the estimated threat distribution can be generated for display. In a further example, intruder movement both within a room and across the rooms can be estimated, and a visualization of the estimated intruder movement can be generated for display. Planning time and error for deployment of security devices to mitigate security threats to a building can be reduced by reducing skills needed for such planning. For example, a detailed probabilistic model for threat distribution within a building can be generated that can be used to automatically determine device placement for maximizing the detection of threat.

iv. Placement Based on Hierarchical Levels

Components are first places at room level and then at building level to determine the optimal placement and achieve the highest performance. Components of different types are placed in a given room to obtain the best detection performance within the room from a component or a combination of multiple components. The output of this room level placement is a table that describes cost, detection performance, false alarm performance achieved by a component or a combination of components for the room as show in FIG. 2J. In other embodiments, it can also provide the precise location and angular orientation of components within the room to achieve estimated performance. This placement can be performed in several different ways. In a preferred embodiment, an automated method for placing glass break detectors, motion sensors or video cameras in a room could be implemented to find the best location of the component within the room to either maximize the coverage or detection within the room. The false alarm rate for a given component position is also evaluated based on the presence of factors within the room that leads to false alarm for a given sensor type. For example, in case of a motion sensor, presence of south facing windows, roads, furnaces, light radiation and other heat sources within the coverage of the component would result in higher false alarm rate.

Next, building level placement determines the rooms and/or perimeter doors and/or windows where component should be placed to achieve desired system cost or performance for the entire property takes into account the following: (a) relative threat levels for each perimeter door, window or relative threat levels for rooms, (b) connectivity between rooms (c) the contents of the room (valuables) or the desired level of protection to develop the dynamic threat model. This dynamic threat model is then used along with the info about type of door/window to estimate the detection performance for a given combination of components placed in the building as shown in FIGS. 2K and 2L. The output of this process is the selection of components and their positions that provide the largest probability of detecting the intruder.

Figure 2M:
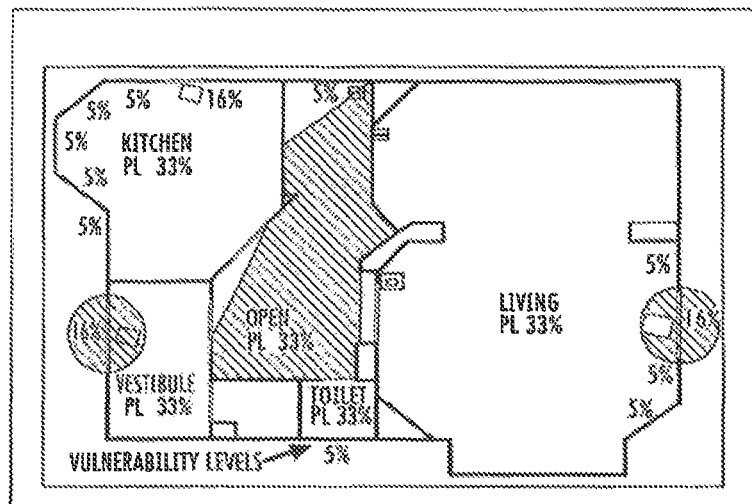
FIG. 2M is an exemplary diagram, showing component placement output.

This method has the capability to eliminate conflicts when multiple options for placing devices exist. Secondary metrics such as false alarm rate, detection latency, and user preferences are invoked to interactively make decisions. For example, in a given room with two windows, it may be preferred to place contact sensors on both the windows instead of a single motion sensor thereby providing lower detection latency. Further, if higher detection probabilities are desired, the room could also be instrumented with an additional motion sensor. FIG. 2M describes the typical component placement (3 D/W sensors and 1 PIR) as obtained from the tool for a given floor plan. The zone 'open' is chosen for the placement for the PIR as it is connected to most of the rooms. Therefore, placing a sensor there would maximize the probability of detecting intruders.

Figure 2N:
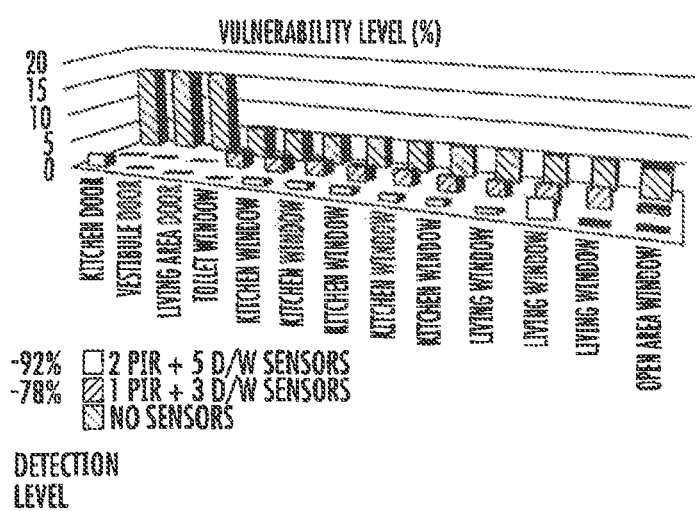
FIG. 2N is an exemplary chart, showing reduction in threat levels achieved by auto-placement of components.
Figure 20:
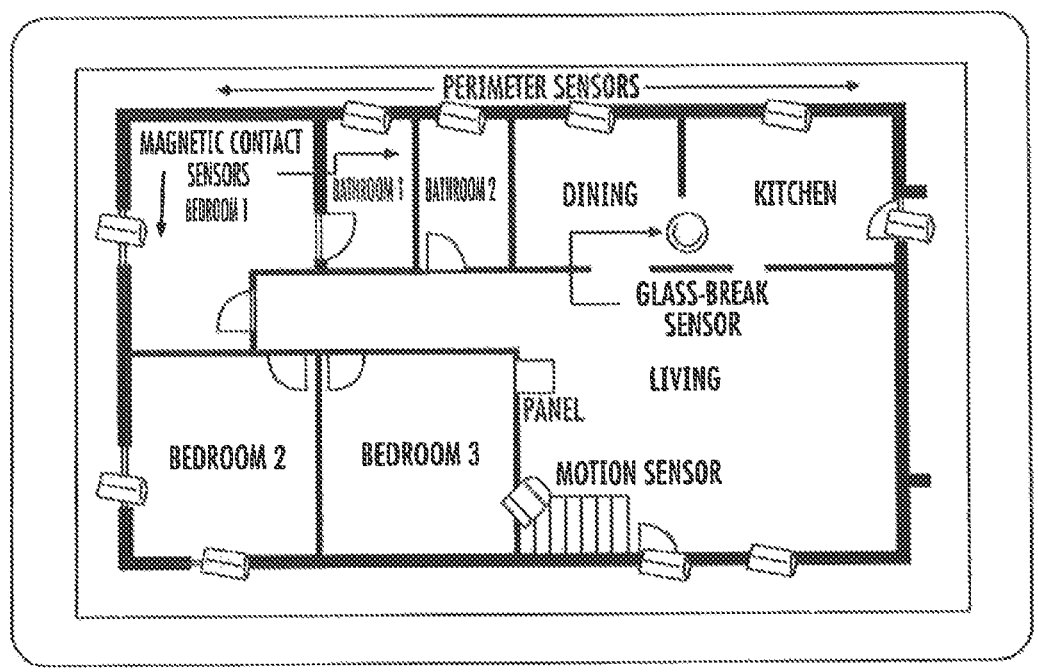

The optimal component placement is obtained based on a tradeoff between the bill of materials/cost and the detection performance. In addition the tool also provides the reduction of vulnerability at the entry points as a function of the type and number of sensors placed optimally. FIG. 2N illustrates one such result.

The tool has the capability to obtain the performance of a set of sensors place at given locations and known configurations. The performance metrics may include:

Probability of detection (armed away): The level of security offered with all the sensors armed;

Probability of detection (armed stay/night mode): The level of security offered with only perimeter door/windows sensors and glass-break/shock sensors armed;

Detection latency: the distribution (and mean) of time taken to detect an intrusion;

False alarm rate: likelihood of generation of a false alarm based on the type, configurations and the number of sensors. The false alarm rate is modified based on the geometry of the room, presence of windows, roads, furnaces, light radiation and other sources of nuisance; and Coverage: Coverage of the volumetric space in the house. It is defined as shown in equations (12), (13), (14):

$$Coverage_{perimeter} = \frac{\text{No. of doors and windows covered by d/w or glass break (or shock) sensor}}{\text{Total number of perimeter doors and windows}} \quad (12)$$

$$Coverage_{interior} = \frac{\text{total area visible to one } PIR \times det. \text{ prob of } PIR + \text{total area visible to two or more } PIR}{\text{Total area of floor plan}} \quad (13)$$

$$Coverage_{total} = \quad (14)$$
$$Coverage_{perimeter} + (1 - Coverage_{perimeter}) \times Coverage_{interioir}$$

After manually and/or automatically placing the component in an optimal location and orientation, as described above, a completed floor plan, as shown in FIG. 2O, is displayed for the final approval by the user. The system 100 allows a user to re-locate, add, or remove components via the user interface, while ensuring that the user is not able to add incompatible sensors.

E. Assessing Connectivity

Once the user is satisfied with the selection and location of the components on the floor plan, the system assesses the connectivity of sensors to the panel. For wired sensors, the system calculates the distance from all the wired components to the panel to estimate the amount and type of wiring necessary to support panel-to-components communications and powering requirements. This also allows the system to estimate the cost of wiring for later steps. For wireless components, the system estimates the connectivity from all the wireless devices to the panel by using an empirical range estimation formula based on the type of building. The system highlights the devices that do not have sufficient connectivity and then suggests the user to either add wireless repeaters or move the devices.

Figure 4A:
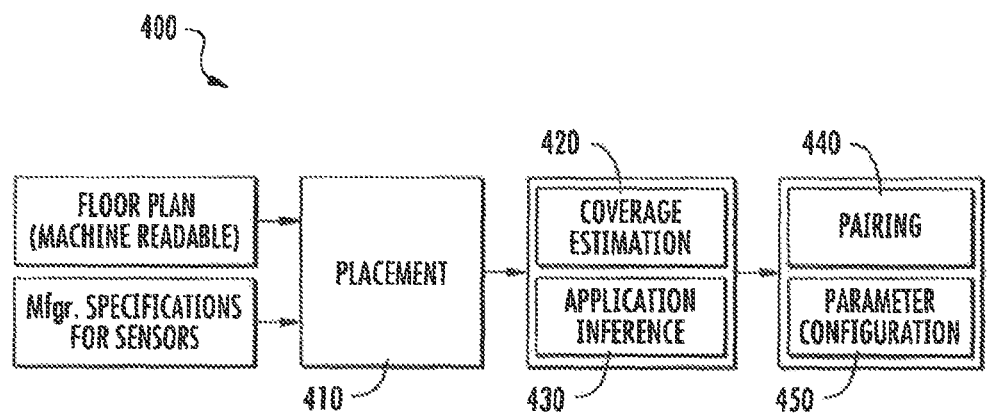
FIG. 4A is a block diagram of an exemplary embodiment of a system constructed in accordance with the present disclosure, showing the system modules.

The system 400 for automatically obtaining the parameter values and component pairings for sensors components in a building is shown in FIG. 4A. The system 400 consists of the following key modules: component placement 410; coverage estimation 420; application inference 430; component pairing 440; and parameter configuration 450.

i. Component Placement

Figure 4B:
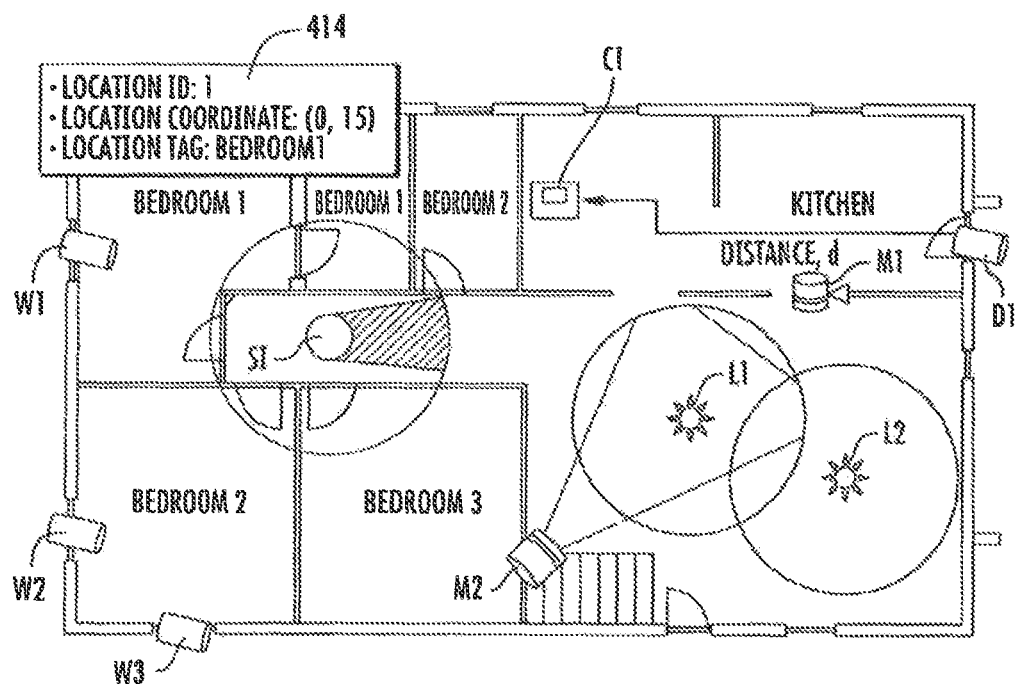
FIG. 4B is a schematic view of a floor plan, showing component location and coverage regions.

The component placement module 410 provides a mobile device based user interface to facilitate placement of components on a floor plan. Components can include sensors such as motion detection sensors, door/window contact sensor, light detection sensors, glass break sensors, image sensors, video or infra-red cameras, heat, flame, smoke or carbon-monoxide detectors, sound detectors, shock detectors, vibration sensor, accelerometers, water or moisture detectors, humidity sensors, magnetic contacts, temperature sensors, photo-detectors, actuators (e.g. key fob, garage door opener, sounders, panic buttons, thermostats, lighting and appliance control modules, light switches, actuators, control panels and the like. The placement of the components can be generated by an automatic tool that is part of the system or accessible from the mobile device. It is also contemplated, the placement of sensors can be done manually by a user. The user can include a customer and/or a sales representative. The module 410 renders a machine readable floor plan on a visual display of the mobile device and allows the user to place a specific component from a library of available components at a particular location on the floor plan. For example, the user may drag the component from the component library and drop the component icon as desired on the floor plan. As shown in FIG. 4B, is an example floor plan 412 with components W1, W2, W3, M1, M2, D1, S1 placed throughout. The module 410 also associates a descriptive location tag, location ID, and location coordinates 414 with the components within the floor plan.

ii. Coverage Estimation

Once the components have been placed at different locations on the floor plan, the coverage estimation module 420 estimates the coverage region of any given component based on its sensing modality and sensing range. Estimating coverage region can be done in several different ways depending on the type of component. For example, for door/window contact sensors the coverage region is estimated by a circle around the protected door or window, as shown in FIG. 4B.

For motion sensors M1, M2 and cameras the coverage region is estimated by: i) calculating a visibility polygon, which is a set of all points visible from the mounting location; ii) calculating a field of view range polygon for a given mounting location and orientation, this can obtained from manufacturer's specification; and iii) obtaining the coverage region by taking the intersection of visibility polygon and field of view range polygon. For example, FIG. 4B depicts the coverage region for a motion sensor.

For glass-break sensors and smoke sensors S1 the coverage is estimated by calculating a range polygon, for a given mounting location and orientation, based on the coverage pattern/range specified in the manufacturer's specification as shown in FIG. 4B.

For lighting fixtures and luminaries L1, L2, the coverage, as shown in FIG. 4B, is estimated by: i) calculating a visibility polygon, which is a set of all points visible from the mounting location; ii) calculating the range polygon for which illuminance is above a certain threshold (for e.g. 50 lux or 10% of the max lux) in a typical indoor environment, which can be obtained from manufacturer's photometric specifications; and iii) obtaining the coverage region by taking the intersection of visibility polygon and range polygon.

iii. Application Inference

The application inference module analyzes the sensor type and location or coverage of a given sensor on the floor plan to classify the sensor in the following categories: i) exterior protection: sensors with 100% of the coverage region outside of the building perimeter; ii) interior protection: sensors with 100% of the coverage region inside of the building perimeter; iii) perimeter protection: door/window contact sensors mounted on perimeter doors or windows, for example W1, W2, W3, D1 shown in FIG. 4B, and glass-break sensors with perimeter wall, doors, or windows in their coverage region; and iv) entry protection: perimeter sensors mounted on doors, for example, D1, including exterior and interior sensors with perimeter doors within their coverage region.

iv. Component Pairing

The component pairing module 440 analyzes the relationship between the coverage regions of the components on the floor plan to automatically pair components with each other based on component type such that an event triggering one of the paired components would either actuate the other component to perform certain action, or correlate with the event generated by the other components.

In order to pair a given component with other components on the floor plan, the module 440 calculates the overlap between the coverage regions of the given component with other components on the floor plan.

The module 440 can pair the components under following conditions:

Overlap exists between coverage regions. The module 440 pairs the components if the overlap (i.e. intersection) exceeds a pre-defined threshold, for example, 25% of the coverage region for one of the components, for example, L1 and L2 or L1 and M2; and No overlap between coverage regions. The module 440 pairs the components if the distance between the two coverage regions is less than a pre-defined threshold and there exists a high likelihood of an intruder or occupant path between the two coverage regions, for example, M1 and M2. The Markovian decision process, or the like, can be used to estimate probability distribution for intruder movement in an area, which allows generating most likely intruder paths or tracks within a building. In embodiments, other simulation techniques can be used to obtain the probability distribution for intruder or occupant movements.

Common pairing scenarios based on coverage region, can include:

Camera Pairing—The module 440 pairs a camera with door/window contacts, motion sensors, glass-break sensors, and smoke sensors such that an event detected by any of these paired components would cause the camera to record a video clip of a pre-defined duration with both pre-trigger and post-trigger capture of the scene. In order to pair the camera with the above mentioned components, the module 440 calculates the overlap between the coverage region of the camera and other sensors on the floor plan. If the overlap (i.e. intersection) with the coverage region of a given sensor exceeds a pre-defined threshold, the module 440 pairs the sensor with the camera, otherwise the existence of a high likelihood path as explained above may be used for deciding on the pairing. If the camera has a pan-tilt feature, the module 440 can analyze the coverage overlaps for all lens orientations;

Light Fixture Pairing—The module 440 pairs the light fixture with door/window contacts, motion sensors, glass-break sensors, such that an event detected by one of these paired components would cause the light fixture to turn-on or turn off. In order to pair the light fixture with the above mentioned components, the module 440 uses the method described above for the camera pairing. For solving cases where more than one possible trigger or actuator may exist, distance between components, derived from the floor plan description, may be used to resolve conflicts, i.e. closest suitable sensor paired to closest suitable light fixture;

Motion Sensor Pairing—The module 440 pairs the motion sensor with door/window contacts, motion sensors, glass-break sensors, such that an event detected by any of these paired components would be correlated with the event from the motion sensor to either generate an alarm or ignore the event. For example, if a smoke sensor trigger event is either followed or preceded by an event from the paired motion sensor, the system can provide a local annunciation instead of generating an alarm for alarm monitoring center. In order to pair the motion sensor with the above mentioned components, the module 440 uses the method described above for the camera pairing.

The module 440 can also identify the best pairing component if the coverage region of a given component overlaps with more than one other compatible component. As shown in FIG. 4B, in case of pairing between motion sensors M1, M2 and light fixtures L1, L2, the module 440 pairs a given light fixture with only one motion sensor for with which its coverage region has the highest overlap, for example M1 and L2.

In an alternate embodiment, components can be grouped and paired regardless of coverage and based on location within the floor plan. In this embodiment, the module 440 automatically groups components of the same type in the same room, components of the same type in the same floor and components of the same type in the building so that grouping information of the main control device, e.g. control panel C1, can be automatically populated. This allows a control panel to collectively control and respond to the devices within a group. The sensors can be grouped in several different ways, including but not limited to, all exterior sensors and actuators, all interior sensors and actuators, all sensors belonging to a given room, all sensors belonging to a given floor, all sensors of a given type belonging to a room, all actuators of a given type belonging to a room, all exterior actuators of a given type. In this embodiment, binding and pairing of the components is established based on their type, location ID or tag, and location separation.

Binding the components can be based on the following:

A given actuator is bound with only compatible sensors, as in the two examples below:

Light Fixture—Compatible with events generated from wall switches, motion sensors, light sensors, door/window contact, and the like;

Video or image Camera—Compatible with events generated from motion sensors, door/window contacts, smoke sensors, and the like;

A given actuator is bound to compatible sensors with the same location tag or ID;

When multiple types of compatible sensors have the same location ID while only single actuator is present with the same location ID, all of compatible sensors are bound to the single actuator by default if the pairing is centralized (i.e. the panel acts as intermediary). In that case, when groups of sensors may control a single device, any of them may be able to turn it on but all of them need to agree to turn the device off. If the pairing is peer-to-peer, then only one device may be able to actuate on another;

When multiple compatible sensor-actuator pairs have same location ID, a given actuator is paired with the closest compatible sensor.

Sensors and actuators can be paired automatically using the above guidelines. For instance, where a single sensor (e.g. wall switch) and actuator (e.g. lamp switch) exist in a room, one is bound to the other. If different switches and sensors are available, they are bound based on their characteristics or types. If several sensors and switches of the same type exist in the same room, they are separated in groups proportional to the number of them and bound to each other based on the distance that separates them, etc.

Regardless of whether binding/pairing is based on coverage region or by location tags, the module 440 automatically create scenes based type of the devices. For example, all lights located in the exterior are turned on at 6 p.m. Another example, a motion sensor is triggered in the living room can turn on all light fixtures in the living room and initiate video recording with the camera in the living room or a motion sensor located in the exterior is triggered to turn on all paired light fixtures.

Once the preferred grouping, binding and scenes are determined they are displayed to the user to accept or edit as desired.

v. Parameter Configuration Module

The component parameter configuration (PC) module 450 analyzes the component type and coverage region on the floor plan to automatically configure the components based on predefined characteristics. For entry delay, the module determines the time an authorized user has to disarm the system after triggering an entry component, without raising an alarm. For each component classified as perimeter protection but not as entry protection, the entry delay can be set to 0. For each of the sensors classified as entry protection in the system, the PC module 450 can first determines the distance between the said entry component and the system disarming unit, typically co-located within the system control panel, on the floor plan. The PC module 450 then calculates the entry delay as a function of the "distance to disarming unit" (d) and "the mode of entry", which is indicated by the location tag associated with the entry component. For example, a door/window sensor mounted in a garage would indicate the mode of entry as car and walking. So a sensor would have higher entry delay as it needs to provide users with sufficient time to drive-in, lock the car, and then walk to the disarming unit.

For exit delay, the module determines the time an authorized user has to exit the premises, without raising an alarm, after arming the system. For each sensor classified as perimeter protection but not as entry protection, the exit delay can be set to 0. For each of the sensor classified as "entry protection" in the system, the PC module 450 first determines the distance between the said entry/exit component and the system arming unit, typically co-located within the system control panel, on the floor plan. The PC module 450 then calculates the exit delay as a function of the "distance to exit component" and "the mode of exit", which is indicated by the location tag associated with the exit component. For example, a door/window sensor mounted in the garage would indicate the mode of entry as walking and car. So a sensor would have higher exit delay as it needs to provide users with sufficient time to walk to the car, unlock the car, and drive out.

The PC module 450 also determines the appropriate sensing sensitivity for components based on the analysis of their coverage region on the floor plan for motion sensors and heat sensors. For motion sensors the PC module 450 can adjust the sensitivity to match coverage region with visible region. More specifically, the PC module adjusts the sensitivity of the components to match the field of view range polygon size with the visibility polygon size from the given mounting location. This reduces the sensitivity if the visibility polygon is less than field of view range polygon and increases the sensitivity if vice versa. The PC module 450 reduces the sensitivity of motion sensors if there are heating sources, e.g. HVAC vent or cooking range, present within sensor's coverage region. For smoke sensors the PC module 450 can adjust the sensitivity of smoke sensors if there are any heating sources. e.g., cooking range, hot shower, etc. present within the coverage region of the sensor, for example S1.

In addition to the above described method for sensitivity adjustment, in an alternative embodiment, the PC module 450 adjusts the sensitivity based on the location tag associated with the sensor. Instead of analyzing the coverage region for presence of heating sources, the module simply uses the descriptive location tags for each of the distinct zones in the building to infer the objects that may fall within the coverage region of a sensor mounted in the zones. For example, a kitchen or synonymous location tag indicates the presence of a cooking range, microwave, refrigerator, mixer/grinder, dishwasher, etc. within the zone. A bathroom or synonymous location tag indicates the presence of hot shower, etc. within the zone. A furnace room or synonymous location tag indicates the presence of the furnace and other heating equipment within the zone.

Those skilled in the art will recognize that all of the above described methods occur prior to a real system being installed. In other words, the placement of components, estimating coverage region and associating the components is done virtually. Only when the system is installed and the actual sensors are associated to the virtual sensors all the configuration details are moved from a virtual setting to the real building.

vi. Determine Performance

After the components are placed virtually using the IAC tool 102, a generalized computerized embodiment in which the illustrated embodiments can be realized is depicted in FIG. 7A illustrating a processing system 700 which generally comprises at least one processor 702, or processing unit or plurality of processors, memory 704, at least one input device 706 and at least one output device 708, coupled together via a bus or group of buses 710. In certain embodiments, input device 706 and output device 708 could be the same device. An interface 712 can also be provided for coupling the processing system 700 to one or more peripheral devices, for example interface 712 could be a PCI card or PC card. At least one storage device 714 which houses at least one database 716 can also be provided. The memory 704 can be any form of memory device, for example, volatile or non-volatile memory, solid state storage devices, magnetic devices, etc.

The processor 702 could comprise more than one distinct processing device, for example to handle different functions within the processing system 700. Input device 706 receives input data 718 and can comprise, for example, a keyboard, a pointer device such as a pen-like device or a mouse, audio receiving device for voice controlled activation such as a microphone, data receiver device or antenna, such as a modem or wireless data adaptor, data acquisition card, etc. Input data 718 could come from different sources, for example keyboard instructions in conjunction with data received via a network. References to "accessing" data by the processor 702, include generating the data, receiving the data via a transmission to the processor 702 or via input from input device 706, or retrieving the data by the processor 702, e.g., from memory 104 or an external memory device or by requesting the data from a software module or another processing device. Output device 708 produces or generates output data 720 and can comprise, for example, a display device or monitor in which case output data 720 is visual, a printer in which case output data 720 is printed, a port for example a USB port, a peripheral component adaptor, a data transmitter or antenna such as a modem or wireless network adaptor, etc. Output data 720 could be distinct and derived from different output devices, for example a visual display on a monitor in conjunction with data transmitted to a network. A user could view data output, or an interpretation of the data output, on, for example, a monitor or using a printer. The storage device 714 can be any form of data or information storage means, for example, volatile or non-volatile memory, solid state storage devices, magnetic devices, etc.

In use, the processing system 700 is adapted to allow data or information to be stored in and/or retrieved from, via wired or wireless communication means, at least one database 716. The interface 712 may allow wired and/or wireless communication between the processing unit 702 and peripheral components that may serve a specialized purpose. Preferably, the processor 702 receives instructions as input data 718 via input device 706 and can display processed results or other output to a user by utilizing output device 708. More than one input device 706 and/or output device 708 can be provided. It should be appreciated that the processing system 700 may be any form of terminal, server, specialized hardware, or the like.

It is to be appreciated that the processing system 700 may be a part of a networked communications system. Processing system 700 could connect to a network, for example the Internet or a WAN. Input data 718 and output data 720 could be communicated to other devices via the network. The transfer of information and/or data over the network can be achieved using wired communications means or wireless communications means. A server can facilitate the transfer of data between the network and one or more databases. A server and one or more databases provide an example of an information source.

Thus, the processing computing system environment 700 illustrated in FIG. 7A may operate in a networked environment using logical connections to one or more remote computers. The remote computer may be a personal computer, a tablet device, smart phone device, a server, a router, a network PC, a peer device, or other common network node, and typically includes many or all of the elements described above.

It is to be further appreciated that the logical connections depicted in FIG. 7A include a local area network (LAN) and a wide area network (WAN), but may also include other networks such as a personal area network (PAN). Such networking environments are commonplace in offices, enterprise-wide computer networks, intranets, and the Internet. For instance, when used in a LAN networking environment, the computing system environment 700 is connected to the LAN through a network interface or adapter. When used in a WAN networking environment, the computing system environment typically includes a modem or other means for establishing communications over the WAN, such as the Internet. The modem, which may be internal or external, may be connected to a system bus via a user input interface, or via another appropriate mechanism. In a networked environment, program modules depicted relative to the computing system environment 700, or portions thereof, may be stored in a remote memory storage device. It is to be appreciated that the illustrated network connections of FIG. 7A are exemplary and other means of establishing a communications link between multiple computers may be used.

FIG. 7A is intended to provide a brief, general description of an illustrative and/or suitable exemplary environment in which embodiments of the below described present disclosure may be implemented. FIG. 7A is an example of a suitable environment and is not intended to suggest any limitation as to the structure, scope of use, or functionality of an embodiment of the present disclosure. A particular environment should not be interpreted as having any dependency or requirement relating to any one or combination of components illustrated in an exemplary operating environment. For example, in certain instances, one or more elements of an environment may be deemed not necessary and omitted. In other instances, one or more other elements may be deemed necessary and added.

In the description that follows, certain embodiments may be described with reference to acts and symbolic representations of operations that are performed by one or more computing devices, such as the computing system environment 700 of FIG. 7A. As such, it will be understood that such acts and operations, which are at times referred to as being computer-executed, include the manipulation by the processor of the computer of electrical signals representing data in a structured form. This manipulation transforms the data or maintains them at locations in the memory system of the computer, which reconfigures or otherwise alters the operation of the computer in a manner understood by those skilled in the art. The data structures in which data is maintained are physical locations of the memory that have particular properties defined by the format of the data. However, while an embodiment is being described in the foregoing context, it is not meant to be limiting as those of skill in the art will appreciate that the acts and operations described hereinafter may also be implemented in hardware.

It is to be further appreciated, embodiments may be implemented with numerous other general-purpose or special-purpose computing devices and computing system environments or configurations. Examples of well-known computing systems, environments, and configurations that may be suitable for use with an embodiment include, but are not limited to, personal computers, handheld or laptop devices, personal digital assistants, tablet devices, smart phone devices, multiprocessor systems, microprocessor-based systems, set top boxes, programmable consumer electronics, network, minicomputers, server computers, game server computers, web server computers, mainframe computers, and distributed computing environments that include any of the above systems or devices. Embodiments may be described in a general context of computer-executable instructions, such as program modules, being executed by a computer. Generally, program modules include routines, programs, objects, components, data structures, etc., that perform particular tasks or implement particular abstract data types. An embodiment may also be practiced in a distributed computing environment where tasks are performed by remote processing devices that are linked through a communications network. In a distributed computing environment, program modules may be located in both local and remote computer storage media including memory storage devices.

Figure 7B:
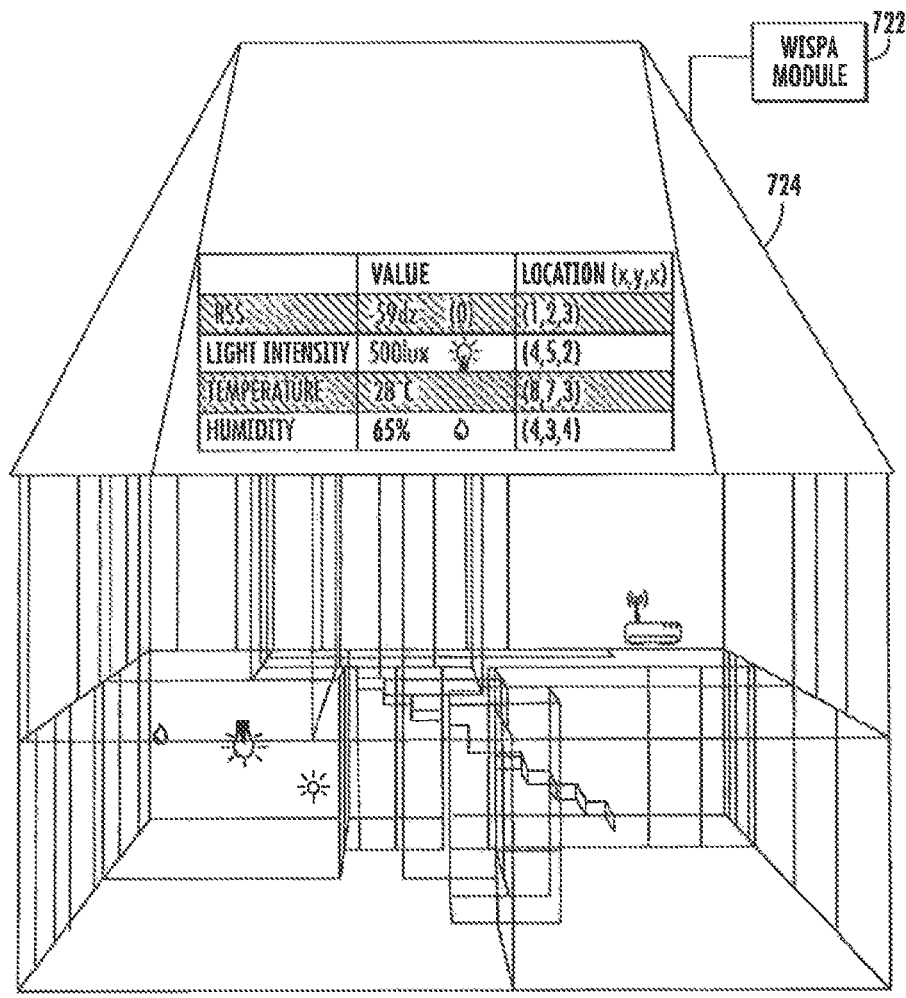
FIG. 7B illustrates a building information model generated by the wireless planning and performance analysis system (WiSPA) module.

FIG. 7B is a schematic diagram illustrating a multidimensional building information model 722 generated and/or calibrated by a wireless (e.g., radio frequency (RF)) planning and performance analysis system (WiSPA) 724 that is implemented with the exemplary computing system environment 700 of FIG. 7A generally shown and discussed above. The building information model 724 is a site-specific model for a particular building. The building information model 724 can further be used to predict performance (e.g., communication range) of wireless RF devices, based on locations of the wireless devices within the building. The devices can include sensors, e.g., motion detectors, heat detectors, door/window contact sensors, heat, flame, smoke or carbon-monoxide detectors, image sensors, video or infra-red cameras, sound detectors, shock detectors, moisture detectors, humidity sensors, magnetic contacts, temperature sensors, photo-detectors, actuators e.g., key fob, sounders, panic buttons, temperature thermostats, lighting and appliance control modules having a wireless communication capability or communication devices without sensing or actuation interfaces such as system panels, repeaters and mobile displays.

Figure 7C:
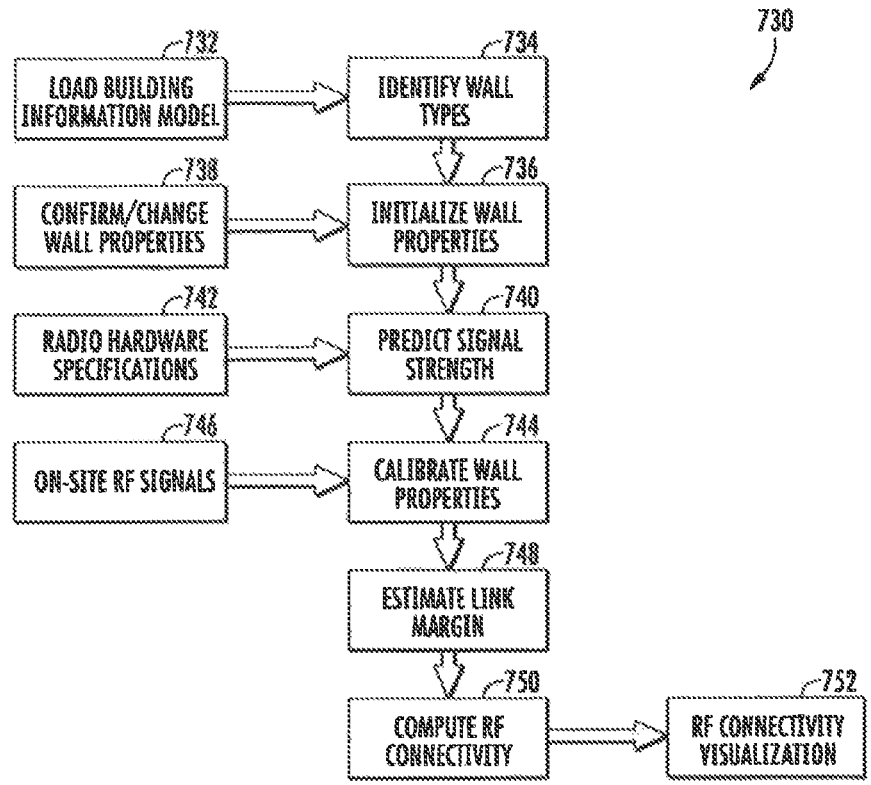
FIG. 7C illustrates a flow diagram of a method used by the WiSPA module.

FIG. 7C illustrates a flow diagram of a method used by the WiSPA module 722 to analyze multidimensional building information models and predict performance of wireless RF systems inside the building. Operation 732 of the method includes accessing the building information model 724. At operation 734 the building information model 724 is used to identify wall types. Operation 734 includes analyzing, by the WiSPA module 722, the geometric representation of the building to identify different walls and ceilings within the building. Each wall is classified as an interior, partition, or perimeter wall. The walls are further associated with specific room types, e.g., bathroom, bedroom, kitchen, etc. Identifying wall types can include modelling large objects as collections of walls. Such large objects can include, for example, staircases and ceiling high structures.

Operation 736 includes using the following information from the building information model 724 to determine (e.g., initialize or update, such as after a construction project) values for construction material properties, such as wall material type and wall thickness:

Wall type—Materials used for walls having the same wall type (e.g., perimeter) are often the same, whereas materials for walls belonging to different types (e.g., partition versus perimeter) usually vary. Therefore, knowing the wall type is used to reduce the number of wall and material type combinations within the building;

Geographic location of building—Different regions in the world use different construction styles and materials. However, within a given locality, the types of construction materials used are usually a small subset of materials that are used globally. Obtaining the geographical location thus helps reduce the set of possible material options for a given building;

Building Type—Building addresses can be searched in third party databases to determine whether a building is a commercial or residential space. Building type information can indicate construction materials and styles based on whether a building is a residential or commercial building. Building type information helps to select a more accurate material type for each wall in the building during the initialization of the WiSPA module;

Year of construction—Types of construction materials used in buildings have evolved over time. An initial material type can be identified based on the year of construction or of a major remodeling operation.

At operation 738, the wall properties are accessed and/or confirmed. The WiSPA module 722 provides a user interface via which a user can confirm or change wall properties, e.g., to confirm or change the automatically determined construction material properties, such as wall material and thickness values. The WiSPA module's user interface allows a user to either modify properties for each wall segment individually, or to modify the properties simultaneously for a group of walls. The grouping can be based, for example, on user selection of wall types, e.g., perimeter walls, floors, partitions, etc.

At operation 740 the performance of RF devices and RF signal strength is predicted in a building. This can include obtaining transmitter and receiver characteristics for RF devices. Hardware specification characteristics for the RF devices are accessed (e.g., input) at operation 742. The radio hardware specifications can be used to make the predictions regarding the performance of the RF devices in the building performed at operation 740. The hardware specification characteristics include, for example:

Transmitter Characteristics:
    Transmit output power
    Transmitter Frequency
    Antenna Pattern
    Internal circuitry losses Receiver Characteristics:
    Receiver Sensitivity
    Receiver Frequency
    Antenna Pattern
    Internal circuitry losses Analysis of the transmitter and receiver characteristics can include analyzing the transmitted signal paths and mounting directionality, and determining antenna directionality and gains directional based on the antenna pattern and device mounting.

The hardware specification characteristics can be accessed by the WiSPA module 722 at operation 742, such as by querying an external specifications database for a given RF device part number. Alternatively, the hardware specification characteristics can be entered manually or read and transmitted directly from an optical code, e.g., a QR code, or an RF interface attached to the device.

Operation 740 can further include predicting received signal strength, which can include accessing estimates of RF signals received at various locations from a given RF transmitter device positioned at a given location within the building. For example, the transmitter device can be provided with a panel for the RF system. The panel can be positioned, for example, in a location, such as near a door, that is conveniently accessed by a user during ingress and egress of the building. In embodiments, the panel can be located at a control area for the building or for a set of buildings, such as a control room. The WiSPA module 722 can apply an RF propagation model to obtain the estimates of RF signals received at the various locations from the given RF transmitter device positioned at the given location within the building. (See Schaubach et al. "A ray tracing method for predicting path loss and delay spread in microcellular environments" Proceedings of the IEEE Vehicular Technology Conference 1992, and COST Action 231, Digital mobile radio towards future generation systems, final report, European Commission, Brussels, 1999, both of which are incorporated herein by reference in their entirety.) Listed below are inputs that can be accessed by the RF propagation model:

2D, 2.5D or 3D Geometric representation of the building;
Material type and thickness for walls and floors of the building;
RF transmitter and receiver hardware characteristics;

RF transmitter device location, provided by a user or another design module (e.g., a localization and measurement (LAM) module that performs localized measurements from various sensors on the mobile device); and;

RF receiver device locations, provided by a user, another design module (e.g., LAM module) or an assumed uniform distribution of receiver device locations across the building.

The RF propagation model uses these inputs to determine path loss ($PL_{dB}$) for RF signals from a transmitter device to various receiver device locations. The path loss values are used to calculate received signal strength ($RSS_{dB}$) at each receiver device location in accordance with equation (15):

$$RSS_{dB} = Gt_{dB} - Lt_{dB} + Pt_{dB} - PL_{dB} + Gr_{dB} - Lr_{dB}, \text{ where} \quad (15)$$

($Gt_{dB}$, $Gr_{dB}$) characterize the transmitter and receiver gains, wherein antenna gains depend on vertical and horizontal patterns defined for the antenna if using the ray tracing model, and ($Lt_{dB}$, $Lr_{dB}$) represent internal circuitry losses.

At operation 744, wall properties are calibrated. In order to improve the prediction accuracy at step 740 of the received signal strength estimates provided by the building information model 724, the WiSPA module 722 obtains on-site signals at operation 746, such as localized RF signal measurements captured by the LAM module from the transmitter device location(s) (e.g., a Wi-Fi router). The WiSPA 722 can calculate prediction errors, which can include comparing the RF signal measurements obtained at various locations with signal strength values estimated for the same locations.

Figure 7D:
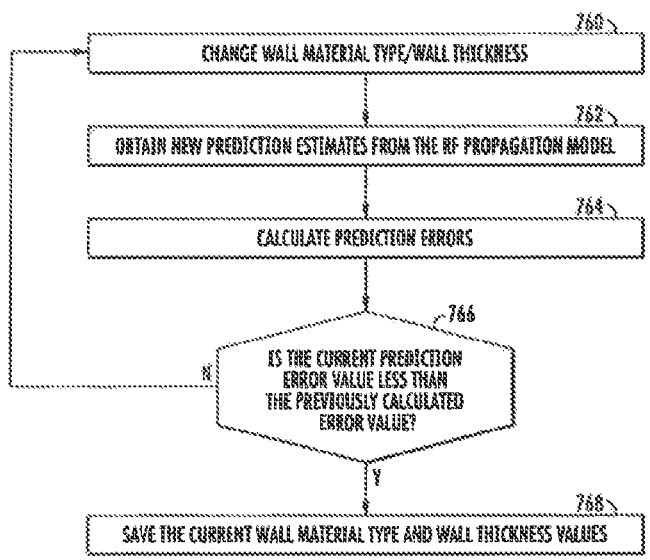
FIG. 7D illustrates a flowchart of a method to perform minimization of prediction errors when determining wall material type and thickness.

With reference now to FIG. 7D, a flowchart is shown illustrating various exemplary embodiments that can be implemented at operation 744 to minimize prediction errors when determining wall material type and thickness. It is noted that the order of steps shown in FIG. 7D is not required, so in principle, the various steps may be performed out of the illustrated order. Also certain steps may be skipped, different steps may be added or substituted, or selected steps or groups of steps may be performed in a separate application following the embodiments described herein.

At operation 760, wall material type and/or wall thickness can be input and changed, such as by a user operating the user interface provided by the WiSPA module 722. At operation 762, new prediction estimates are obtained using the RF propagation model. At operation 764, prediction errors are calculated. At operation 766, a determination is made whether the current prediction error value is less than the previously calculated error value that was calculated at operation 764. If the determination at operation 766 is YES, then at operation 768, the current wall material type and wall thickness values are saved. If the determination at operation 764 is NO, the method returns to operation 760.

The WiSPA module 722 uses the construction specific building information obtained in operation 736 to minimize the search space for wall material type/thickness calibration. Accordingly, calibration performed at operation 744 can include using an optimization approach that compares measurements with prediction results from multiple simulation runs, until simulated model parameters are optimized to have highly correlated results with the measurement data. A frequently used RF characteristic used for optimization can be the average total power. Other RF characteristics, such as channel impulse response peak power or delay spread can be used to improve accuracy.

Once the wall material properties have been calibrated to minimize the RF received signal strength prediction error, the prediction error for each room can be calculated to estimate a prediction confidence level. Accordingly, a prediction confidence level can be increased by calibrating an RF wall property. The predicted signal strength for each room can be calculated in accordance with operation 744 and compared to an actual measurement. A higher prediction error for a room results in a lower prediction confidence level for that room. In other embodiments, prediction confidence levels can be grouped into more granular levels than rooms.

At operation 748, the WiSPA module 722 uses the prediction confidence level determined for each room to calculate a recommended link margin value for wireless devices deployed in the room. The recommended link margin value for an RF receiver in a particular room can be determined by analysis of the recommended link margin for the room and mounting location of the wireless device within the room. When a sufficient number of sampled measurements are available, a variance over time from the collected sample measurements can be employed to fit a probabilistic distribution that can be used to improve the accuracy of the confidence value. A look-up table can be employed to recommend a link margin value. A higher link margin value can be recommended for devices in a room having lower prediction confidence levels than would be recommended for devices having higher prediction levels.

At operation 748, an RF connectivity level is calculated and a visualization, e.g., a graphical depiction, a graphical depiction, for display via a graphical user interface (GUI) is generated. The WiSPA module 722 calculates multi-hop connectivity $c_{-(i,k,j)}(x,y,z)$ from a transmitter device i to a receiver device j located at a position having coordinates (x,y,z) using a radio repeater k by employing equation set (16):

$$c_{i,k,j}(x, y, z) = \begin{cases} 1, & \text{if } (c_{ik} \cdot c_{kj}) = 1 \\ 0, & \text{otherwise} \end{cases} \quad (16)$$

$$\text{where } c_{ik} = \begin{cases} 1, & RSS_k \geq S_k + LM_{ik} \\ 0, & \text{otherwise} \end{cases} \text{ and}$$

$$c_{kj} = \begin{cases} 1, & RSS_j \geq S_j + LM_{kj} \\ 0, & \text{otherwise} \end{cases}$$

where $RSS_k$ is the predicted received signal strength for receiver device k as described in reference to operation 740, $S_k$ is the receiver sensitivity for receiver device k as defined in an RF hardware datasheet, and $LM_{ik}$ is a recommended margin value for the link i,k, RF connectivity levels can be determined through analysis of predicted strength of RF signals and link margins and RF receiver properties for RF receivers provided at different respective areas of the floor plan, wherein the RF connectivity level indicates the likelihood of successful packet reception at a particular RF receiver on the floor plan from the RF transmitter device positioned at the certain location on the floor plan.

A connectivity level can be determined by retrieving a packet error rate threshold, e.g., from a computer database, for the RF transmitter device and RF receiver devices located at different locations on the floor plan. The packet error rate thresholds can be adjusted using information relating to a determined type of the building and a mounting location at which the RF transmitter and receiver devices are positioned.

Figure 7E:
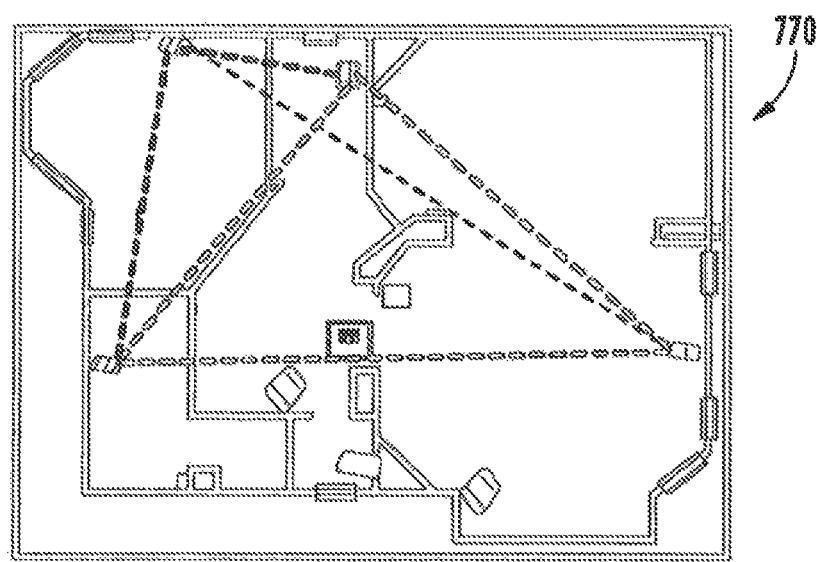
FIG. 7E illustrates a first connectivity visualization that graphically indicates a prediction of wireless system performance.
Figure 7F:
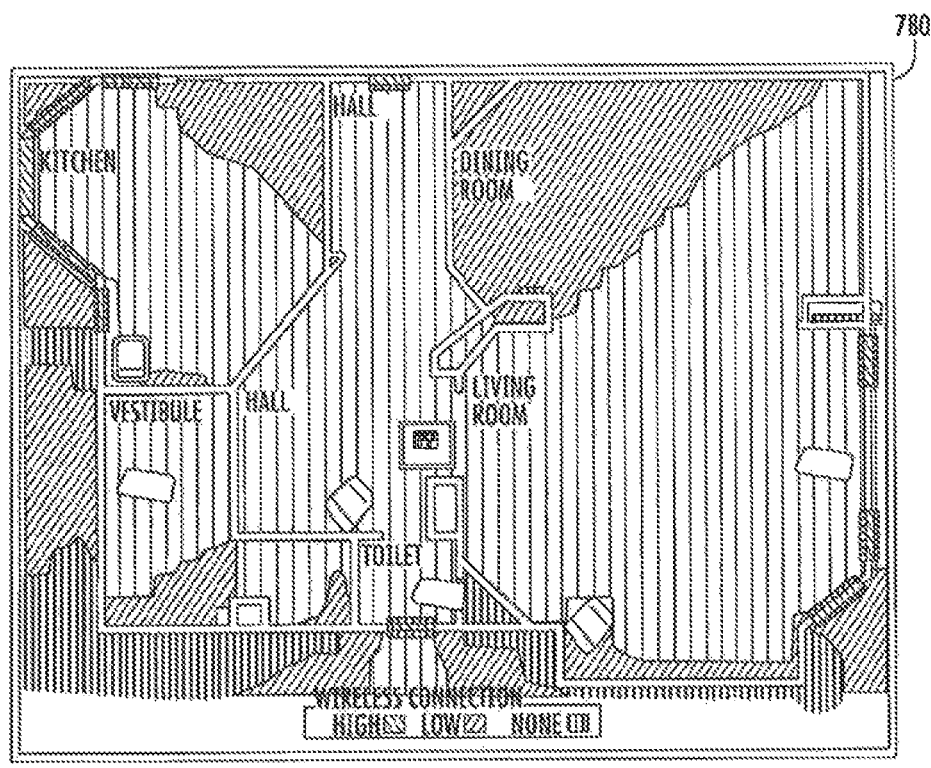
FIG. 7F illustrates a second connectivity visualization that graphically indicates RF connectivity levels at different receiver locations from an RF transmitter device that is provided at a certain position.

FIG. 7E shows a first connectivity visualization 770 that graphically indicates, e.g., using color coding, a prediction of wireless system performance. FIG. 7F shows a second connectivity visualization 780 that can be generated by the WiSPA module 722 for display via a GUI in which RF signal strength received at different locations from an RF transmitter device positioned at one or more RF transmitter device locations is graphically indicated, e.g., using color coding. A user, even without technical knowledge, can use FIGS. 7E and/or 7F to select locations for placing new receiver devices in the floor area.

Connectivity visualizations 770 and 780 include visual indications, such as hashing or color coding, for a floor plan of a building to indicate areas having good, poor, and nonexistent connection for receiving signals from a transmitter device. Additionally, wireless devices are shown with color coding to indicate a quality of connection between each wireless device and a wireless gateway in the building. In addition, links between different wireless devices are shown with color coding to indicate a quality of connection between the respective devices. For example, the indication of connectivity can include a color-coded line from the wireless transmitter device to each RF receiver of the set of RF receivers. In a further example, the indication of connectivity can include an indication of connectivity between a particular wireless transmitter device and each RF receiver of a set (e.g., all) of the RF receivers.

The color-coded line can also provide an indication of parent-child relationships among transmitters and receivers by presenting a line connecting each receiver to only the transmitter that provides the highest connectivity level. This feature can be used at commissioning time to reduce wireless interference by configuring repeaters to only re-transmit signals from the transmitters that provide highest RF connectivity level and are present in the same area.

In accordance with the above, a seamless method is provided that uses localized RF signal strength measurements obtained onsite to improve prediction performance. Calibration of building materials is expedited by leveraging geographic location information related to a building. A user can provide input specifying the material for wall segments of a given type. By designating the wall segment type, all wall segments having the designated type can be updated with the input material. A link margin recommendation can be provided for a device based on a prediction confidence level. An intuitive and non-technical visualization of connectivity quality between different wireless devices can be provided. By providing a GUI for display on a display device, peer-to-peer link quality between wireless devices can be visualized, e.g., rendered into a graphical depiction, to indicate weak links.

Figure 7G:
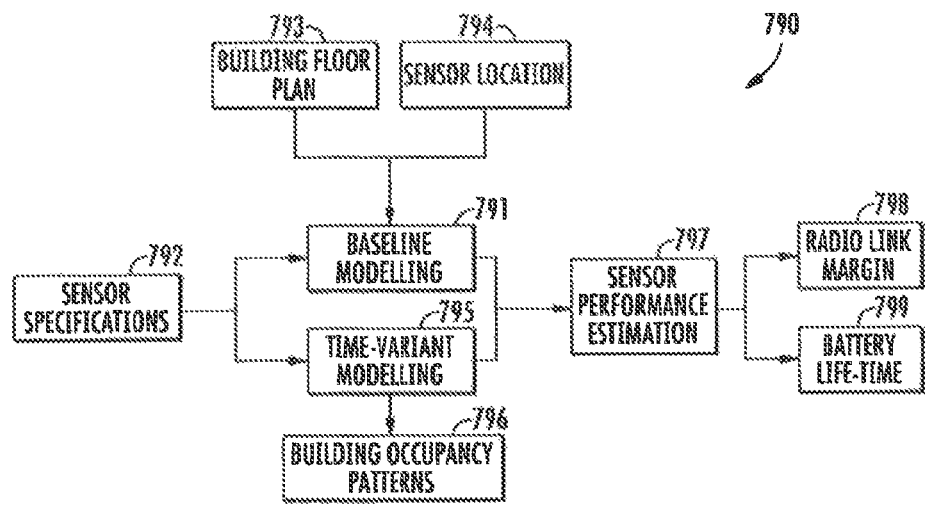
FIG. 7G illustrates a location specific device performance estimation system.

With reference to FIG. 7G, a location specific device performance estimation system 790 is illustrated that uses quasi-static modelling, time-variant modelling and device performance estimation to provide location-specific wireless device performance estimation for indoor building safety and security systems. In an embodiment, performance estimation values are used together with system and customer requirements for providing an automated climate control, safety and security building system design.

A device included in system 790 can include, motion detectors, heat detectors, smoke or carbon-monoxide detectors, image sensors, video or infra-red cameras, sound detectors, shock detectors, moisture detectors, humidity sensors, magnetic contacts, glassbreak detectors, temperature sensors, photo-detectors, key fobs, sounders, panic buttons, temperature thermostats, lighting and appliance control modules, system panels, repeaters and mobile displays.

A sensor device can include, for example, an infrared sensor, temperature sensor, visible light sensor, sound sensor, smoke or carbon-monoxide sensor, magnetic field sensor, vibrational sensor, and/or humidity sensor to sense at least one characteristic of the sensor's environment. The device also includes a transmitter, such as an RF transmitter, to transmit information, e.g., information related to the sensed characteristics. The device may also include an actuator such as a power switch, light bulb, water valve, air fan, or water sprinkler. Device performance relates to the ability of the device to transmit the information.

Quasi-static modelling module 791 (also referred to as baseline modelling module 791) models the performance of each device given a quasi-static building environment (e.g., a vacant building with zero occupancy). Quasi-static modelling module 791 performs modelling using received device radio and battery specification information 792, floor plan layout information 793 and device location information 794 that describes device locations within the building. The quasi-static modelling module 791 predicts fast RF signal fluctuation ranges due to interference between two or more versions of the same transmitted signal which arrive at a receiver device through different paths due to building geometry. These waves, called multipath waves, combine at a receiver antenna of the receiver device to give a resultant signal which can vary in amplitude and phase depending on the distribution of the intensity and relative propagation time of the waves. Even when the building is empty and the receiver device is stationary, multipath signal amplitudes and phases vary over time due to slight environmental changes in a radio channel.

Figure 7H:
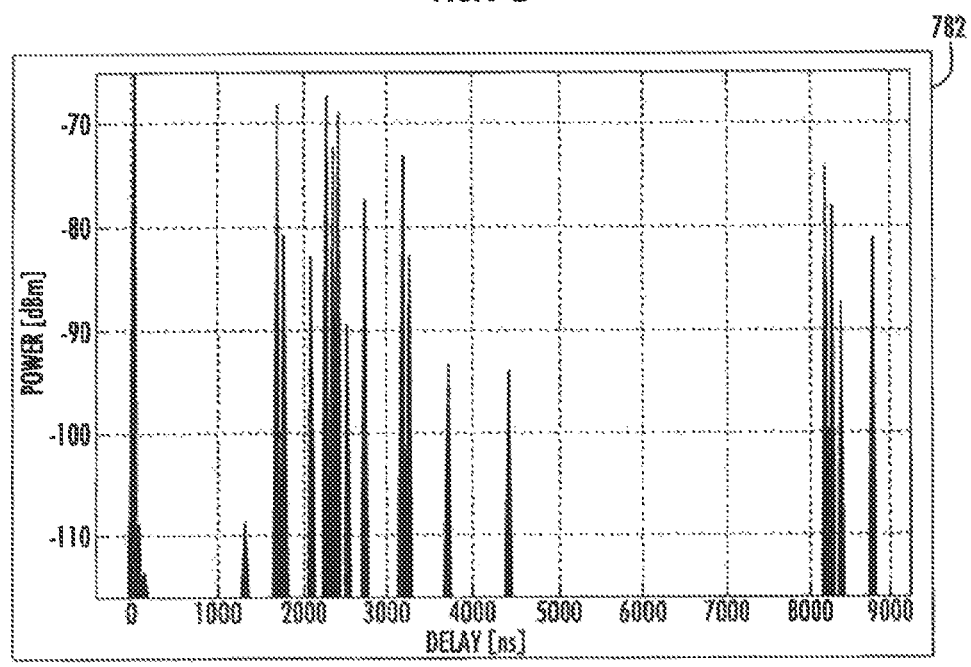
FIG. 7H illustrates an example power delay profile (PDP) of a multipath channel of a signal as a function of time delay.
Figure 71:
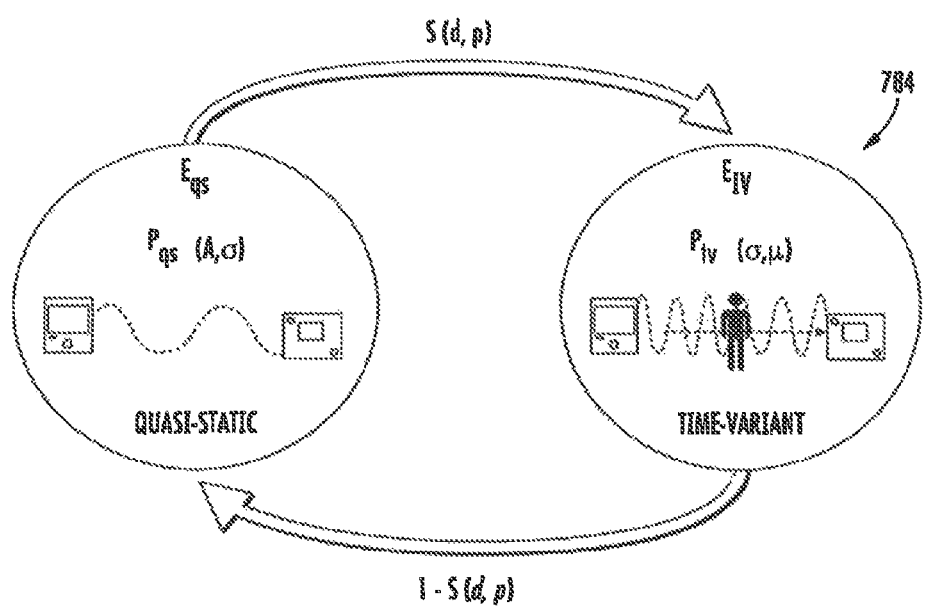
Figure 7J:
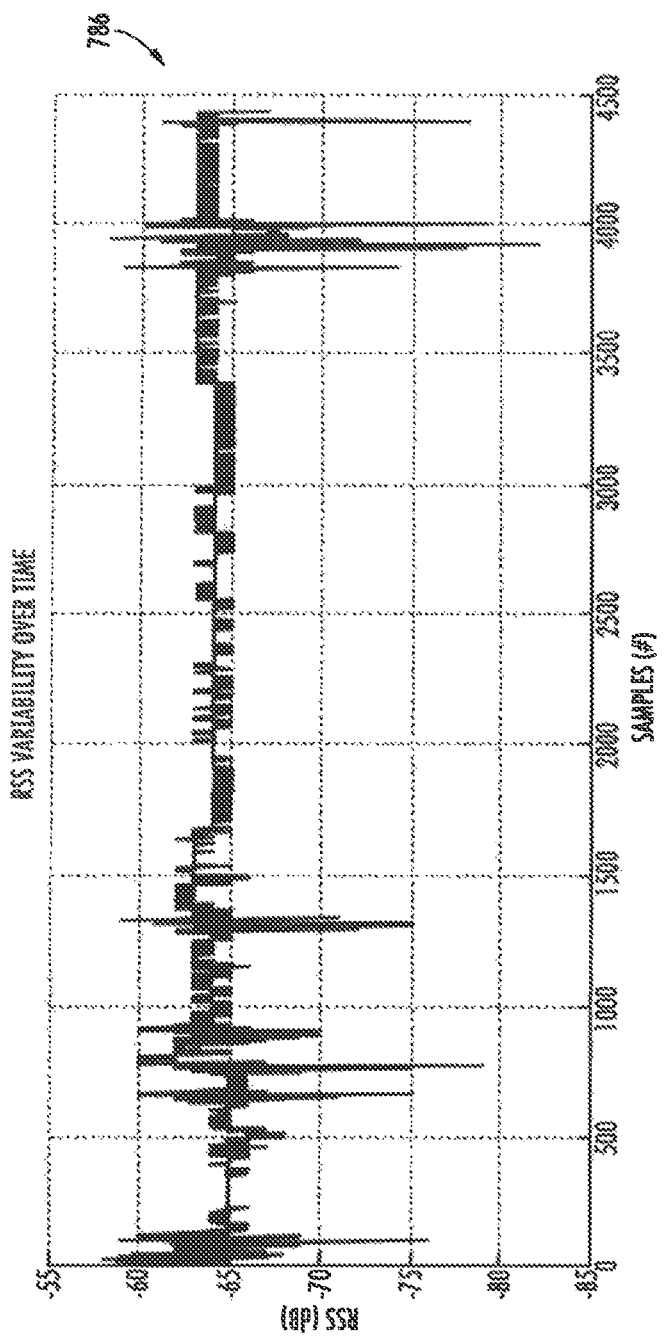
FIG. 7J illustrates large and fast RF signal fades perceived by a receiver device.

These fast fluctuations on the received signal strength that are due to multi-path signal variations can be predicted from a power delay profile (PDP) of the channel. Some well-known wave propagation models able to predict the PDP are the ray tracing and dominant path models. FIG. 7H shows an example graph 782 of a PDP, which indicates the power intensity of each signal received through a multipath channel as a function of time delay. A Ricean probability distribution can be empirically fitted from the PDP to estimate the multi-path variance in accordance with equation (17):

$$P_{qs}(A, \sigma) = \begin{cases} \dfrac{r}{\sigma}e^{-\dfrac{(r^2+A^2)}{2\sigma^2}} I_0\left(\dfrac{Ar}{\sigma^2}\right), & \text{for } (A \geq 0, r \geq 0) = 1 \\ 0, & \text{for } (r < 0) \end{cases} \quad (17)$$

wherein parameter A denotes peak amplitude of the dominant signal, parameter a denotes variance of the multipath and $I_0$ is a modified Bessel function of a first kind and zero-order.

A quasi-static battery model also predicts the power consumption of the device during periods with zero occupancy due to the periodic monitoring performed by a building system panel of an indoor building safety and security system to ensure that the system is functioning at a desired performance level. This monitoring involves functions such as continuous sensing of the environment (e.g., directed at detecting events) and periodic radio communication of supervisory alarms. Energy $E_{qs}$ consumed in the quasi-static state can be thus calculated in accordance with equation (18):

$$E_{qs} = \Sigma_{i=1}^{N} = Po_i \cdot t_i \qquad (18)$$

where $Po_i$ is power required by board component i (e.g., microcontroller, sensor or radio), and $t_i$ is an amount of time that such component is required to be functioning for monitoring purposes as per a manufacturer datasheet (e.g., supervisory alarm frequency).

A time-variant modelling module 795 models the performance of each device in a time-variant environment due to mobility of people within the building. To perform modelling, the time-variant modelling module 795 uses building occupancy pattern information 796 regarding occupancy movement pattern in the building, in addition to the device radio and battery specification information 792, the building floor plan layout information 793, and the device location information 794. In an embodiment, statistics regarding the building occupancy pattern information 796 are automatically generated from previous device deployment data in similar buildings, floor plan room tags and census data about building occupancy, and used by the time-variant modelling module 795.

The time-variant modelling module 795 predicts a range in which average signal strength fluctuations caused by the shadowing of people in the radio path occurs. The building system panel and devices (e.g., sensors, actuators) are usually placed on ceilings, walls, windows and doors where event detection is performed. From a radio propagation point of view, these locations can cause the signal between the building system panel and the devices to cross people within the building, which causes slow variations on the average signal strength.

In one embodiment, slow signal variations are obtained offline by disposing devices at typical device placements inside a building and measuring people densities during an offline operation. These measurements are then used to fit a probabilistic distribution function parameterized by people density ρ and a distance to the building system panel d. As described in Klepal et al., "Influence of people shadowing on optimal deployment of WLAN access points". Proceedings of the IEEE $60^{th}$ Vehicular Technology Conference, 1004, probabilistic distributions $P_{tv}(\sigma, \mu)$ can be used to obtain the signal shadowing caused due to people movements, in accordance with equation (19):

$$\sigma = \log_7(55\rho+1)0.5$$

$$\mu(d, \rho) = (3d\rho)^{0.7} \qquad (19)$$

The time-variant modelling module 795 can also predict power consumption of a device due to event-detection operations related to human mobility in the building. Every time a building sensor, such as a motion detector, detects a human in the environment, the building sensor performs sensing, processing and transmission of a radio packet to the panel, thus consuming additional energy compared to the quasi-static case. Sensor energy consumption in an event detection state can be computed in accordance with equation (20):

$$E_{qs} = P_d(d, \rho) \Sigma_{i=1}^{N} Po_i \cdot t_i \qquad (20)$$

where P is the probability of a sensor detecting the event when there is a people density ρ and distance d.

A device performance estimation module 797 obtains device performance information from the quasi-static modelling module 791 and the time-variant modelling module 795. A probabilistic model, such as a Markov model, is implemented by the device performance estimation module 797.

The device performance estimation system 790, in particular the quasi-static modelling module 791, the time-variant modelling module 795 and the device performance estimation module 797, can be implemented with the exemplary computing system environment 700 of FIG. 7A.

With reference to FIG. 7I, a schematic diagram 784 of a two-node Markov model is shown. The two-node Markov model can model performance of each device using state probabilities S and (1–S). For battery performance estimation, the state probability represents an amount of time people are crossing the sensing area and triggering an alarm. On the other hand, for radio performance estimation, the state probability represents an amount of time people are crossing the entire radio path. In an embodiment, state probability is computed offline using offline measurements obtained during an offline measurement operation. As disclosed in Klepal et al., "Influence of people shadowing on optimal deployment of WLAN access points", Proceedings of the IEEE $60^{th}$ Vehicular Technology Conference, 1004, which is incorporated herein by reference in its entirety, a channel switching parameter value S(d, ρ) can be calculated at each device location, based on people movements and link length, using empirical equation (21):

$$S(d, \rho) = (1-\rho)^{0.2d} \qquad (21)$$

A resulting location-specific device performance estimation γ for radio link-margin output 798 and battery life-time output 799 can be obtained as a linear combination of the static and time-variant models using the location-specific switching value in accordance with equation (22):

$$\gamma(d, \rho) = S \cdot P_{qs}(\sigma, A) + (1-S) \cdot P_{tv}(\sigma, \mu) \qquad (22)$$

In an example method in accordance with the disclosure, the WiSPA module 722 receives specification information for wireless RF devices to be positioned in the building, floor plan layout information for the building, location information on the floor plan where the a wireless RF devices are to be located, and building occupancy pattern information. The WiSPA module 722 uses the received information to provide a probabilistic model with a switching parameter. The probabilistic model includes two states, including a quasi-static state that corresponds to a vacant state of the building and a time-variant state that corresponds to an occupied state of the building. The two states are used to model the impact of people occupancy fluctuations in a building. The switching parameter is used to indicate the amount of time the probabilistic model spends in each of the two states. The WiSPA module 722 estimates the performance of the wireless RF devices using the probabilistic model.

The WiSPA 722 models a range in signal strength fluctuations associated with the wireless RF devices in the quasi-static state, and predicts signal fluctuation ranges that are attributable to interference between two or more versions of a same transmitted signal which arrive at one of the wireless RF devices via different transmission paths.

The WiSPA module 722 can predict a range in signal strength fluctuations due to shadowing of occupants in building in radio paths in the time-variant state. Signal shadowing associated with exemplary building sensor placements and building occupant densities can be obtained from an offline signal measurement operation.

In a certain embodiment, the WiSPA 722 can receive specification information for battery powered devices to be positioned in the building, floor plan layout information for the building, location information on the floor plan where the battery powered devices are to be located, and building occupancy pattern information. The WiSPA 722 can utilize the received information to provide the probabilistic model. The WiSPA 722 can estimate a remaining power level of the battery powered devices using the probabilistic model.

In embodiments, when the quasi-static state is modeled, power consumption can be attributable to periodic radio communication of supervisory alarms. Furthermore, in embodiments, when the time-variant state is modeled, power consumption can be attributable to expected building occupant mobility in accordance with the building occupancy pattern, and is further attributable to an offline power signal measurement operation that is based on exemplary building sensor placements and building occupant densities.

In certain embodiments, the WiSPA 722 can provide a GUI on the computer display indicating a visualization of a remaining power level of the battery powered devices. The visualization can include a color-coded indication in an area of the floor plan where respective battery powered devices are located. The color-code associated with an area can be indicative of a remaining power level based on an initial battery capacity of a battery of the associated battery-powered device and power consumed during operation as of an indicated time.

F. Generating Quote

After all the system components have been placed on the floor plan, including the wiring and wireless repeaters where necessary, the system 100 generates a quote that details the cost of the components, wiring, and installation labor.

II. Mounting and Wiring

Figure 1C:
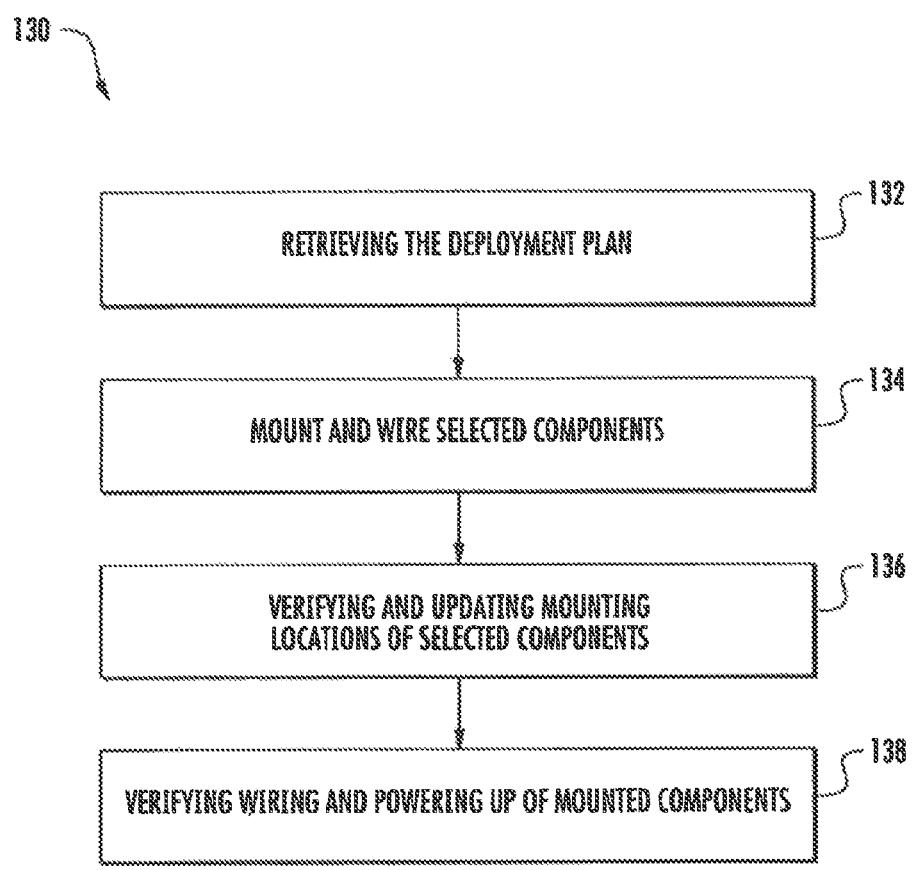
FIG. 1C is a flowchart showing the method of mounting and wiring a building using the system of FIG. 1A.

After closing the sale, the IAC tool 102 schedules the installation job for the site related to the customer account. A method 130 for completing the mounting and wiring stage is shown in FIG. 1C. When an installer arrives at the site, a mobile device used by the installer and linked to the web-hosted IAC tool 102 automatically retrieves the deployment plan for the site based on its GPS location, address or customer account details, as shown in box 132. The installer can include any third party individual with access to the IAC tool 102. As shown in box 134, the installer is able to mount and wire the building system components in accordance with the layout plan and also track the status of involved tasks.

As shown in box 136, as the installer mounts, wires, and powers up various components, the installer uses the mobile device to capture and verify the physical mounting location in the building by using a combination of in-building location system, which locates the mobile device co-ordinates within the building, and a camera of the mobile device that captures a picture of the mounted component. This allows the mobile device to tag the picture of mounted component with its location on floor plan, compare it with the planned location, and update the planned location with actual installed location, if necessary.

The installer also verifies the wiring and powering up of the component by capturing the LED activity on the mounted component via the camera, as shown in box 138. This LED activity can be automatically analyzed and verified by using simple video analytics algorithms. The installer also updates the web-hosted IAC tool 102 with the verified status of mounted and wired components.

III. Commissioning and Testing

Figure 1D:
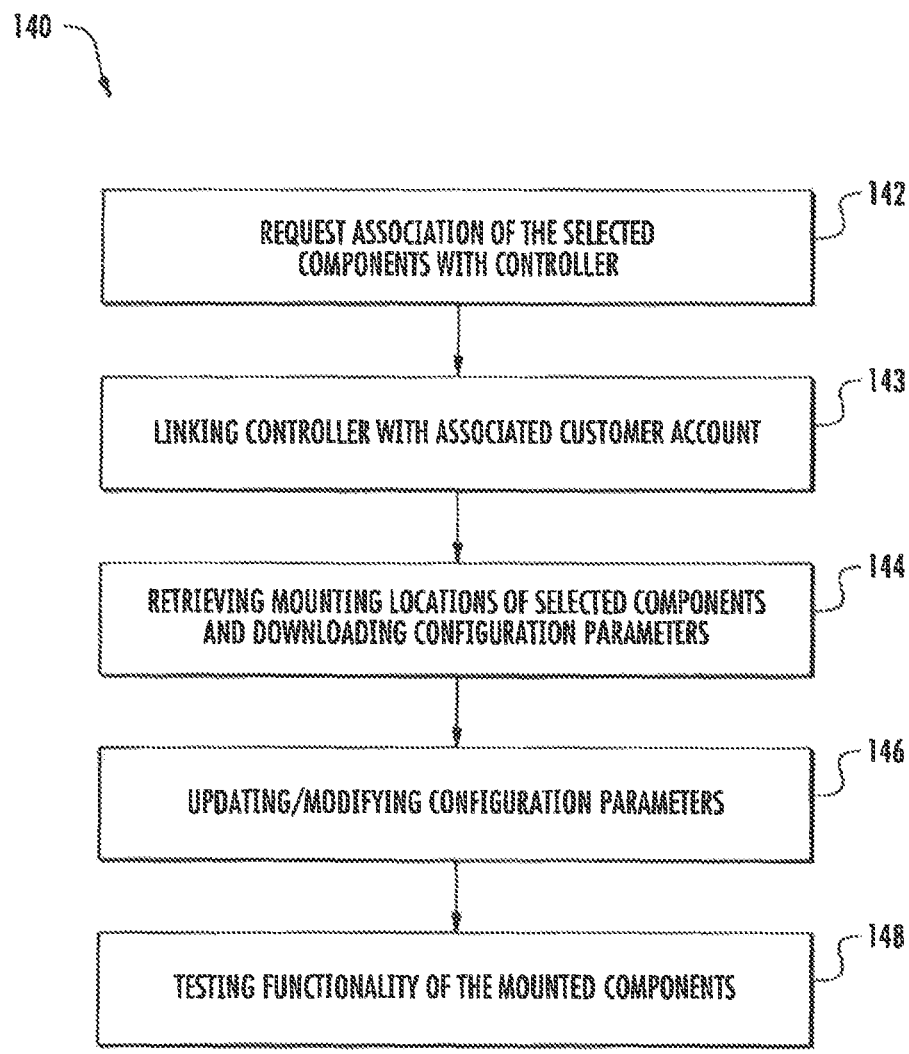
FIG. 1D is a flowchart showing the method of commissioning and testing a building using the system of FIG. 1A.

On completion of the mounting and wiring of building system components, controller(s) 114 of the building system 112 automatically searches and requests association of the selected components with the IAC tool 102 (described in further detail below). A method 1D for commissioning and testing the selected components is shown in FIG. 1D. This could be accomplished by using either a web service discovery protocol or by pre-configuring the controller 114 with the web address of the remote repository and processing engine. On receiving the association request from the controller 114, as shown in boxes 142 and 143, the IAC tool 102 links the controller to the corresponding customer account and site. Linking the controller to the corresponding customer account can be based on either a controller identifier, the site identifier received as part of the association request, the association of the controller serial number to the customer account through manual input, or through the use of a scan tool. As shown in box 144, the IAC tool 102 would then be able to download the mounting locations and associated configuration information, which was saved during the planning and quoting stage, to the controller. In an alternative embodiment, the mobile device retrieves the configuration information and controller address from the remote repository and then connects directly to the controller at the site to download the configuration from tablet to the controller. The IAC tool 102 would also allow a commissioning technician, who may be a separate individual from the installer, to use the mobile device to add, modify, and update the configuration information while commissioning the system at the site, as shown in box 146. The technician then uses the mobile device to test and verify the functioning of different components, as shown in box 148. This can be done by sending test commands and receiving test messages from the mobile device to the controller either directly or via the IAC tool 102. The mobile device also keeps track of the status of the tasks involved in the commissioning and testing stage of the process.

After the completion of the three stages of the process, controllers installed within the building system continue to stay associated with the IAC tool 102 and send periodic diagnostics information, for example quality of local communication link between components, battery status, etc, to help with the maintenance of the system. The IAC tool 102 also allows a maintenance technician to view the complete system along with the deployment layout, configuration and changes to the configuration remotely when required for troubleshooting any issues related to the system.

When performing subsequent installations on the same site, sales and installation technicians can re-use the building information by logging into the IAC tool 102 and retrieving the information related to the customer account. The IAC tool 102 allows adding new components to the existing system design, adding configuration for new components, updating configuration of existing component, if needed, and executing the remaining stages of the IAC process for the new components as described above. The IAC tool 102 also allows a sales person from one dealer or VAR organization to anonymize the building information for its clients and use it for soliciting quote from other $3^{rd}$ party organizations for the building system products not sold by its organization. Sales people from other $3^{rd}$ party organization can use a mobile device connected to the IAC tool 102 for reviewing and bidding on the requested job. The IAC tool 102 also allows searching through the building information database for buildings and/or customers with specific attributes like locality, building area, number of rooms, presence of garage or basement, and the like.

Figure 5A:
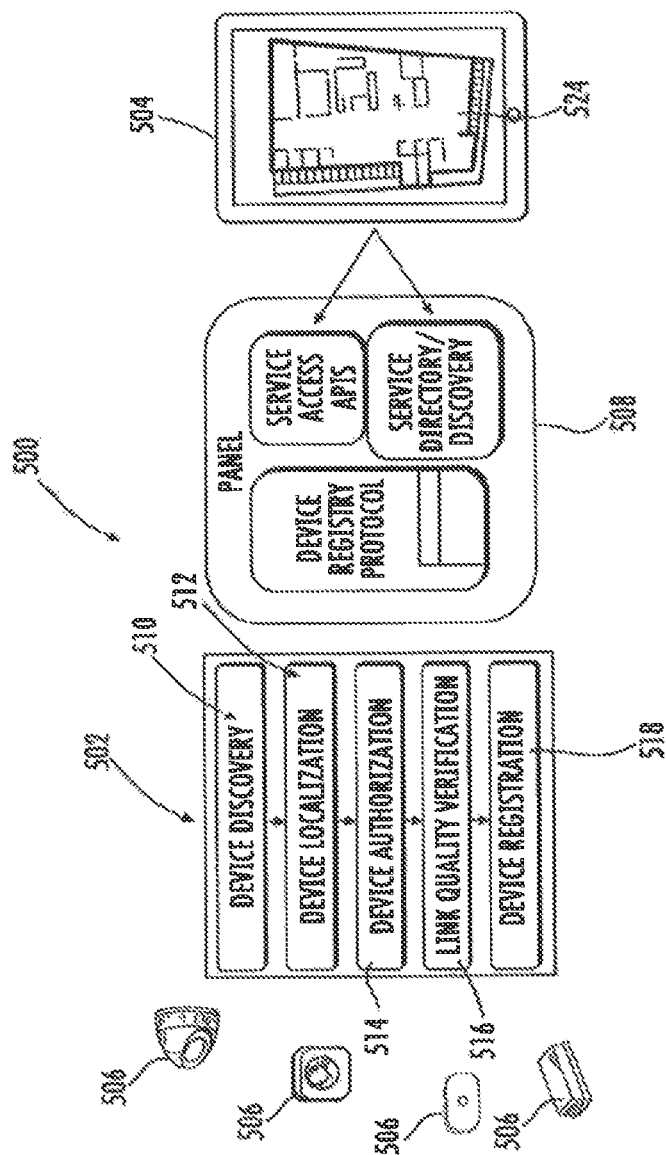
FIG. 5A is a schematic view of an exemplary embodiment of a system constructed in accordance with the present disclosure, showing an overview for device registration.

As noted above, the system 500 and method 502, shown schematically in FIG. 5A, provide tools that use a floor-plan based user interface on a mobile device 504 such as a tablet, to discover, localize, authorize, verify, and register distributed devices 506 with a system control panel 508. Exemplary devices 506 include motion sensors, cameras, locks, and the like. The tools disclosed herein can enable full flexibility in terms of the sequence in which devices 506 are installed and powered up, and the sequence in which the steps of method 502 are performed. The order of operations in method 502 as shown in FIG. 5A is only one example. Those skilled in the art will readily appreciate that any other suitable order can also be used. Wi-Fi, ZigBee, Z-Wave, or any other suitable proprietary or non-proprietary wired or wireless protocol can be used for the communication between devices 506 and panel 508, as indicated in FIG. 5A.

Method 502 includes discovering a plurality of devices 506 at central panel or server 508, as indicated by box 510. This allows the system control panel 508 to discover distributed devices 506 in the field. In scenarios where distributed devices 506 are installed and powered-up prior to the system control panel 508, the devices can broadcast a join request, which includes the unique identifier (ID) of the device and its operating profile description (such as device type, application profile type, application inputs, application outputs, allowed content types and query formats, and the like), periodically until a response is provided. Any battery-powered devices among devices 506 can conserve battery power by sleeping in between the periodic requests. The periodic request rate can be adjusted by the devices 506 depending on available battery capacity and number of registration attempts.

Figure 5B:
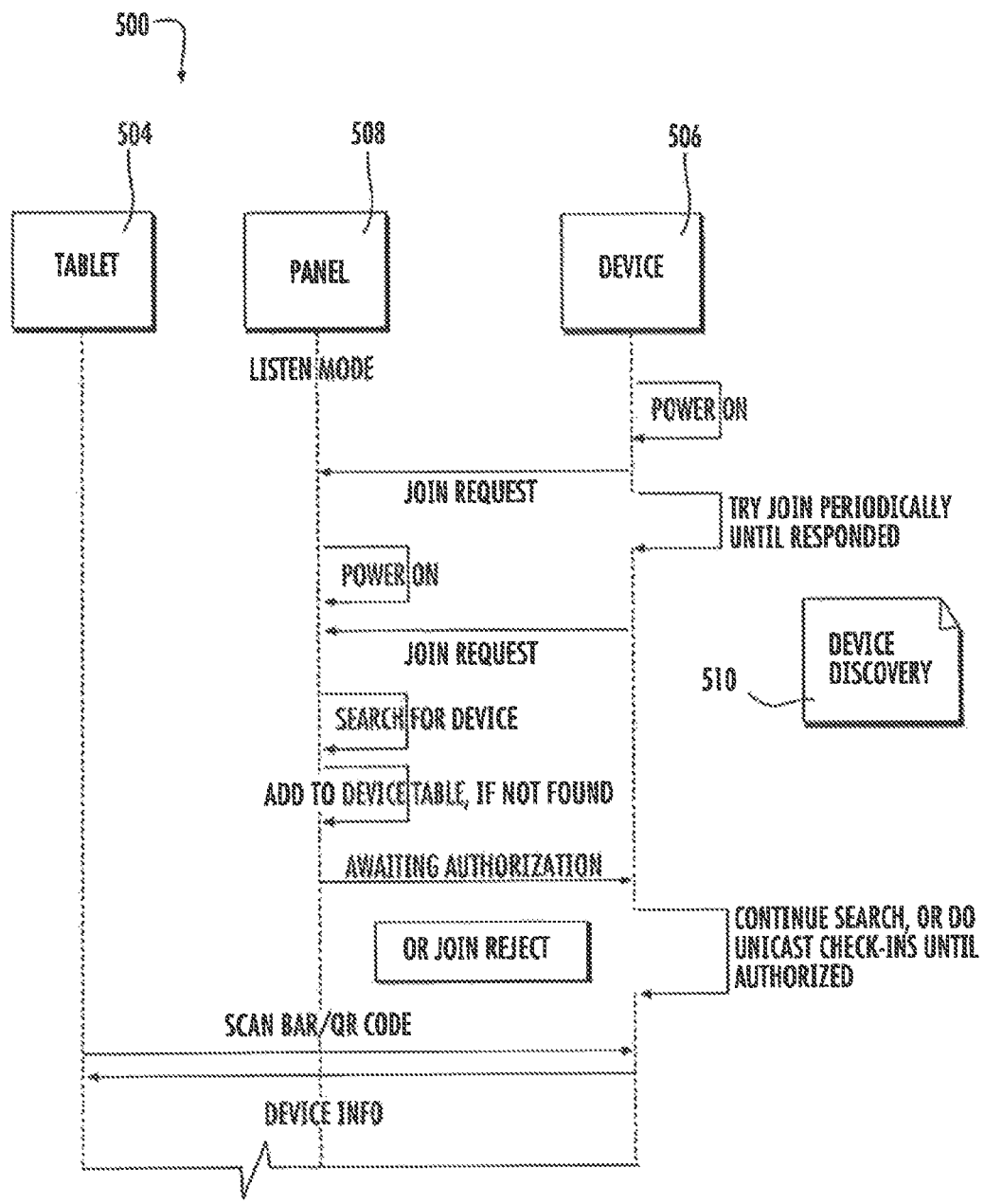
FIG. 5B is a schematic view of an exemplary device registration message exchange for the system of FIG. 5A.
Figure 5B:
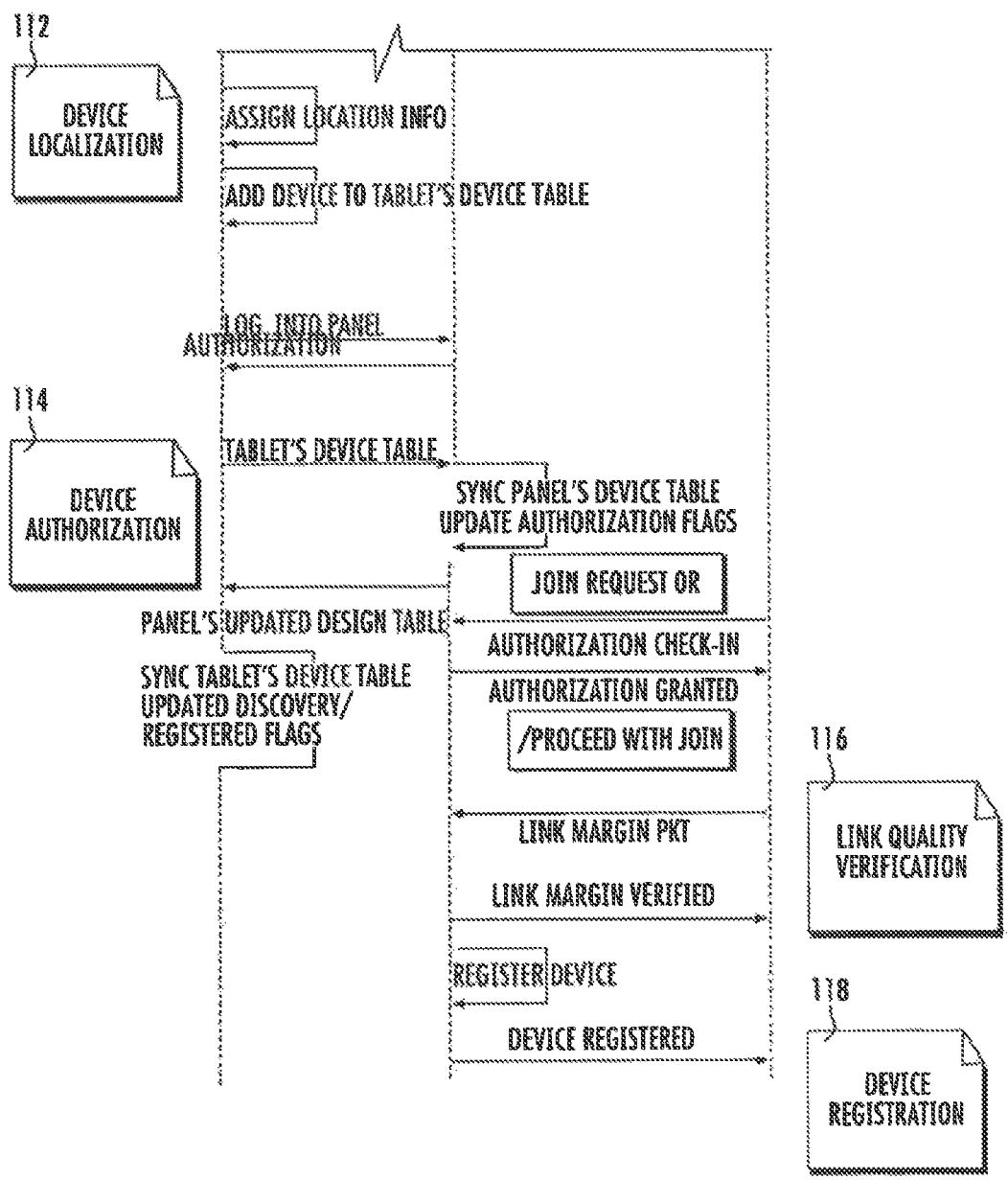
Figures 5C, 5D:
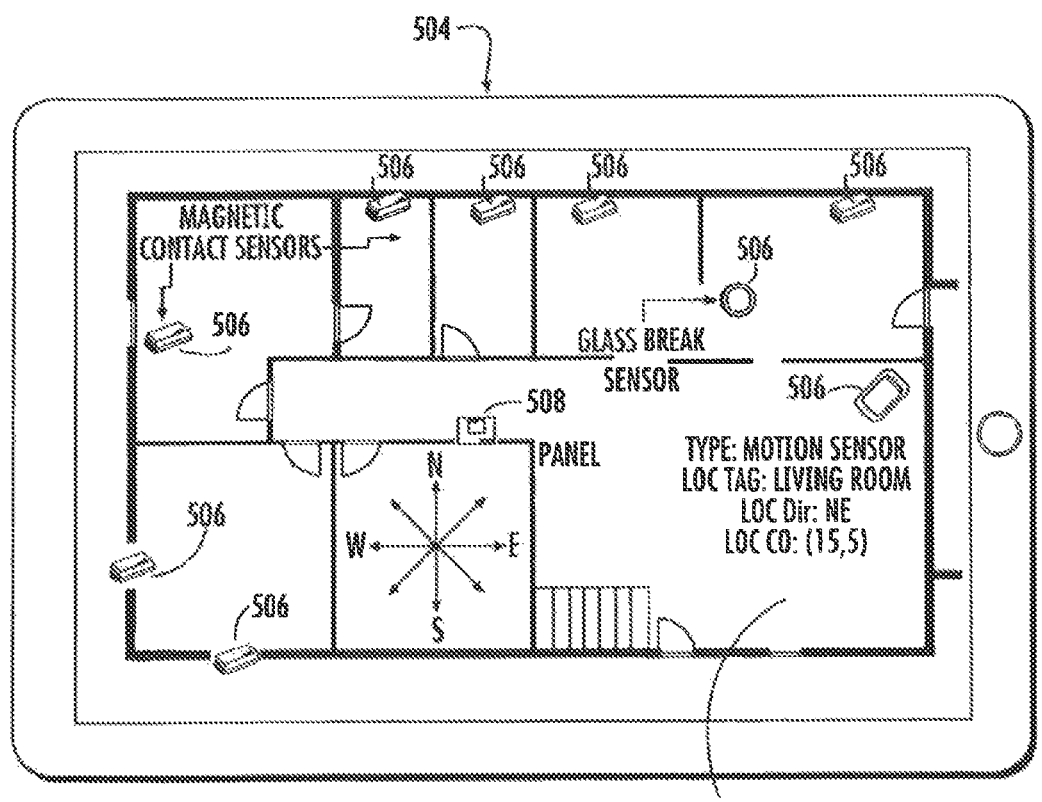
FIG. 5C is a schematic view of an exemplary device table for the system of FIG. 5A.
FIG. 5D is a view of an exemplary GUI on a mobile device for device registration in the system of FIG. 5A.

As shown in FIG. 5B, the system control panel 508 enters the listen mode immediately after it is installed and powered-up. On receiving the join request from a device 506, panel 508 searches for the device in its device table 520, an example of which is shown in FIG. 5C, to see if the authorization flag 522 for the device 506 is checked or not. If the device 506 is authorized, the panel responds to the device with a proceed with join or authorization granted message, which includes the unique identifier (ID) of the panel. If the device is not found in the device table, the panel 508 creates an entry for the device with the authorization flag cleared. If the device 506 is not authorized, the panel responds to the device with an awaiting authorization message or join reject message.

On receiving the awaiting authorization message, the device 506 can either continue to periodically broadcast the join request, to see if other panels respond, or start sending unicast check-in messages to the panel 508 while awaiting authorization. In some embodiments, the joining device 506 may not need to send a special join request. Any message (with device unique ID) received from a new device 506 for first time can be considered as a join request by the panel 508. If the device 506 is not authorized, the panel 508 simply ignores all subsequent messages from the device 506 until it gets authorized. In another embodiment, when the device 506 receives the awaiting authorization message the device 506 goes into the low power mode and awaits an external trigger (e.g. pushed button, re-powering) for re-starting the registration process.

In another aspect, method 500 can include comparing a device identifier in each join request with a device table 520 of the panel and sending proceed to join signals only to devices 506 that are marked as authorized in the device table 520. The table 520 with device identifiers can either be created by the panel 508 as it starts receiving join requests or can be pre-downloaded to the panel 508 via a mobile device 504 or server, for example. In should be noted that a proceed to join message in some instances may not be sent or may not need to be sent as some devices are unidirectional.

Method 502 also includes localizing the devices 506 as indicated by box 512. In order to localize distributed devices 506 relative to each other within a building, an application in mobile device 504 uses the building floor plan drawing for the building as the basis. The floor plan 524, shown in FIG. 5A, can be rendered to scale on a tablet touchscreen, for example. This allows determining coordinates for any given point on the floor plan 524. The floor plan 524 can be divided into distinct physical zones (such as rooms or open areas) with unique location tags for each zone (e.g., master bedroom, dining room, living room, and the like). Each of the zones can be further divided, e.g., into eight octants, which are identified by the eight directions shown in FIG. 5D. The application on mobile device 504 allows an installer to plan a system installation by adding icons for devices of different types (identified by its stock keeping unit (SKU), for example) on the floor plan 524 and then dragging and dropping the devices 506 to the locations on the floor plan 524 where they should be installed in the building. Any other suitable input technique can be used as well.

Figure 5E:
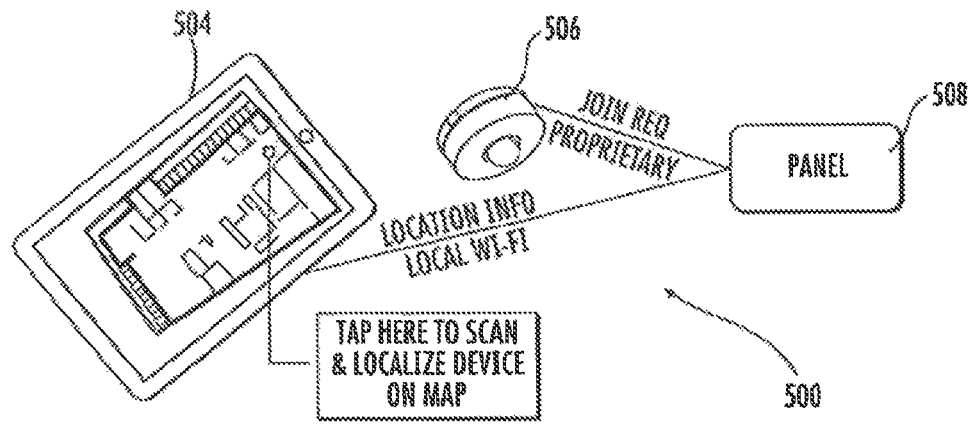
FIG. 5E is a schematic view of an exemplary method of device localization, showing the mobile device being used to localize wired distributed devices.

By way of example, an installer can walk one-by-one to the locations where devices 506 are to be installed; identify the locations on the floor plan 524 on the mobile device application; and scan the bar code, QR code, RFID, or the like, on the device 506 by tapping on to the icon of the device on the screen of mobile device 504, while pointing a camera of mobile device 504 towards the bar code, or the like, on the device 506, as shown schematically in FIG. 5E. Manual entry of the code is also contemplated. This allows the application to simultaneously learn the device identifier and localize the device 506 via a single tap on the floor plan 524. The bar code, or the like, provides the unique device identifier that is included by the device 506 in the join Request messages. Optionally, the code could also provide the encoded default encryption key (to be decoded by the mobile device application, to authenticate messages from the device 506), device type, and device specifications.

The mobile device application recognizes the location on the floor plan 524 where the installer tapped to determine the corresponding location coordinates on the floor plan 524, and also identifies the zone and octant surrounding the coordinates. The mobile device application then associates the aforementioned location info with the device identifier and the other optional device info read from the code. Device locations can be represented by the coordinates of indicated locations on the floor plan 524. The mobile device application can raise an error if the device type of the scanned code does not match with the device type of the tapped icon on the floor plan. The application also creates a unique name for the scanned device by concatenating the following information fields: <Zone Location Tag><Closest Direction><Device Type>, for e.g., Kitchen NE Motion. The application then creates an entry for the newly scanned and localized device 506 into the device table 520 stored on the mobile device 504, with relevant fields populated, as shown in FIG. 5C.

In another embodiment, the application can allow an installer to scan multiple devices 506 with QR codes, or the like, either in succession or simultaneously. The application then sorts device info in ascending or descending order of the device identifier field and automatically assigns device information to the planned device icons on the floor plan 524 in clockwise direction, for example, starting from the entry door while also matching the device type from the scanned code to the device type of the icon on the floor plan 524. This allows an installer to learn the devices off site, e.g., in a back office, prior to arriving on the site. For example, if a living room has two door/window contacts and one motion sensor, all three sensors can be scanned simultaneously by tapping on to the living room displayed on mobile device 504. The application can then start with the device icon closest to the living room entrance, e.g., a door contact sensor, and assigns it the smallest device ID with device type as a door/window contact. Then it can move in clockwise direction, for example, within the living room to find the next closest device icon, for example a motion sensor, and assigns it the smallest device ID with device type as motion sensor. The application can continue to move clockwise and assign scanned device IDs to locations on the floor plan 524 until all simultaneously scanned device IDs have been mapped. The application can display device IDs below corresponding icons to allow the installer to mount the devices correctly in the field. Optionally, the application could connect to a printer to print the assigned device names on labels that can be affixed on devices with corresponding device IDs.

An installer can start with an unplanned floor plan 524 without any device icons. Upon installing a device 506 in the field, the installer can positions the floor plan 524 appropriately and can then scan the QR code, or the like, on the device 506 by tapping at the floor plan location where the device is being installed. The application can then determines the device type (SKU) from the scanned device information and can place the corresponding device icon on the floor plan 524 at the tapped location. The application can then identify the location information as described above, create a new entry in the device table 520, and populate the relevant fields with location and device information for the scanned device 506, and can set the relevant authorization flags to yes. Site address/location can be obtained and saved from a GPS receiver in the mobile device 504, for example.

Localizing the devices 506 can include accepting input into a mobile device 504 specifying a respective location on a floor plan 524 for each of the devices 506. For example, localizing the devices 506 can include first localizing the mobile device 504 within the floor plan 524 and then localizing the devices 506 with respect to the mobile device 504, for example by processing the relative strength of their RF signals received by the mobile device 504. Localizing the devices 506 can include displaying a floor plan 524 on the mobile device 504 and simply accepting input from a user, e.g., the installer, indicating the locations of the devices 506 on the floor plan 524.

Method 502 includes authorizing the devices 506 with mobile device 504 communicating with the central panel 508 or server, as indicated in box 512 of FIGS. 5A and 5B. The devices 506 can be authorized for registration with the panel 508 via the mobile device application. As shown in FIG. 5A, the application first discovers the panel 508 and logs into the panel 508 using a secured connection. The application then sends a copy of its device table 520 to the panel 508, which then authorizes all the devices 506 for which the device ID field in the device table 520 is populated. As shown in FIG. 5B, the panel 508 also synchronizes its own local device table with the copy received from the mobile device application. Once the mobile device application is logged into the panel 508, it can immediately authorize the devices 506, e.g., one at a time as they are scanned, by sending the device ID, read from the bar/QR code, or the like, to the panel 508. It is also contemplated that a user, e.g. an installer, could authorize the devices 506 by manually accepting the discovered devices 506 via panel user interface. Once a device 506 has been authorized at the panel, the panel 508 sends the authorization granted message in response to any subsequent check-in message or join request from the authorized device 506.

Method 502 can include verifying link quality, as indicated in box 516, with each of the devices 506 before registering the devices, as indicated in box 518, with the central panel 508 by comparing signal quality between each device 506 and central panel 508 with a pre-defined threshold level. On receiving the authorization granted message from the panel 508, as shown in FIG. 5B, the device 506 can initiate the link margin verification sequence to verify that the signal quality of the messages exchanged between the device 506 and the panel 508 is above a pre-defined threshold level. The panel 508 can reject the device registration if the link quality of the device 506 is below the pre-defined level.

Method 502 also includes registering the devices 506 with the central panel 508, as indicated with box 514. Once the link quality verification is completed successfully, as shown in FIG. 5B, the panel 508 can complete the registration of the device 506 by sending the device registered message to the device 506. After this, the process for establishing keys so as to secure communications between panel 508 and devices 506 would commence.

Figure 5F:
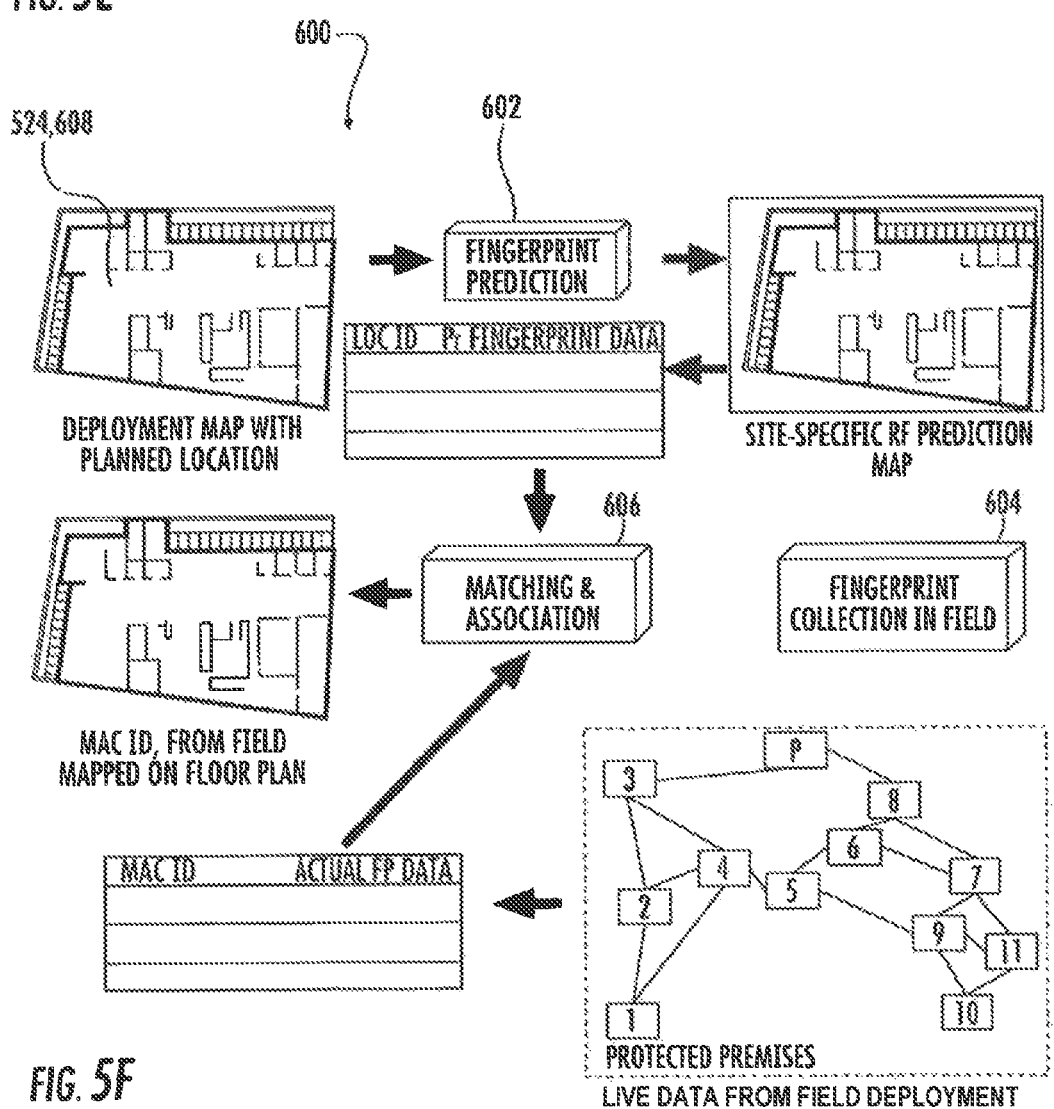
FIG. 5F is a schematic flow diagram showing an exemplary method of automatic localization of distributed devices in accordance with this disclosure.
Figure 51:
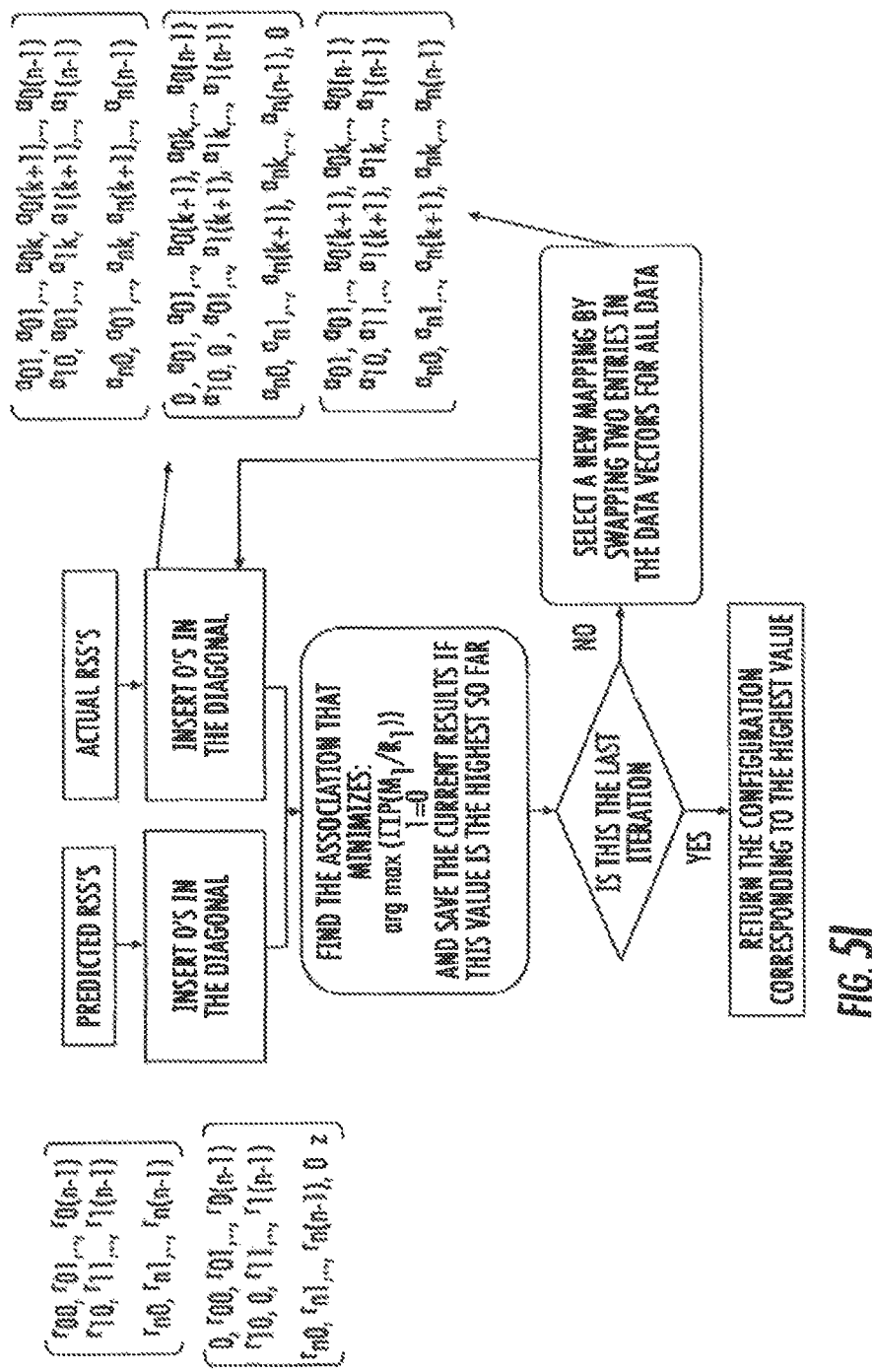

With reference now to FIG. 5F, localizing the devices 506 can be automated. A process 600 for automating the localization of devices 506 includes predicting a signal fingerprint for each device 506 based on location of each respective device 506 on a floor plan 524, as indicated by box 602. Process 600 also includes measuring a signal fingerprint for each device, as indicated by box 604, and determining the location of each device 506 in an actual building based on a comparison of the predicted signal fingerprints and measured signal fingerprints, as indicated with box 606.

This method of automatically mapping device IDs with their respective physical locations on the floor plan 524 can take place once an installer has mounted and powered up the devices 506 in the field in accordance with the planned deployment map. In what follows, a fingerprint refers to the characteristics of signals exchanged between one device 506 and the rest of the devices 506 in the system plan. For example, a fingerprint of a given device 506 can be a vector containing the received signal strength at that device from all other devices 506 at a particular time. As shown in FIG. 5F, the system 100 can perform self-localization of the devices 506 in the field by following three steps: fingerprint prediction 602, fingerprint measurement 604, and matching and association 606 of predicted fingerprints with measured fingerprints.

System 500 can use the planned device deployment map 608 shown in FIG. 5F to generate the predicted RF fingerprints in dBm for each device location as shown in table 610 of FIG. 5G, where the fingerprint for each device listed in the left hand column is represented by the RF signal strength value in the dBm in the respective row, wherein the minimum signal strength value is −100 dBm and the maximum value is no greater than 0 dBm. The fingerprint prediction module can employ a site-specific RF propagation model, such as ray tracing, to predict the RF received signal strength at a given device 506 location, e.g., LOC1, LOC2, and so on, from all other devices 506 deployed at different locations depicted in the deployment map 608. For example, The row labeled "LOC0" in FIG. 5G shows the predicted RF received signal strength seen by a device 506 location LOC0 from all other devices 506 on the deployment map 508, i.e. at LOC1 through LOC8. The site-specific RF model uses the floor plan 524, building material info, device RF output power and antenna patterns to generate high fidelity estimates for predicted fingerprints. In embodiments, fingerprints collected with a mobile device 504 during system planning are employed to calibrate the site-specific RF propagation model that predicts fingerprints at the planned device locations.

Once the installer has mounted and turned on the devices 506 at their respective locations in the field, the devices 506 can start exchanging RF packets with each other. This allows the devices 506 to measure the received signal strength of packets from all the neighboring devices 506 and create the measured RF fingerprint for its locations. For example, row 1 in FIG. 5H shows the signal strength measured by device $Dev_0$ from all other devices 506 in the field. The devices 506 can periodically update and report their measured fingerprint to the gateway (or panel 508), which collects these measured fingerprint data and stores them in a table 612, as shown in FIG. 5H, wherein the minimum signal strength value is −100 dBm and the maximum value is no greater than 0 dBm. If the system 100 includes battery powered devices, they can save battery power by measuring the received signal strength from the reference packets used for clock synchronization (i.e. as beacons) and entering into a sleep power state during the rest of the time.

Once the measured fingerprint table 612 has been created at the gateway or panel 508, the matching and association module computes the one-to-one association between the devices 506 and the locations on the planning map (e.g., LOC1, LOC2, etc.). This can be accomplished by having the matching and association module maximize the global similarity between the predicted fingerprints, as shown in FIG. 5G, and the measured ones shown in FIG. 5H. In embodiments, a cost matrix is generated which records the similarity of each predicted fingerprint with all the measured ones (or vice-versa). The columns of the matrix are the device IDs $Dev_0$ to $Dev_n$, the rows are the locations (LOC0, LOC1, LOC2, etc.) and each entry in the matrix is the similarity between the predicted fingerprint related to location of the relative row and the fingerprint of the device relative to the column. In one embodiment, this similarity is expressed as the Euclidian distance between the two received signal strength vectors relative to the predicted and measured fingerprints. The global association (one-to-one association between the devices and planned locations) can be measured using any existing association method, such as the iterative operation shown in FIG. 5I. In embodiments, dynamic programming (DP) is used to find the global association using the Hungarian Algorithm. Iteration over all possible order of the devices in the cost matrix is required. At each step of the iterative process depicted in FIG. 5I, an order of the access points is chosen and their relative values from the matrix in FIG. 5H are copied to the predicted (hollow) matrix (the matrix on the left in FIG. 5I). The values of the measured (hollow) matrix (the bottom matrix on the right in FIG. 5I) are copied only once at the beginning of the this process. A Programming algorithm is employed to select the total cost of the best association, e.g., in a table 614 as shown in FIG. 5J. The configuration (order in table 614) of the devices 506 and the association corresponding to the lowest cost from all iterations can be selected as the global association. FIG. 6 shows an example of the measured and predicted signal table, taken from a real deployment, and the distance matrix after single iteration.

If two locations or two devices 506 have similar fingerprints, the matching and association process 606 may fail to return the optimal association. This ambiguity can be mitigated or prevented by analyzing the predicted fingerprints at the time of planning (before deployment). This can be done by computing a cross-similarity matrix (similar to the cost matrix used for association, but with columns and rows both corresponding to the predicted fingerprints). The ambiguity is detected if at least two entries in any column/row are similar (ambiguous) and cannot be resolved by global assignment. For example, the placement on the map 608 can be re-arranged, either manually or automatically, in order to make the fingerprints more discriminative. In another technique, one of the devices 506 causing the ambiguity (in case there are two devices with similar fingerprints) can be ignored in a first association phase and added later, when the remaining nodes are associated. This process can be generalized to any number of nodes causing the ambiguity.

Once the locations for the devices 506 in the field have been identified, the information can be used for the ensuring that all the planned devices have been mounted in the field. The matching and associate scheme also allows for detecting if any of the devices have been wrongly swapped during the mounting. This can be done by reporting the device type info along with the measured RF fingerprint data. The planned deployment map can already capture the device type for each planned device. If the measured fingerprint data reported from a device of type A matches with the predicted fingerprint data at location LOC1 where device type B was planned, this indicates that the device has been mounted at the wrong location.

The location information can also be used for authenticating the devices 506 requesting to join the network. The measured fingerprint reported by a device can also be used to grant or deny its request for joining the network. If the measured fingerprint reported by the device does not match with any of the predicted fingerprints, it indicates the device may be either a rogue or from a neighboring deployment and does not belong to the network.

The location information can be used in configuring the devices remotely. Once the location for a device is established, the configuration for the device, which can be highly dependent on the location and device type, can be communicated to the device from system software remotely via the gateway.

Another use of the location information is localizing non-wireless devices 506. If the building system deployed also consists of wired devices 506 in addition to or in lieu of wireless devices 506, the self-localization method described above can be adapted to include a mobile device 504 such as a handheld wireless device like a smartphone or tablet that exchanges messages with other wireless localizing devices mounted temporarily in the building to facilitate localization. The installer can scan the device 506, e.g., from a label on the device 506, after mounting and powering it up in the field. The mobile device 504 can then exchange packets with the temporary localizing wireless devices mounted in the building to measure the RF fingerprint at the mounting location and append it to the ID scanned from the device, which serves as the MAC ID for that device. This allows the system to automatically map the scanned the mounted device to its location on the floor plan instead of an installer doing it manually.

The location information can also be used in identifying malfunctioning devices and misconfigurations. If the building system 100 reports a failure that links to a particular device ID after commissioning, the location information allows the facility manager to identify the location of such device 506 within the building floor plan 524.

Another use for device localization information is enhancing decision support systems. A geographic information system can be created once device identifiers are associated with their physical locations. This system may be used to design decision support systems, e.g., through big data analytics.

Yet another use for the location information is more intuitive alarm and event reporting than in traditional systems. The mapping of device identifiers to physical locations may be used to display device data such as alarms on a floor plan based graphical user interface, e.g., floor plan 524 on mobile device 504. This type of GUI can be much more intuitive and interactive than text-based reporting traditionally facilitating the system operator job.

The systems and methods for registering distributed devices described herein offer the following potential benefits over traditional systems: complete flexibility in terms of the sequence in which the devices are installed and powered up in the field, flexibility in terms of the sequence in which device discovery, device localization, and device authorization are performed, one-touch authorization and localization of devices, eliminating the need to run back and forth between the panel and the devices during the registration, simultaneous authorization of devices to facilitate device authorization and localization in back offices, no registration for devices with poor link quality ensures reduced call backs from the field for installers, and reduced time and error in device learning process.

A marked difference between the systems and methods of device localization described herein versus traditional systems is not relying solely on measured received signal strength for directly computing devices locations (i.e. through triangulation techniques). It instead employs a site-specific RF model to generate predicted RF fingerprints which are matched with the measured RF fingerprints by using a robust n-to-n matching and associating scheme for determining the location of devices within a building. This reduces localization inaccuracies of existing received signal strength techniques as the problem is formulated as an association problem rather than a pure localization problem.

The systems and methods for localization described herein provide the following potential benefits over traditional systems: automatically mapping the wireless devices installed in a building to their physical locations on the building floor plan thereby saving time and eliminating errors, supporting auto-localization of non-wireless devices (wired or otherwise) via use of a handheld wireless device and temporary localization nodes, providing flexibility in terms of how and when the system is installed and configured (e.g., an installer can mount, wire and power-up the devices and leave, or a commissioning technician can commission the devices remotely at a later point in time), ensuring that the devices are installed and mounted as planned, ensuring that only valid devices join the network.

With certain illustrated embodiments described above, it is to be appreciated that various non-limiting embodiments described herein may be used separately, combined or selectively combined for specific applications. Further, some of the various features of the above non-limiting embodiments may be used without the corresponding use of other described features. The foregoing description should therefore be considered as merely illustrative of the principles, teachings and exemplary embodiments of this invention, and not in limitation thereof.

It is to be understood that the above-described arrangements are only illustrative of the application of the principles of the illustrated embodiments. Numerous modifications and alternative arrangements may be devised by those skilled in the art without departing from the scope of the illustrated embodiments, and the appended claims are intended to cover such modifications and arrangements.

What is claimed is:

1. A method for planning a building system, comprising:
   incorporating user requirements into a floor plan accessed through a mobile device;
   generating an installation map of locations for components corresponding to the user requirements; and
   displaying on the mobile device placement of the components on the floor plan based on specifications of the components and the user requirements,
   wherein the user requirements include specifications of types of the components available, system partitioning, system functionality, compliance with building standards and regulations, communication parameters, coverage parameters, detection performance, accuracy, battery life, cost, and false alarm probability of the components or the system as a whole.

2. The method of claim 1, wherein displaying includes showing an indication of the expected security performance for the given device placement of the components on the floor plan.

3. The method of claim 2, wherein expected security performance is displayed in terms of coverage provided by the components.

4. The method of claim 2, wherein expected security performance is displayed in terms of probability of detection of a hazardous event provided by the components.

5. The method of claim 2, wherein expected security performance is displayed in terms of number of selected devices placed on the floor plan relative to a maximum number of locations requested to be secured.

6. The method of claim 1, wherein displaying includes showing an indication of expected system performance for a given placement of the components on the floor plan.

7. The method of claim 1, wherein the types and specifications of the components available are downloaded from a remote server database.

8. The method of claim 1, wherein the user requirements include constraints on the placement of the components.

9. The method of claim 1, wherein the components are selected from the group consisting of infrared sensors, motion sensors, contact sensors, glass break sensors and video cameras, shock sensors, panels, and safety sensors.

10. The method of claim 1, wherein generating the installation map includes auto placing the components based on a dynamic threat model for a hazardous event, and the dynamic threat model includes a statistical probability distribution of the hazardous event moving throughout the floor plan.

11. The method of claim 1, wherein generating the installation map includes auto placing the components based on a dynamic threat model for a hazardous event, and the dynamic threat model includes a relative threat level designated by the user for each room of the floor plan.

12. The method of claim 1, wherein generating the installation map includes auto placing the components based on a dynamic threat model for a hazardous event, and the dynamic threat model includes relative threat level designated by the user for each entrance and exit of the floor plan.

13. The method of claim 1, wherein generating the installation map includes auto placing the components based on a dynamic threat model for a hazardous event wherein generating the installation map comprises:

repeatedly placing different combinations of the components throughout the floor plan;
evaluating performance for each combination using the dynamic threat model and component characteristics; and
identifying the best combination of the components based on system cost and performance for a given dynamic threat model.

14. The method of claim 1, wherein generating further comprises:
placing at least one of the components in a room of the floor plan;
evaluating performance achieved based on parameters of the room and component characteristics; and
repeating the steps of placing and evaluation until optimal placement for each room is achieved.

15. The method of claim 1, wherein generating the installation map includes placing the components based on connectivity between rooms.

16. The method of claim 1, wherein generating the installation map includes placing the components based on value of contents within a room of the floor plan as designated by the user.

17. The method of claim 1, wherein generating the installation map includes auto placing the components based on a wireless connectivity model.

18. The method of claim 17, wherein the wireless connectivity model includes a statistical probability distribution of data correctly received at each component location in the floor plan.

19. The method of claim 1, wherein generating the installation map further comprises manually placing at least one of the components within the installation map using the mobile device.

20. The method of claim 19, wherein manually placing includes allowing the user to select the components from a predefined list and indicate a desired location.

21. The method of claim 20, wherein the indicated desired location is selected from a set of valid mounting locations and orientations identified based on component characteristics and floor plan characteristics.

22. The method of claim 21, wherein valid mounting locations are displayed as a visual aid for manual placement of the selected components based on characteristics of the selected components and the floor plan.

23. The method of claim 1, further comprising displaying coverage area of each of the components based on the placement, orientation and tilt of the component.

24. The method of claim 1, wherein at least one of the components is a glass break sensor wherein optimal placement is based on glass size of a window, glass break sensor specification and a room layout.

25. The method of claim 1, wherein at least one of the components is a motion sensor wherein optimal placement is based on direction of target movement relative to the motion sensor's location, field of view, motion sensor specification and room layout.

26. The method of claim 1, wherein at least one of the components is a motion sensor wherein optimal placement is based on size of motion sensor coverage region and room size.

27. The method of claim 1, wherein at least one of the components is a motion sensor wherein optimal placement avoids overlap of coverage region with components monitoring doors and windows of a room.

28. The method of claim 1, wherein optimal placement is based on correlating type of sensor with type of room.

29. The method of claim 1, wherein optimal placement is based on correlating type of sensor and type of room feature being monitored.

30. The method of claim 1, wherein at least one of the components is a motion sensor placed in a room with two or more perimeter windows, rooms with maximum number of interior doors or rooms with more than a certain number of interior doors and no perimeters doors or windows.

31. A method for planning a building system, comprising:
incorporating user requirements into a floor plan accessed through a mobile device;
generating an installation map of locations for components corresponding to the user requirements; and
displaying on the mobile device placement of the components on the floor plan based on specifications of the components and the user requirements,
wherein generating the installation map includes auto placing the components based on a dynamic threat model for a hazardous event, and the dynamic threat model includes a relative threat level designated by the processing of interior building images for each room of the floor plan.

32. A method for planning a building system, comprising:
incorporating user requirements into a floor plan accessed through a mobile device;
generating an installation map of locations for components corresponding to the user requirements; and
displaying on the mobile device placement of the components on the floor plan based on specifications of the components and the user requirements,
wherein generating the installation map includes auto placing the components based on a dynamic threat model for a hazardous event, and
wherein relative threat levels are estimated using historical data of robberies for a geographic site and aerial or exterior building images of an entrance and exit of a building of the building system.

33. A device for planning a security system of a building, comprising:
an interactive user interface device to specify building information and user requirements having a visual display; and
a processor operatively connected to the user interface device, the processor having a memory, wherein the memory includes instructions recorded thereon that, when executed by the processor, cause the processor to:
generate an installation map of locations for components corresponding to the user requirements; and
display on the visual display placement of the components on the floor plan based on specifications of the components and the user requirements,
wherein the user requirements include specifications of types of the components available, system partitioning, system functionality, compliance with building standards and regulations, communication parameters, coverage parameters, detection performance, accuracy, battery life, cost, and false alarm probability of the components or the system as a whole.

34. A device for planning a security system of a building, comprising:
an interactive user interface device to specify building information and user requirements having a visual display; and
a processor operatively connected to the user interface device, the processor having a memory, wherein the memory includes instructions recorded thereon that, when executed by the processor, cause the processor to:

generate an installation map of locations for components corresponding to the user requirements; and display on the visual display placement of the components on the floor plan based on specifications of the components and the user requirements, wherein generating the installation map includes auto placing the components based on a dynamic threat model for a hazardous event, and the dynamic threat model includes a relative threat level designated by the processing of interior building images for each room of the floor plan.

35. A device for planning a security system of a building, comprising:

an interactive user interface device to specify building information and user requirements having a visual display; and a processor operatively connected to the user interface device, the processor having a memory, wherein the memory includes instructions recorded thereon that, when executed by the processor, cause the processor to:

generate an installation map of locations for components corresponding to the user requirements; and display on the visual display placement of the components on the floor plan based on specifications of the components and the user requirements, wherein generating the installation map includes auto placing the components based on a dynamic threat model for a hazardous event, and wherein relative threat levels are estimated using historical data of robberies for a geographic site and aerial or exterior building images of an entrance and exit of a building of the building system.

* * * * *